United States Patent
Hong

(10) Patent No.: US 12,279,365 B2
(45) Date of Patent: Apr. 15, 2025

(54) PRINTED CIRCUIT BOARD FOR TRANSMITTING SIGNAL IN HIGH-FREQUENCY BAND AND ELECTRONIC DEVICE COMPRISING SAME

(71) Applicant: SAMSUNG ELECTRONICS CO., LTD., Suwon-si (KR)

(72) Inventor: Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 259 days.

(21) Appl. No.: 17/957,870

(22) Filed: Sep. 30, 2022

(65) Prior Publication Data

US 2023/0035645 A1 Feb. 2, 2023

Related U.S. Application Data

(63) Continuation of application No. PCT/KR2021/003232, filed on Mar. 16, 2021.

(30) Foreign Application Priority Data

Mar. 31, 2020 (KR) .................. 10-2020-0039028
Feb. 25, 2021 (KR) .................. 10-2021-0025898

(51) Int. Cl.
H05K 1/02 (2006.01)

(52) U.S. Cl.
CPC ......... *H05K 1/0243* (2013.01); *H05K 1/0298* (2013.01); *H05K 2201/09409* (2013.01);
(Continued)

(58) Field of Classification Search
CPC ........ H05K 1/02; H05K 1/025; H05K 1/0215; H05K 1/0216; H05K 1/0219;
(Continued)

(56) References Cited

U.S. PATENT DOCUMENTS

| 5,003,273 A | 3/1991 | Oppenberg |
| 8,004,798 B1 * | 8/2011 | Dunn .................. G11B 5/4833 360/245.9 |

(Continued)

FOREIGN PATENT DOCUMENTS

| CN | 206441554 U | 8/2017 |
| JP | 2008-193000 A | 8/2008 |

(Continued)

OTHER PUBLICATIONS

International Search Report dated Jun. 21, 2021 issued by the International Searching Authority in counterpart International Application No. PCT/KR2021/003232 (PCT/ISA/210).

(Continued)

*Primary Examiner* — Xiaoliang Chen

(74) *Attorney, Agent, or Firm* — Sughrue Mion, PLLC

(57) ABSTRACT

A flexible circuit board for transmitting a signal in a frequency band includes an intermediate region in which a signal line is disposed as a transmission line for transmitting the signal in the frequency band, and a pad region extending from the intermediate region and disposed at one end or both ends of the flexible circuit board, a pad electrically connected to the signal line and formed to face a first direction of the flexible circuit board, and a ground pattern overlapping at least a portion of the pad and formed to face a second direction of the flexible circuit board and disposed in the pad region where the second direction is opposite to the first direction.

20 Claims, 28 Drawing Sheets

(52) U.S. Cl.
CPC .............. *H05K 2201/09445* (2013.01); *H05K 2201/10098* (2013.01)

(58) Field of Classification Search
CPC .. H05K 1/0224; H05K 1/0243; H05K 1/0253; H05K 1/0259; H05K 1/0274; H05K 1/0298; H05K 1/111; H05K 1/112; H05K 1/117; H05K 1/118; H05K 1/147; H05K 1/189; H05K 3/361; H05K 2201/09181; H05K 2201/09372; H05K 2201/09381; H05K 2201/09409; H05K 2201/09445; H05K 2201/09618; H05K 2201/09681; H05K 2201/09727; H05K 2201/10098; H05K 2201/10128
USPC ..... 174/260, 254; 361/91.1, 748; 360/234.5, 360/245.8, 245.9, 264.2, 266.3; 385/88; 324/76.19; 333/4
See application file for complete search history.

(56) References Cited

U.S. PATENT DOCUMENTS

| | | | |
|---|---|---|---|
| 9,166,550 B2 | 10/2015 | Devnani et al. | |
| 9,583,812 B2 | 2/2017 | Gao | |
| 10,231,327 B1* | 3/2019 | Murakami | H05K 1/0219 |
| 2008/0048639 A1* | 2/2008 | Sutono | G01R 1/06772 |
| | | | 324/76.19 |
| 2008/0048796 A1* | 2/2008 | Shaul | H01P 3/003 |
| | | | 333/4 |
| 2008/0315977 A1 | 12/2008 | Green et al. | |
| 2009/0008131 A1* | 1/2009 | Shibata | H05K 1/0219 |
| | | | 174/254 |
| 2010/0215324 A1* | 8/2010 | Ban | G02B 6/4281 |
| | | | 385/88 |
| 2011/0294340 A1* | 12/2011 | Kojima | H01R 12/598 |
| | | | 439/497 |
| 2012/0045930 A1* | 2/2012 | Ueda | H01R 12/79 |
| | | | 439/497 |
| 2016/0088724 A1 | 3/2016 | Chuo et al. | |
| 2016/0143159 A1* | 5/2016 | Park | H05K 1/025 |
| | | | 174/254 |
| 2017/0139160 A1* | 5/2017 | Noguchi | G02B 6/4279 |
| 2017/0278469 A1* | 9/2017 | Iwami | G09G 3/3611 |
| 2019/0269009 A1 | 8/2019 | Park et al. | |
| 2020/0196452 A1* | 6/2020 | Lee | G06F 3/0412 |
| 2021/0274645 A1 | 9/2021 | Hong et al. | |

FOREIGN PATENT DOCUMENTS

| | | |
|---|---|---|
| JP | 2015-103833 A | 6/2015 |
| KR | 10-0516388 B1 | 1/2006 |
| KR | 10-2019-0101826 A | 9/2019 |
| KR | 10-2020-0005950 A | 1/2020 |

OTHER PUBLICATIONS

International Written Opinion dated Jun. 21, 2021 issued by the International Searching Authority in counterpart International Application No. PCT/KR2021/003232 (PCT/ISA/237).

* cited by examiner

PRINTED CIRCUIT BOARD FOR TRANSMITTING SIGNAL IN HIGH-FREQUENCY BAND AND ELECTRONIC DEVICE COMPRISING SAME

CROSS-REFERENCE TO RELATED APPLICATION(S)

This application is a bypass continuation of International Application No. PCT/KR2021/003232, filed on Mar. 16, 2021, which is based on and claims priority to Korean Patent Application No. 10-2020-0039028 filed on Mar. 31, 2020, in the Korean Intellectual Property Office, and Korean Patent Application No. 10-2021-0025898 filed on Feb. 25, 2021, in the Korean Intellectual Property Office, the disclosures of which are incorporated by reference herein in their entireties.

BACKGROUND

1. Field

Various embodiments of the disclosure relate to a printed circuit board for transmitting a signal in a high-frequency band and an electronic device including the same.

2. Description of the Related Art

Efforts are being made to develop a 5G communication system or a pre-5G communication system to meet the increasing demand for wireless data traffic after the commercialization of a 4G communication system.

In order to achieve a high data transmission rate, the 5G communication system may be implemented using various frequency bands. For example, a low band of 600-800 MHz, a mid-band of 2.5-4.9 GHz, or an ultra-high frequency band of 24 GHz or higher may be used.

An electronic device implementing a 5G communication system may form an antenna array on a printed circuit board to form a beam pattern. The antenna array formed on the printed circuit board may include a dipole antenna array or a patch antenna array. The dipole antenna array may form a beam pattern in the lateral direction of the electronic device, and the patch antenna array may form a beam pattern in the rear direction of the electronic device.

However, in the electronic device, as the antenna array is formed on the printed circuit board, the beam pattern radiated from the antenna array may be absorbed by a component device (e.g., a battery or a metal device) inside the electronic device, thereby reducing efficiency.

Various embodiments herein may provide a printed circuit board capable of increasing the efficiency of a 5G communication antenna using a signal of a high-frequency band and an electronic device including the same.

SUMMARY

An electronic device according to various embodiments may include a flexible circuit board including a signal line as a transmission line for transmitting a high-frequency band signal, where the flexible circuit board includes an intermediate region in which the signal line is disposed, a pad region extending from the intermediate region and disposed at one end or both ends of the flexible circuit board, a pad electrically connected to the signal line and formed to face a first direction of the flexible circuit board, and a ground pattern overlapping at least a portion of the pad and formed to face a second direction of the flexible circuit board may be arranged in the pad region. The second direction may be opposite to the first direction.

A maximum width of the pad may be greater than a width of the signal line, and a width of the ground pattern may be smaller than the maximum width of the pad.

The flexible circuit board may further include an insulating material overlapping a part of the pad and disposed at both sides of the ground pattern.

The pad may be disposed to extend in an x direction when the flexible circuit board is viewed from the first direction, and the ground pattern may include a first ground pattern disposed in the x direction, and a second ground pattern disposed in a y direction perpendicular to the x direction to cross a part of the pad, where the first direction is a z direction perpendicular to each of the x direction and they direction.

The second ground pattern may be connected to an end of the first ground pattern.

The flexible circuit board may be in a stacked structure, and the stacked structure of the flexible circuit board may include a first conductive layer comprising the signal line and an intermediate insulating material formed at both sides of the signal line, and a second conductive layer comprising a lower ground pattern disposed in the second direction from the signal line to overlap at least a part of the signal line, and a lower insulating material formed at both sides of the lower ground pattern.

The second conductive layer may further include multiple lower ground bridges formed to cross the signal line.

The stacked structure of the flexible circuit board may further include a third conductive layer comprising an upper ground pattern disposed in the first direction from the signal line to overlap at least a part of the signal line, and an upper insulating material formed at both sides of the upper ground pattern.

The second conductive layer may further include multiple upper ground bridges formed to cross the signal line.

The signal in the frequency band may include a signal in a band of 10 GHz to 100 GHz.

The signal line may be a strip line-type transmission line.

The signal line may be a microstrip line-type transmission line.

A flexible circuit board for transmitting a signal in a frequency band may include an intermediate region in which a signal line as a transmission line for transmitting the frequency band signal is disposed, a pad region extending from the intermediate region and disposed at one end or both ends of the flexible circuit board, a pad electrically connected to the signal line and formed to face a first direction of the flexible circuit board, and a ground pattern overlapping at least a portion of the pad and formed to face a second direction of the flexible circuit board and disposed in the pad region, the second direction may be opposite to the first direction.

DETAILED DESCRIPTION

Figure 1:
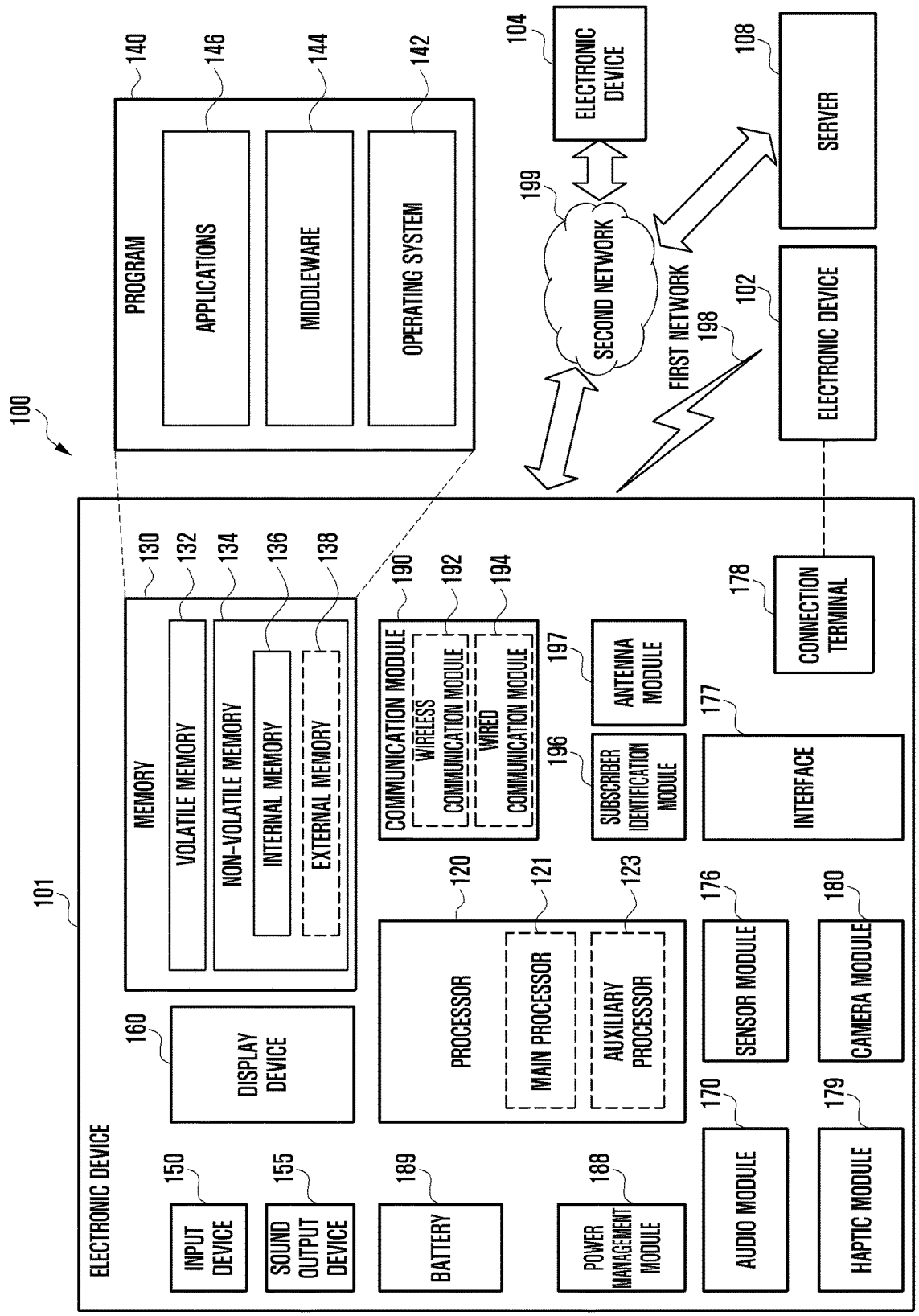
FIG. 1 is a block diagram of an electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
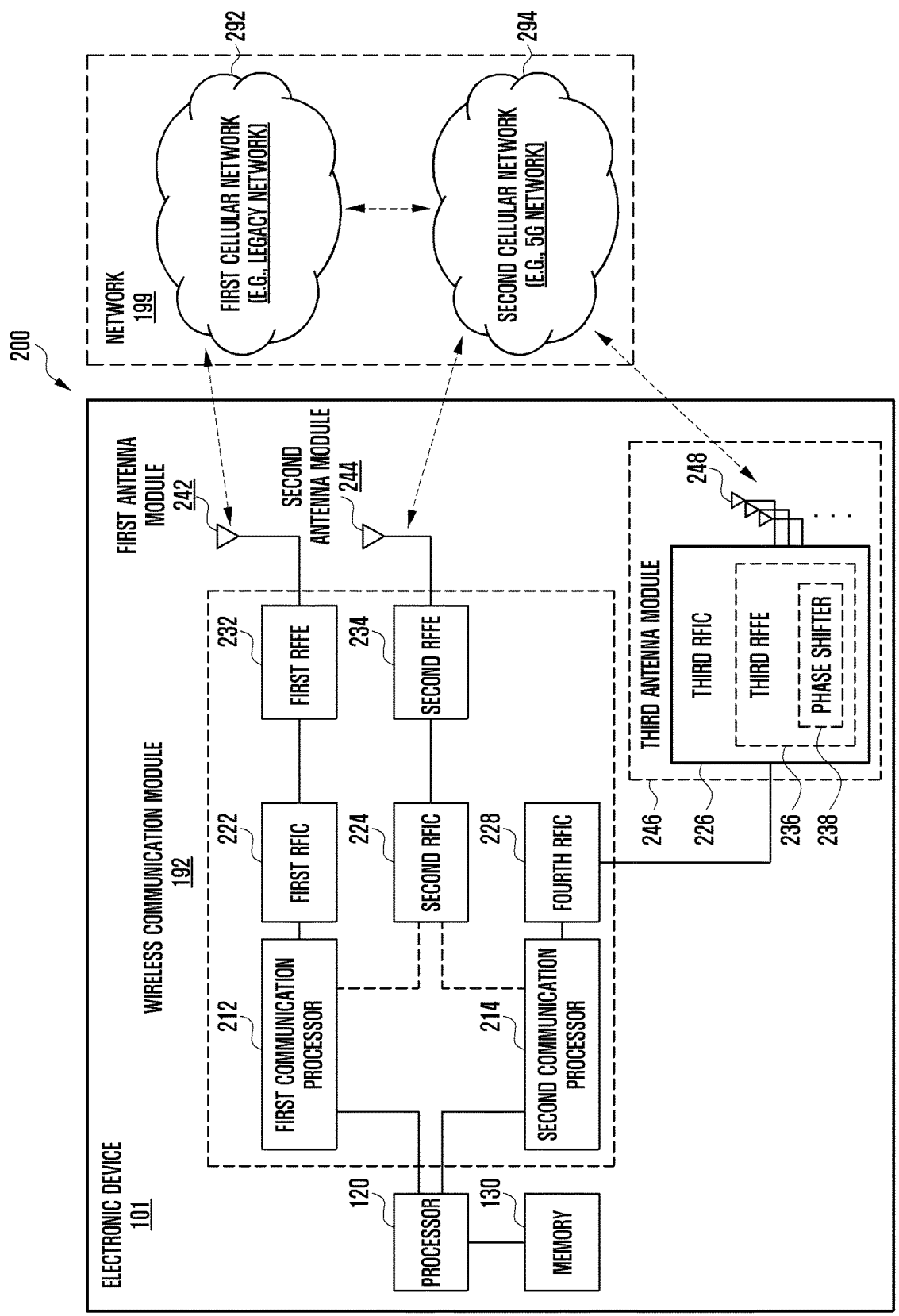
FIG. 2 is a block diagram of an electronic device for supporting legacy network communication and 5G network communication according to various embodiments.

FIG. 2 is a block diagram 200 of an electronic device 101 for supporting legacy network communication and 5G network communication according to various embodiments. Referring to FIG. 2, the electronic device 101 may include a first communication processor 212, a second communication processor 214, a first radio frequency integrated circuit (RFIC) 222, a second RFIC 224, a third RFIC 226, a fourth RFIC 228, a first radio frequency front end (RFFE) 232, a second RFFE 234, a first antenna module 242, a second antenna module 244, and an antenna 248. The electronic device 101 may further include a processor 120 and a memory 130. A network 199 may include a first network 292 and a second network 294. According to another embodiment, the electronic device 101 may further include at least one component among the components illustrated in FIG. 1, and the network 199 may further include at least one other network. According to an embodiment, the first communication processor 212, the second communication processor 214, the first RFIC 222, the second RFIC 224, the fourth RFIC 228, the first RFFE 232, and the second RFFE 234 may form at least a part of a wireless communication module 192. According to another embodiment, the fourth RFIC 228 may be omitted or may be included as a part of the third RFIC 226.

The first communication processor 212 may establish a communication channel for a band to be used for wireless communication with the first network 292, and may support legacy network communication through the established communication channel. According to various embodiments, the first network 292 may be a legacy network including a 2G, 3G, 4G, or long-term-evolution (LTE) network. The second communication processor 214 may establish a communication channel corresponding to a designated band (e.g., from about 6 GHz to about 60 GHz) among bands to be used for wireless communication with the second network 294, and may support 5G network communication through the established communication channel. According to various embodiments, the second network 294 may be a 5G network defined in the 3GPP. Additionally, according to an embodiment, the first communication processor 212 or the second communication processor 214 may establish a communication channel corresponding to another designated band (e.g., about 6 GHz or less) among the bands to be used for wireless communication with the second network 294, and may support 5G network communication through the established communication channel. According to an embodiment, the first communication processor 212 and the second communication processor 214 may be implemented in a single chip or a single package. According to various embodiments, the first communication processor 212 or the second communication processor 214 may be disposed in a single chip or a single package together with the processor 120, the auxiliary processor 123, or the communication module 190.

At the time of signal transmission, the first RFIC 222 may convert a baseband signal generated by the first communication processor 212 into a radio-frequency (RF) signal of about 700 MHz to about 3 GHz used for the first network 292 (e.g., the legacy network). At the time of signal reception, an RF signal may be acquired from the first network 292 (e.g., the legacy network) through an antenna (e.g., the first antenna module 242), and may be preprocessed through an RFFE (e.g., the first RFFE 232). The first RFIC 222 may convert the preprocessed RF signal into a baseband signal that can be processed by the first communication processor 212.

At the time of signal transmission, the second RFIC 224 may convert a baseband signal generated by the first communication processor 212 or the second communication processor 214 into an RF signal of a Sub6 band (e.g., about 6 GHz or less) (hereinafter, referred to as a "5G Sub6 RF signal") used for the second network 294 (e.g., the 5G network). At the time of signal reception, a 5G Sub6 RF signal may be acquired from the second network 294 (e.g., the 5G network) through an antenna (e.g., the second antenna module 244), and may be preprocessed through an RFFE (e.g., the second RFFE 234). The second RFIC 224 may convert the preprocessed 5G Sub6 RF signal into a baseband signal that can be processed by a corresponding communication processor among the first communication processor 212 or the second communication processor 214.

The third RFIC 226 may convert a baseband signal generated by the second communication processor 214 into an RF signal of a 5G Above6 band (e.g., from about 6 GHz to about 60 GHz) (hereinafter, referred to as a "5G Above6 RF signal") to be used in the second network 294 (e.g., the 5G network). At the time of signal reception, a 5G Above6 RF signal may be acquired from the second network 294 (e.g., the 5G network) through an antenna (e.g., the antenna 248), and may be preprocessed through the third RFFE 236. The third RFIC 226 may convert the preprocessed 5G Above6 RF signal into a baseband signal that can be processed by the second communication processor 214. According to an embodiment, the third RFFE 236 may be formed as a part of the third RFIC 226.

According to an embodiment, the electronic device 101 may include the fourth RFIC 228 separately from the third RFIC 226 or as at least a part of the third RFIC 226. The fourth RFIC 228 may convert a baseband signal generated by the second communication processor 214 into an RF signal of an intermediate frequency band (e.g., from about 9 GHz to about 11 GHz) (hereinafter, referred to as an "IF signal"), and may then transmit the IF signal to the third RFIC 226. The third RFIC 226 may convert the IF signal into a 5G Above6 RF signal. At the time of signal reception, a 5G Above6 RF signal may be received from the second network 294 (e.g., the 5G network) through an antenna (e.g., the antenna 248), and may be converted into an IF signal by the third RFIC 226. The fourth RFIC 228 may convert the IF signal into a baseband signal that can be processed by the second communication processor 214.

According to an embodiment, the first RFIC 222 and the second RFIC 224 may be implemented as at least a part of a single package or a single chip. According to an embodiment, the first RFFE 232 and the second RFFE 234 may be implemented as at least a part of a single package or a single chip. According to an embodiment, at least one antenna module among the first antenna module 242 or the second antenna module 244 may be omitted, or may be combined with the other antenna module to process RF signals of multiple bands corresponding thereto.

According to an embodiment, the third RFIC 226 and the antenna 248 may be arranged on the same substrate to form a third antenna module 246. For example, the wireless communication module 192 or the processor 120 may be disposed on a first substrate (e.g., a main PCB). In this case, the third antenna module 246 may be formed by disposing the third RFIC 226 in a partial region (e.g., a lower surface) of a second substrate (e.g., a sub-PCB) different from the first substrate and disposing the antenna 248 in another partial region (e.g., an upper surface) of the second substrate. Disposing the third RFIC 226 and the antenna 248 on the same substrate may reduce the length of a transmission line therebetween. This may reduce, for example, the loss (e.g., attenuation) of a signal in a high-frequency band (e.g., from about 6 GHz to about 60 GHz) used for 5G network communication due to the transmission line. Therefore, the electronic device 101 may enhance the quality or speed of communication with the second network 294 (e.g., the 5G network).

According to an embodiment, the antenna 248 may be formed as an antenna array including multiple antenna elements which can be used for beamforming. In this instance, for example, the third RFIC 226 may include, as a part of the third RFFE 236, multiple phase shifters 238 corresponding to the multiple antenna elements. At the time of signal transmission, each of the multiple phase shifters 238 may shift the phase of a 5G Above6 RF signal to be transmitted from the electronic device 101 to the outside (e.g., a base station of a 5G network) through a corresponding antenna element. At the time of signal reception, each of the multiple phase shifters 238 may shift the phase of a 5G Above6 RF signal received from the outside through a corresponding antenna element into an identical or substantially identical phase. This enables transmission or reception through beamforming between the electronic device 101 and the outside.

The second network 294 (e.g., the 5G network) may be operated independently of the first network 292 (e.g., the legacy network) (e.g., standalone (SA)) or may be operated while being connected to the first network (e.g., non-standalone (NSA)). For example, the 5G network may include only an access network (e.g., a 5G radio access network (RAN) or a next-generation RAN (NG RAN)), and may not include a core network (e.g., a next-generation core (NGC)). In this instance, the electronic device 101 may access the access network of the 5G network and may then access an external network (e.g., the Internet) under the control of a core network (e.g., an evolved packed core (EPC)) of the legacy network. Protocol information (e.g., LTE protocol information) for communication with the legacy network or protocol information (e.g., new radio (NR) protocol information) for communication with the 5G network may be stored in the memory 130, and may be accessed by another component (e.g., the processor 120, the first communication processor 212 or the second communication processor 214).

Figure 3:
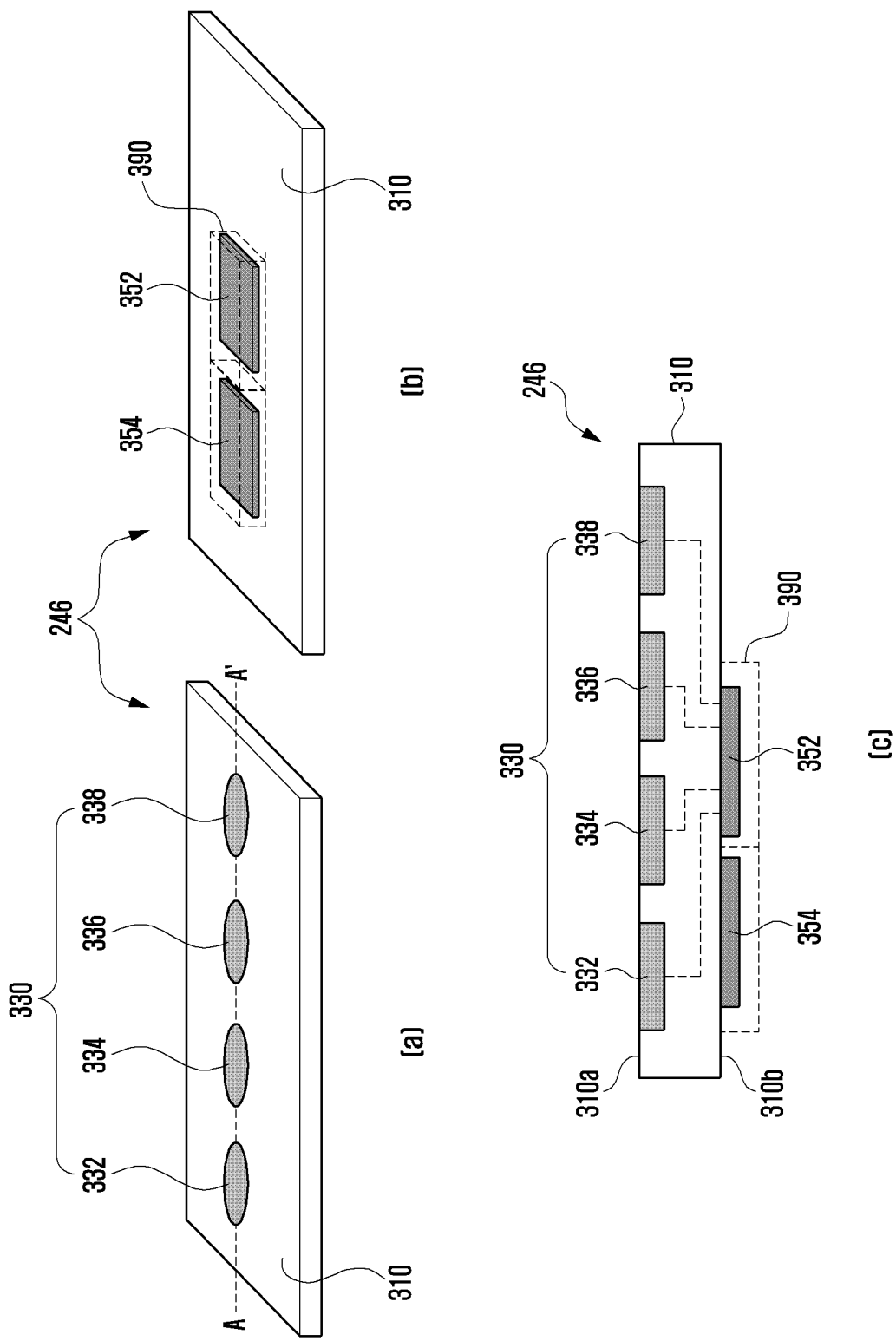
FIG. 3 illustrates an embodiment of the structure of a third antenna module described with reference to FIG. 2.

FIG. 3 illustrates an embodiment of the structure of the third antenna module 246 described with reference to FIG. 2. (a) of FIG. 3 is a perspective view of the third antenna module 246 viewed from one side, (b) of FIG. 3 is a perspective view of the third antenna module 246 viewed from the other side. (c) of FIG. 3 is a cross-sectional view taken along line A-A' of the third antenna module 246.

Referring to FIG. 3, in an embodiment, the third antenna module 246 may include a first printed circuit board 310, an antenna array 330, a radio frequency integrated circuit (RFIC) 352, a power management integrated circuit (PMIC) 354, or a module interface (not shown). According to another embodiment, the third antenna module 246 may further include a shielding member 390. In other embodiments, at least one of the above-mentioned components may be omitted, or at least two of the above-mentioned components may be integrally formed.

The first printed circuit board 310 may include multiple conductive layers and multiple non-conductive layers alternately stacked with the conductive layers. The first printed circuit board 310 may provide an electrical connection between the first printed circuit board 310 and/or various electronic components disposed outside by using wirings and conductive vias formed in the conductive layers.

The antenna array 330 (e.g., 248 in FIG. 2) may include multiple antenna elements 332, 334, 336, or 338 arranged to form a directional beam. As illustrated, the antenna elements may be formed on a first surface 310*a* of the first printed circuit board 310. According to another embodiment, the antenna array 330 may be formed in the first printed circuit board 310. According to various embodiments, the antenna array 330 may include multiple antenna arrays (e.g., a dipole antenna array and/or a patch antenna array) of identical or different shapes or types.

The RFIC 352 (e.g., 226 in FIG. 2) may be disposed in another region of the first printed circuit board 310 (e.g., a second surface 310*b* opposite to the first surface 310*a*), which is spaced apart from the antenna array. The RFIC 352 is configured to process a signal of a selected frequency band, which is transmitted/received through the antenna array 330. According to an embodiment, at the time of signal transmission, the RFIC 352 may convert a baseband signal acquired from a communication processor (e.g., the second communication processor 214 of FIG. 2) into an RF signal of a designated band. At the time of signal reception, the RFIC 352 may convert an RF signal received through the antenna array 330 into a baseband signal and transmit the baseband signal to the communication processor.

According to another embodiment, at the time of signal transmission, the RFIC 352 may up-convert an IF signal (e.g., about 9 GHz to about 11 GHz) acquired from an intermediate frequency integrated circuit (IFIC) (e.g., the fourth RFIC 228 of FIG. 2) into an RF signal of a selected band). At the time of signal reception, the RFIC 352 may down-convert an RF signal acquired through the antenna array 352 into an IF signal and transmit the IF signal to the IFIC.

The PMIC 354 may be disposed in another partial region (e.g., the second surface 310b) of the first printed circuit board 310, which is spaced apart from the antenna array 330. The PMIC 354 may receive a voltage from a main printed circuit board (e.g., the second printed circuit board 430 in FIG. 4), and may provide power required for various components (e.g., the RFIC 352) on an antenna module.

The shielding member 390 may be disposed on a part (e.g., the second surface 310b) of the first printed circuit board 310 so as to electromagnetically shield at least one of the RFIC 352 or the PMIC 354. According to an embodiment, the shielding member 390 may include a shield can.

Although not illustrated, in various embodiments, the third antenna module 246 may be electrically connected to another printed circuit board (e.g., the second printed circuit board 430 in FIG. 4) through a module interface. The module interface may include a connection member, for example, a coaxial cable connector, a board-to-board connector, an interposer, or a flexible printed circuit board (FPCB). The RFIC 352 and/or the PMIC 354 of the antenna module may be electrically connected to the main printed circuit board (e.g., the second printed circuit board 430 in FIG. 4) through the connection member.

In various embodiments, an electronic device (e.g., the electronic device 101 in FIG. 1) may include a single third antenna module 246, or may include multiple third antenna modules 246.

Figure 4:
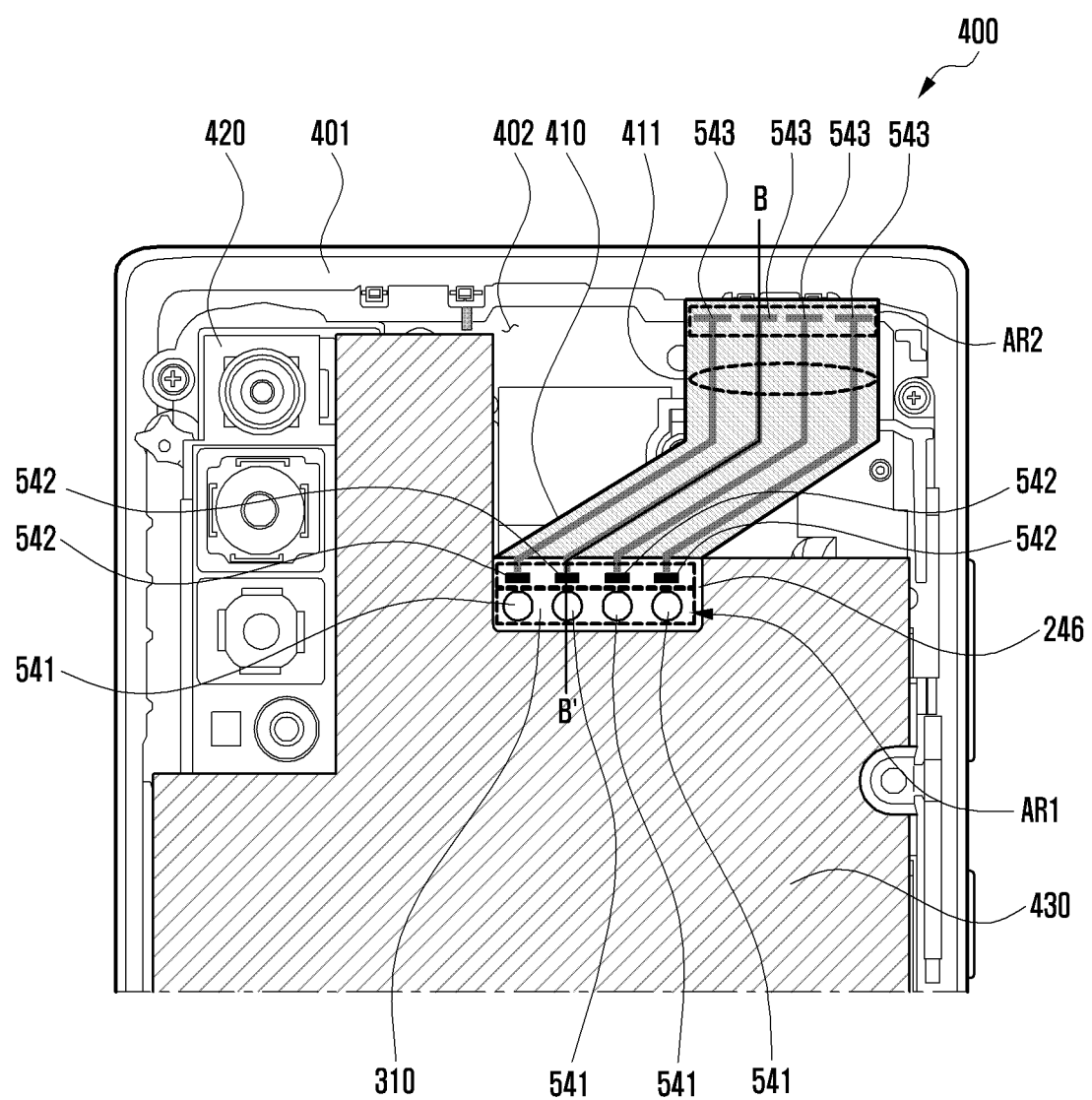
FIG. 4 illustrates the configuration of an electronic device including the structure of the third antenna module described with reference to FIG. 2.

FIG. 4 illustrates the configuration of an electronic device 400 including the structure of the third antenna module 246 described with reference to FIG. 2. The electronic device 400 illustrated in FIG. 4 may be at least partially similar to the electronic device 101 illustrated in FIG. 1, or may further include another embodiment. FIG. 4 illustrates a part of the electronic device 400 viewed from the rear surface (e.g., a surface on which a rear cover is disposed, or direction ① in FIG. 5), and may illustrate an internal structure shown while the rear cover (or, a rear plate) (e.g., 550 in FIG. 5) is removed.

Referring to FIG. 4, the electronic device 400 according to an embodiment may include a housing 401 and at least one component disposed in a space 402 in the housing 401. For example, the electronic device 400 may include a camera 420, a battery (not shown), a third antenna module 246, or a second printed circuit board 430 (e.g., the main circuit board), arranged in the space 402, and may include another embodiment in which at least some of the elements are omitted or other elements are added.

According to an embodiment, the second printed circuit board 430 may be disposed in the space 402 in the housing 401 so as to avoid or not to overlap the battery (not shown) or the camera 420. At least a part of the second printed circuit board 430 may be connected to the antenna module 246 (e.g., the third antenna module 246 in FIG. 3) for communicating with a 5G network (e.g., the second network 294 in FIG. 2). The second printed circuit board 430 and the antenna module 246 may be electrically connected to each other through a module interface (e.g., a coaxial cable connector, a board-to-board connector, an interposer, or a flexible printed circuit board (FPCB)). The antenna module 246 may be, for example, identical or at least partially similar to the third antenna module 246 illustrated in FIG. 3.

According to an embodiment, the antenna module 246 may include a first printed circuit board (e.g., 310 in FIG. 3), a first antenna array AR1 (e.g., a patch antenna array) positioned on at least a part of the first printed circuit board 310, first conductive patterns 542 electrically connected to a second antenna array AR2 (e.g., a dipole antenna array, and/or an RFIC (e.g., 352 in FIG. 3) electrically connected to the antenna arrays (e.g., the first antenna array AR1 and/or the second antenna array AR2). According to an embodiment, the first printed circuit board 310 including the antenna module 246 may be a separate printed circuit board other than the second printed circuit board 430. For example, the electronic device 400 may include the first printed circuit board 310 separated from the second printed circuit board 430 which includes a wireless communication module (e.g., the wireless communication module 192 in FIG. 1), a processor (e.g., the processor 120 in FIG. 1), and/or a memory (e.g., the memory 130 in FIG. 1).

According to an embodiment, the first antenna array AR1 may include multiple conductive patches 541 spaced apart from each other on at least a part of the first printed circuit board 310. The multiple conductive patches 541 may operate as a patch antenna array, and may form a beam pattern in the direction (e.g., direction ① in FIG. 5) faced by the rear cover (or rear plate) (e.g., 550 in FIG. 5) of the electronic device.

According to an embodiment, the second antenna array AR2 may include multiple second conductive patterns 543 formed on a flexible printed circuit board (FPCB) 410 electrically connected to the first printed circuit board 310. In an embodiment, the multiple second conductive patterns 543 may be formed at intervals on one side of the flexible circuit board 410 so as to be spaced apart from the first printed circuit board 310. In an embodiment, the multiple second conductive patterns 543 may be electrically connected to the multiple first conductive patterns 542 positioned in the antenna module 246 through a signal line 411 formed on the flexible circuit board 410. In another embodiment, the second conductive patterns 543 may be formed on another printed circuit board (not shown), and the other printed circuit board (not shown) and the first printed circuit board 310 may be electrically connected to each other through the flexible circuit board 410. In another embodiment, the multiple second conductive patterns 543 may be a patch antenna array identical or similar to the first conductive patterns 542.

The second antenna array AR2 may be formed in a part spaced apart from the first printed circuit board 310, thereby forming a beam pattern from the spaced part. For example, the flexible circuit board 410 may extend from a part bonded to the first printed circuit board 310 to a part adjacent to a side member (e.g., a side member 520 in FIG. 5) of the housing 401, and the second antenna array AR2 may be formed in a part adjacent to the side member 520. The second antenna array AR2 may form a beam pattern at a part adjacent to the side member 520 in a direction (e.g., direction ② in FIG. 5) faced by the side member 520.

According to an embodiment, the flexible circuit board 410 may be electrically connected to the multiple first conductive patterns 542 of the first printed circuit board 310 through conductive bonding. The flexible circuit board 410 may include the signal line 411 electrically connecting the multiple first conductive patterns 542 to the second antenna array AR2 (i.e., the multiple second conductive patterns 543).

According to an embodiment, the signal line 411 formed on the flexible circuit board 410 may be a single transmission line or multiple transmission lines for transmitting a signal in a high-frequency band (e.g., 10 GHz to 100 GHz) for communication with the 5G network (e.g., the second network 294 in FIG. 2). According to an embodiment, the signal line 411 formed on the flexible circuit board 410 may be a single transmission line or multiple transmission lines for transmitting a signal in a low band of 600 to 800 MHz, a mid-band of 2.5 to 4.9 GHz, or an ultra-high frequency band of 24 GHz or higher.

Figure 16:
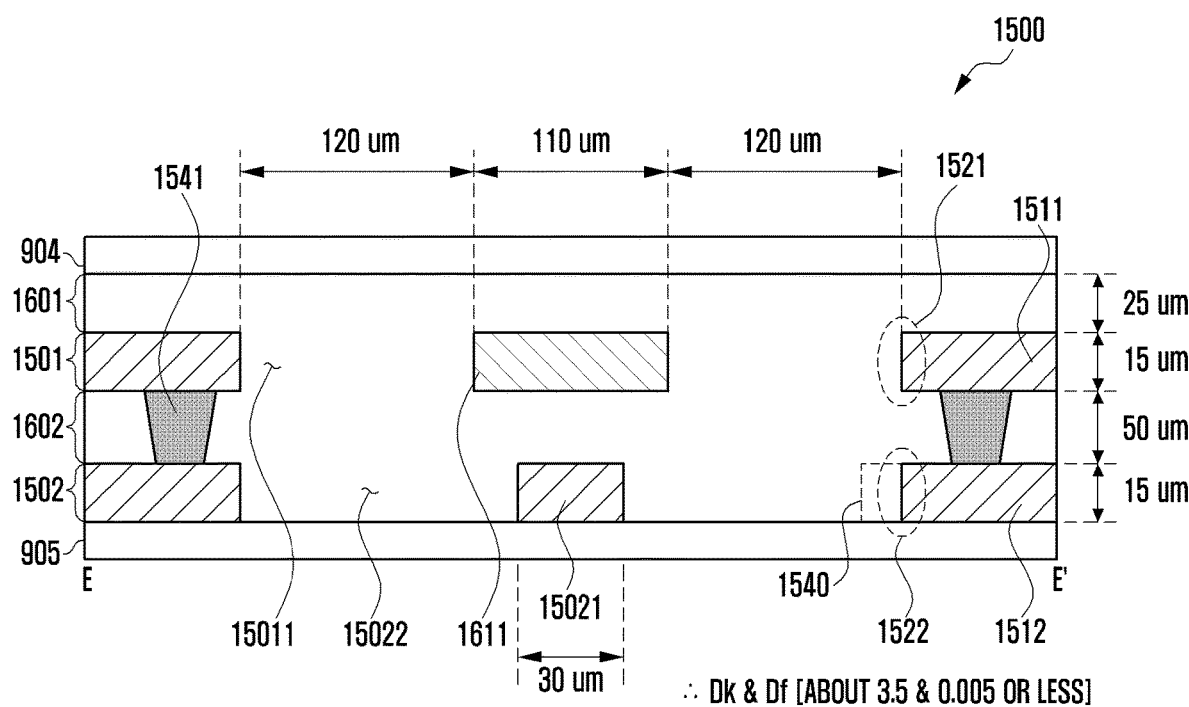
FIG. 16 shows a cross-section of the flexible circuit board according to another embodiment illustrated in FIG. 15.

According to an embodiment, the signal line 411 formed on the flexible circuit board 410 may be a conductive line having the form of a strip line (e.g., 411 in FIG. 10, 411 in FIG. 13, 411 in FIG. 18, or 411 in FIG. 20), or may be a conductive line having the form of a microstrip line (e.g., 1611 of FIG. 16). According to various embodiments, the conductive line having the form of a strip line may be a conductive line formed between two parallel ground surfaces. According to various embodiments, the conductive line having the form of a microstrip line may be a conductive line formed to be spaced apart from the ground surfaces by a dielectric layer (e.g., a substrate).

According to various embodiments, the signal line 411 of the flexible circuit board 410 may be a single signal line or multiple signal lines.

In an embodiment, the flexible circuit board 410 may include multiple signal lines 411, and the multiple signal lines 411 may be conductive lines for transmitting signals in a high-frequency band (e.g., 10 GHz to 100 GHz) for communication with the 5G network (e.g., the second network 294 in FIG. 2). For example, the multiple signal lines 411 may transmit signals in a high-frequency band of "IF frequency of about 9 GHz to 10 GHz/RF radiation frequency of about 24 GHz to 28 GHz and 39 GHz" in order to achieve a high data transmission rate.

In another embodiment, the flexible circuit board 410 may include a single signal line 411, and the single signal line 411 may transmit a signal in a high-frequency band of "IF of about 18 GHz/RF radiation frequency of about 60 GHz" based on 802.11ay.

According to an embodiment, the conductive bonding connecting the flexible circuit board 410 to the first printed circuit board 310 may include an anisotropic conductive adhesive (ACA) or anisotropic conductive paste (ACP). In another embodiment, the conductive bonding may be replaced by an anisotropic conductive film (ACF). In another embodiment, the conductive bonding may be replaced with solder (e.g., pre-solder) for soldering.

Figure 5:
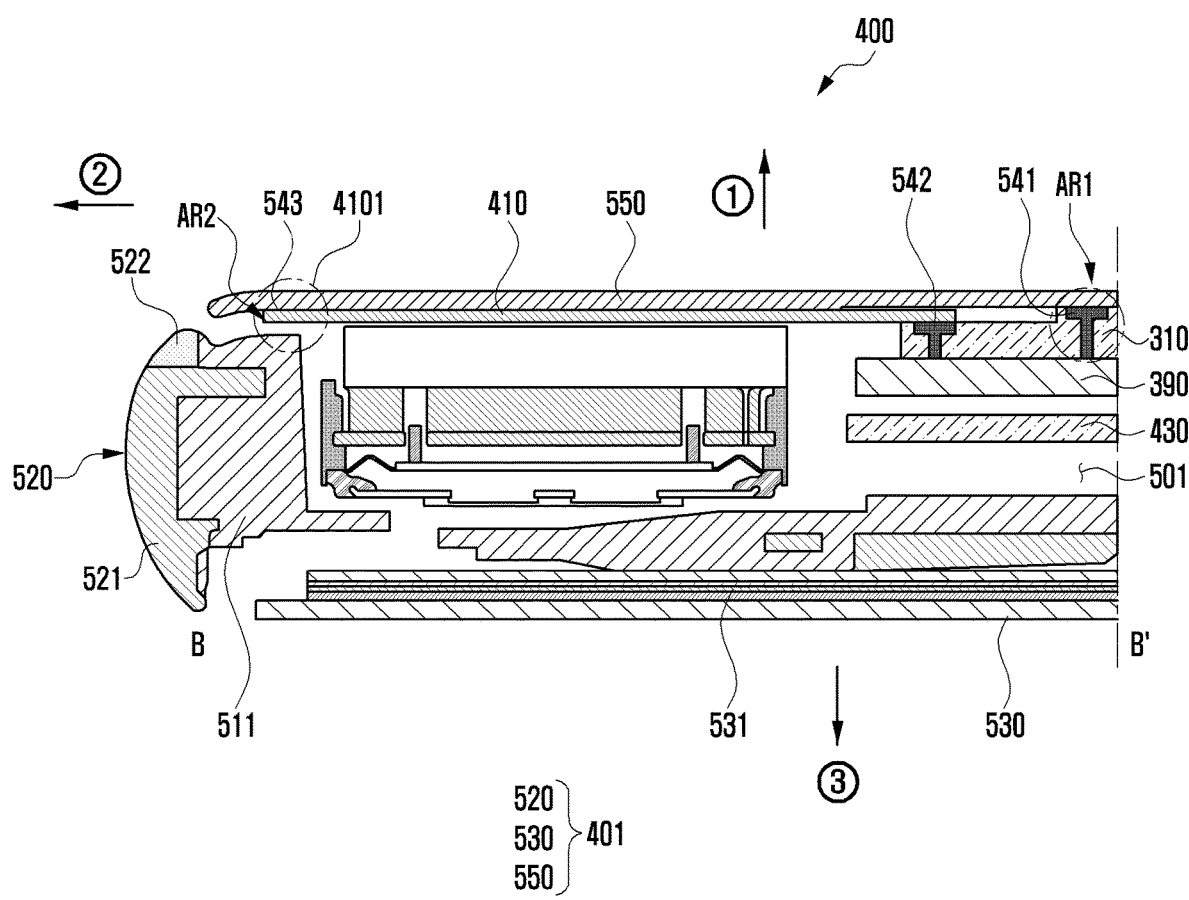
FIG. 5 is a partial cross-sectional view of an electronic device according to an embodiment.

FIG. 5 is a partial cross-sectional view of an electronic device according to an embodiment. For example, FIG. 5 is a cross-sectional view of the electronic device, taken along line B-B' in FIG. 4. The electronic device 400 illustrated in FIG. 5 may be at least partially similar to the electronic device 101 illustrated in FIG. 1, or may further include another embodiment.

Referring to FIG. 5, an electronic device (e.g., 400 in FIG. 4) according to an embodiment may include a housing (e.g., 401 in FIG. 4), a support member 511, a first printed circuit board (e.g., 310 in FIG. 4), a flexible circuit board (e.g., 410 in FIG. 4), or a display 531 (e.g., the display device 160 in FIG. 1), and may include another embodiment in which at least some of the elements are omitted or other elements are added.

According to an embodiment, the housing 401 may include a front cover 530, a rear cover 550, or a side member 520. The front cover (or front plate) 530 may be disposed to face the front surface of the electronic device 400 (e.g., direction ③ in FIG. 5) through which the display 531 is viewed. The rear cover 550 may be disposed to face the rear surface of the electronic device 400 (e.g., direction ① in FIG. 5). The side member 520 may surround the space (e.g., 402 in FIG. 4) between the front cover 530 and the rear cover 550, and may be structurally coupled to the front cover 530 and the rear cover 550. According to an embodiment, the side member 520 may include a conductive part 521 that is at least partially disposed, and a non-conductive part (e.g., a polymer part) 522 that is insert-injected into the conductive part 521.

According to an embodiment, the support member 511 extending from the side member 520 to a part of the inner space 501 may be disposed in an inner space 501 (e.g., 402 in FIG. 4) of the electronic device 400. The support member 511 may be connected by structural coupling, and may include a polymer member and/or a conductive member into which the polymer member is at least partially insert-injected. The support member 511 may support the first printed circuit board 310, a second printed circuit board (e.g., the second printed circuit board 430 in FIG. 4), a camera (e.g., 420 in FIG. 4), a battery (not shown), or at least a part of the display 531 in the inner space 501 of the electronic device 400.

According to an embodiment, the first printed circuit board 310 may be disposed between the rear cover 550 and the support member 511, and may include the structure of the third antenna module 246 described with reference to FIG. 2. The first printed circuit board 310 may include first antenna array AR1 operating as a patch antenna array, or multiple first conductive patterns 542 electrically connected to the second antenna array AR2 operating as a dipole antenna array.

According to an embodiment, the first antenna array AR1 may include multiple conductive patches 541 spaced apart from each other on at least a part of the first printed circuit board 310. The multiple conductive patches 541 may operate as a patch antenna array, and may form a beam pattern in a direction (e.g., direction ① in FIG. 5) faced by the rear cover 550 of the electronic device 400.

According to an embodiment, the multiple first conductive patterns 542 may be electrically connected to the second antenna array AR2 of the flexible circuit board 410 by being electrically connected to the flexible circuit board 410 through conductive bonding. The second antenna array AR2 may include multiple second conductive patterns 543 (e.g., the multiple second conductive patterns 543 in FIG. 4) formed on the flexible circuit board 410. The multiple second conductive patterns 543 may be formed in a part 4101 adjacent to the side member 520, and may form beam patterns from the adjacent part 4101. For example, the multiple second conductive patterns 543 of the second antenna array AR2 may form beam patterns in a direction (e.g., direction ② in FIG. 5) faced by the side member 520.

Figure 6:
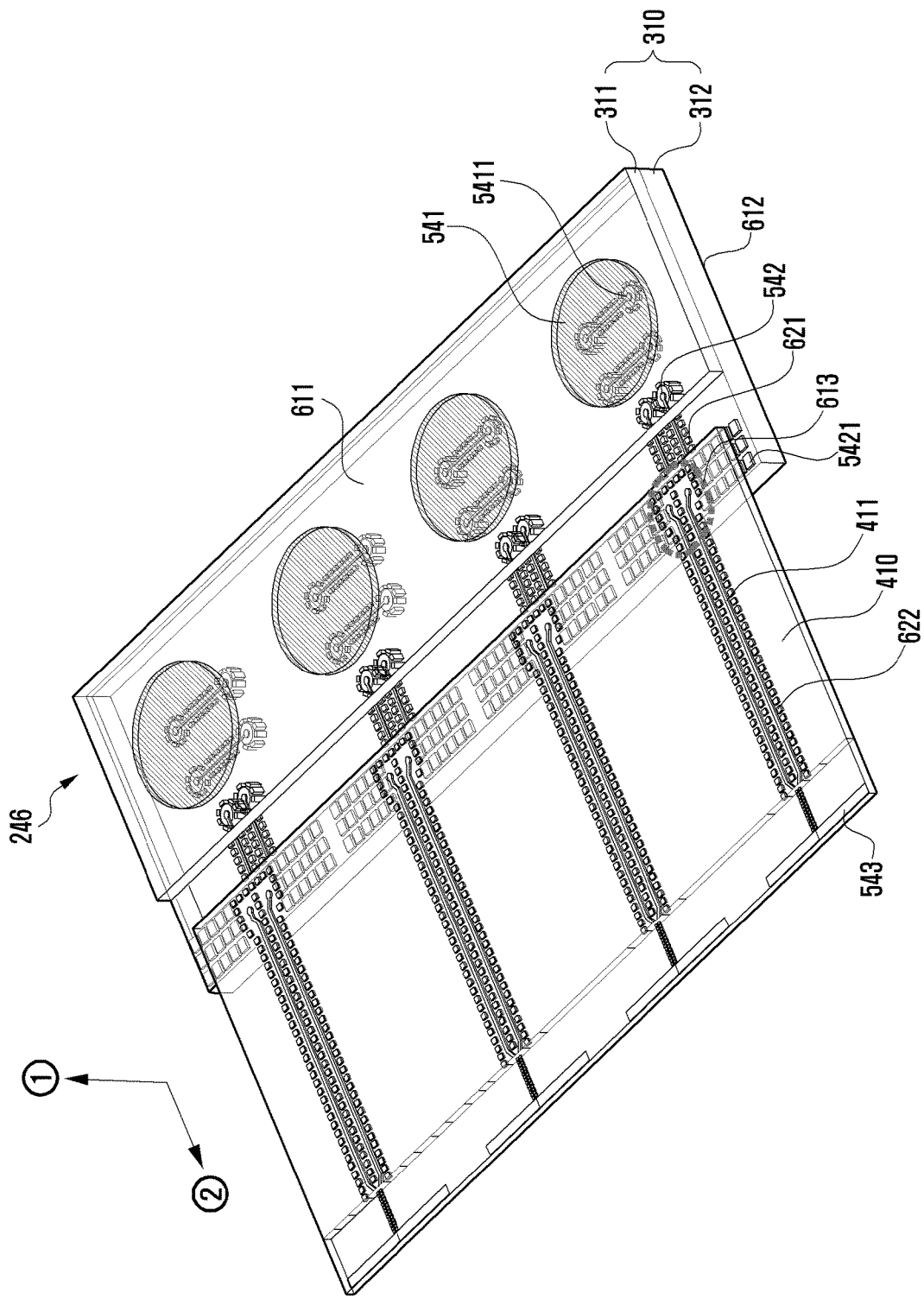
FIG. 6 is a perspective view schematically showing an antenna module according to an embodiment.

FIG. 6 is a perspective view schematically showing an antenna module (246 in FIG. 4) according to an embodiment. A first printed circuit board 310 and a flexible circuit board 410 illustrated in FIG. 6 may be identical or at least partially similar to the first printed circuit board 310 and the flexible circuit board 410 illustrated in FIG. 4, or may further include another embodiment.

Referring to FIG. 6, a first printed circuit board (e.g., 310 in FIG. 4) may include a first surface 611 facing a first direction (e.g., direction ① in FIG. 5) faced by a rear cover (e.g., 550 in FIG. 5) of an electronic device (e.g., 400 in FIG. 4), and a second surface 612 opposite to the first surface 611, and an RFIC (e.g., 352 in FIG. 3) or a PMIC (e.g., 354 in FIG. 3) may be disposed on the second surface 612.

According to an embodiment, the first printed circuit board 310 may include multiple conductive patches 541 (e.g., the first antenna array AR1) operating as a patch antenna array, or multiple first conductive patterns 542 (e.g., the second antenna array AR2) operating as a dipole antenna array.

According to an embodiment, the multiple conductive patches 541 (e.g., the first antenna array AR1) may be exposed through the first surface 611 of the first printed circuit board 310, or may be disposed closed to the first surface 611 in the inner space between the first surface 611 and the second surface 612. The multiple conductive patches 541 may be electrically connected to the RFIC (e.g., 352 in FIG. 3) through wirings and conductive vias 5411 formed in the first printed circuit board 310. The multiple conductive patches 541 may operate as a patch antenna array, and may form a beam pattern in a direction (e.g., direction ① in FIG. 5) faced by the rear cover of the electronic device.

According to an embodiment, the first printed circuit board 310 may include multiple layers 311 and 312. For example, one layer (e.g., a first layer) 311 among the multiple layers 311 and 312 may have a smaller area than the other layer (e.g., a second layer) 312, and the multiple conductive patches 541 may be disposed to overlap the one layer (e.g., the first layer) 311. FIG. 6 illustrates that the first printed circuit board 310 includes the first layer 311 and the second layer 312, but the first printed circuit board 310 may include two or more layers.

According to an embodiment, the multiple first conductive patterns 542 may be spaced apart from each other in the inner space between the first surface 611 and the second surface 612 of the first printed circuit board 310.

Multiple first ground vias 621 may be formed at intervals near the multiple first conductive patterns 542. The multiple first conductive patterns 542 may be electrically connected to multiple pads 5421 spaced apart from each other at a pad part 613 on one side of the first printed circuit board 310. The multiple pads 5421 may be connected to the flexible circuit board 410 by conductive bonding, and thus multiple signal lines 411 of the flexible circuit board 410 may be electrically connected to the multiple first conductive patterns 542.

According to an embodiment, the pad part 613 may be formed on one side of the first printed circuit board 310, and, for example, may be disposed at a part in which the first layer 311 and the second layer 312 of the first printed circuit board 310 do not overlap.

According to an embodiment, the multiple signal lines 411 formed on the flexible circuit board 410 may be electrically connected to the multiple first conductive patterns 542 through conductive bonding at one side of the flexible circuit board 410, and may extend to the other side of the flexible circuit board 410 to be electrically connected to multiple second conductive patterns 543. The other side of the flexible circuit board 410 may be disposed adjacent to a side member (e.g., 520 in FIG. 5) of the housing 401, and the multiple second conductive patterns 543 may be disposed adjacent to the side member 520 of the housing 401. Accordingly, the multiple second conductive patterns 543 may form beam patterns in a direction (e.g., direction ② in FIG. 5) perpendicular to the first surface 611 of the first printed circuit board 310 in a region adjacent to the side member 520.

According to an embodiment, the multiple signal lines 411 formed on the flexible circuit board 410 may be transmission lines for transmitting a signal in a high-frequency band (e.g., 10 GHz to 100 GHz) for communication with a 5G network (e.g., the second network 294 in FIG. 2).

According to an embodiment, in the multiple signal lines 411, a pair of signal lines 411 may be disposed adjacent to each other.

According to various embodiments, the multiple signal lines 411 formed on the flexible circuit board 410 may be strip lines (e.g., 411 in FIG. 10, 411 in FIG. 13, 411 in FIG. 18, or 411 in FIG. 20) or microstrip lines (e.g., 1511 in FIG. 16).

According to an embodiment, the flexible circuit board 410 may include multiple second ground vias 622 formed at intervals near the multiple signal lines 411, or multiple ground bridges (e.g., 911 and 912 in FIG. 9) disposed at intervals in the extension direction of the multiple signal lines 411 and overlapping the multiple signal lines 411.

According to an embodiment, the multiple ground bridges (e.g., 911 and 912 in FIG. 9) may be formed to cross the multiple signal lines 411. For example, the multiple ground bridges (e.g., 911 and 912 in FIG. 9) may be formed to intersect the multiple signal lines 411 at a designated angle, for example, 90 degrees. According to another embodiment, the designated angle may be variously modified or changed from 90 degrees of the above example.

The multiple ground bridges (e.g., 911 and 912 in FIG. 9) may be formed to intersect the multiple signal lines 411 at the designated angle, thereby reducing interference among the multiple signal lines 411.

According to various embodiments, when the flexible circuit board 410 is designed to include the multiple ground bridges (e.g., 911 and 912 in FIG. 9), the multiple second ground vias 622 may be selectively formed. For example, when the flexible circuit board 410 is designed to include the multiple ground bridges (e.g., 911 and 912 in FIG. 9), all or at least some of the multiple second ground vias 622 may be omitted.

Figure 7:
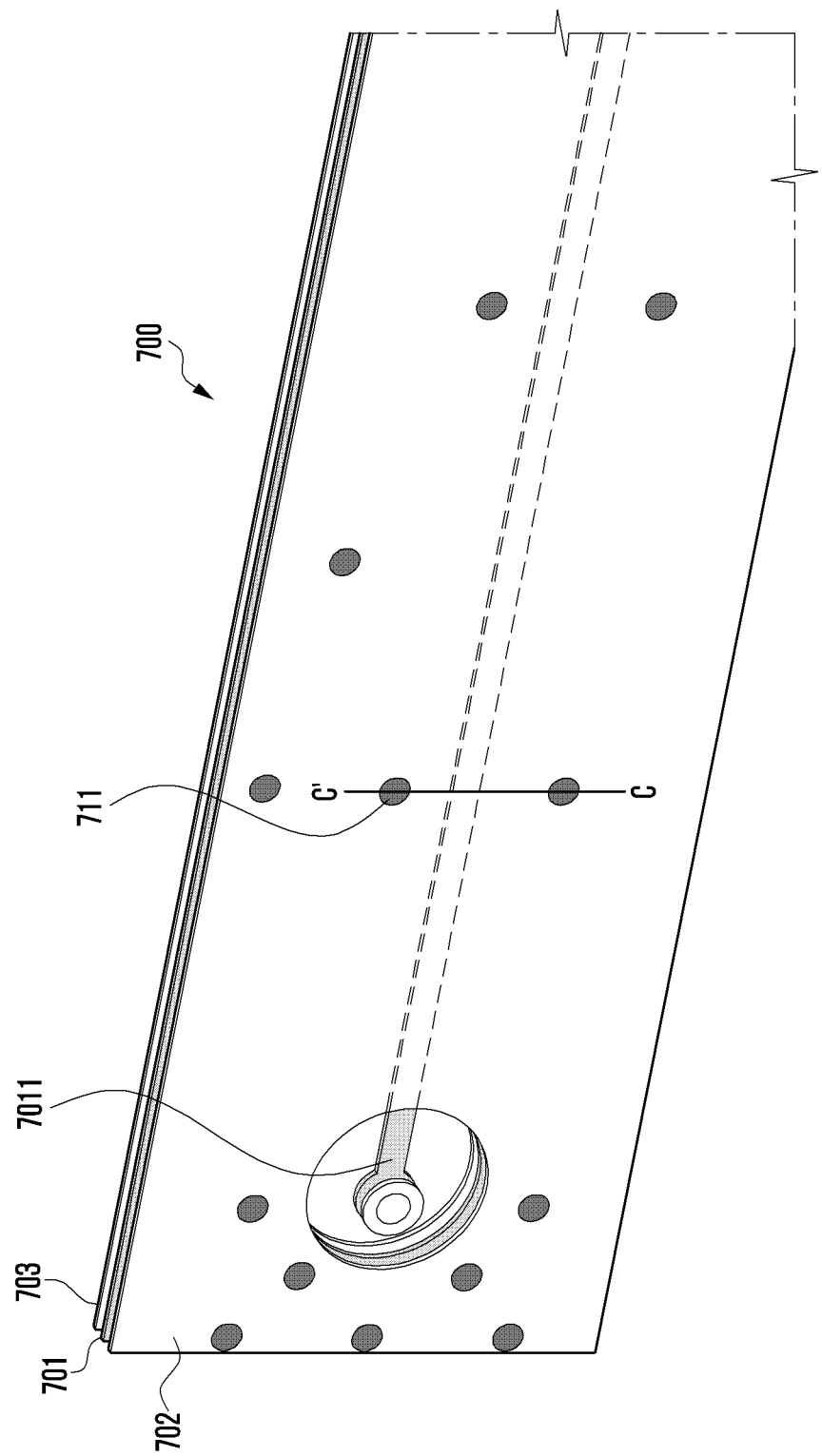
FIG. 7 is a perspective view showing a portion of a flexible circuit board according to a comparative example.
Figure 8:
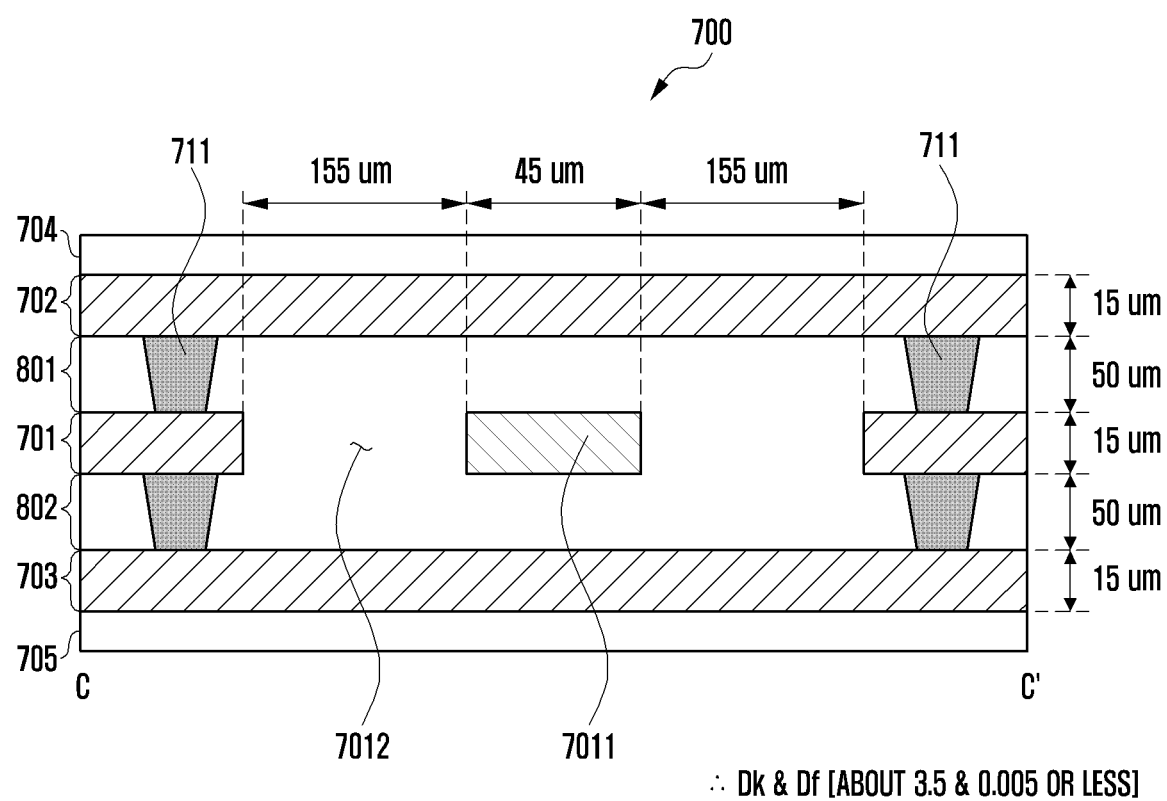
FIG. 8 shows a cross-section of the flexible circuit board according to the comparative example illustrated in FIG. 7.

FIG. 7 is a perspective view showing a part of a flexible circuit board 700 according to a comparative example. For example, FIG. 7 is a perspective view schematically illustrating any one signal line 411 shown in FIG. 6 and a part corresponding to the surrounding thereof. FIG. 8 shows a cross-section of the flexible circuit board 700 according to the comparative example illustrated in FIG. 7. FIG. 8 illustrates a cross-section of the flexible circuit board 700, taken along line C-C' illustrated in FIG. 7.

Referring to FIGS. 7 and 8, the flexible circuit board 700 according to the comparative example may include a first conductive layer 701, a second conductive layer 702 disposed above the first conductive layer 701 (e.g., a first direction), and a third conductive layer 703 disposed below the first conductive layer 701 (e.g., a second direction opposite to the first direction). A first coverlay 704 formed of an insulating material may be disposed at the uppermost layer of the flexible circuit board 700, for example, on the second conductive layer 702 (e.g., in the first direction). A second coverlay 705 formed of an insulating material may be disposed at the lowermost layer of the flexible circuit board 700, for example, beneath the third conductive layer 703 (e.g., in the second direction).

A strip line 7011 and an intermediate insulating material 7012 outside the strip line 7011 may be disposed in the first conductive layer 701. The strip line 7011 may be a transmission line for transmitting a signal of a high-frequency band (e.g., 10 GHz to 100 GHz) for communication with a 5G network (e.g., the second network 294 in FIG. 2).

The second conductive layer 702 may be disposed above the first conductive layer 701 (e.g., in the first direction) and may include an upper ground formed in common over the entire area of the flexible circuit board 700.

The third conductive layer 703 may be disposed below the first conductive layer 701 (e.g., in the second direction) and may include a lower ground formed in common over the entire area of the flexible circuit board 700.

A first insulating layer 801 may be disposed between the first conductive layer 701 and the second conductive layer 702. A second insulating layer 802 may be disposed between the first conductive layer 701 and the third conductive layer 703.

In both sides of the strip line 7011, multiple ground vias 711 may be formed at intervals. The multiple ground vias 711 may penetrate the first insulating layer 801 and the second insulating layer 802.

In general, Zo, which is characteristic impedance of a transmission line (e.g., impedance of a line when the line is infinitely long), may be defined as in Equation 1. In Equation 1, R, L, G, and C may be line resistance, inductance, dielectric conductance, and capacitance per unit length, which may be dependent on a frequency.

$$Zo = \sqrt{\frac{R + j\omega L}{G + j\omega C}} \qquad \text{[Equation 1]}$$

In the flexible circuit board 700 according to the comparative example, the strip line 7011 may be a single signal line (single line), and may be designed to match 50 Ohm (Ω) impedance.

In Equation 1, R, L, and G factors are properties related to the material of the first insulating layer 801 and the second insulating layer 802, and may be dependently determined by, for example, the dissipation factor (Df) and dielectric constant (Dk) of the first insulating layer 801 and the second insulating layer 802.

For 50 Ohm impedance matching, the flexible circuit board 700 according to the comparative example may be designed under conditions shown in Table 1. Referring to Table 1, the first insulating layer 801 and the second insulating layer 802 may be formed of a dielectric having, as LowDk/LowDf, a dielectric constant (Dk) of about 3.5 and a dissipation factor (Df) of 0.005 or less. The first insulating layer 801 and the second insulating layer 802 may be designed to have a designated thickness, for example, a thickness of about 40 to 60 um, for 50 Ohm impedance matching. For example, the first insulating layer 801 and the second insulating layer 802 may be designed to have a thickness of 50 um.

TABLE 1

| | |
|---|---|
| Dk&Df | about 3.5 & 0.005 or less |
| Thickness (or height) of each of first and second insulating layers | about 50 um |
| Thickness (or height) of strip line 7011 | about 15 um |

In Equation 1, C, the remaining factor, is an area where the strip line 7011 and the ground overlap, and may be determined dependently by the width of the strip line 7011. Therefore, when the conditions of Table 1 are applied to Equation 1, the width of the strip line 7011 for 50 Ohm impedance matching may be designed to be about 35 um to 55 um. For example, the width of the strip line 7011 may be designed to be about 45 um.

Herein, the specification of a dielectric having, as LowDk/LowDf, a dielectric constant (Dk) of about 3.5 and a dissipation factor (Df) of 0.005 or less may be a control variable. For example, the numerical example may be a control variable for comparing the width of the strip line 411 of the flexible circuit board 410 according to an embodiment, which will be described later, with the width of the strip line 7011 of the flexible circuit board 700 according to the comparative example.

An electronic device (e.g., 400 in FIG. 4) according to various embodiments may include a wireless communication module (e.g., 192 in FIG. 1), a first printed circuit board 310 including a first antenna array (e.g., AR1 in FIG. 4) electrically connected to the wireless communication module 192 and a first conductive pattern 542 electrically connected to the wireless communication module 192, and a flexible circuit board (e.g., 410 in FIG. 4) which includes a second antenna array (e.g., AR2 in FIG. 4) electrically connected to the first conductive pattern 542 and extends to a part spaced apart from the first printed circuit board 310 (e.g., 410 in FIG. 4), where the flexible circuit board 410 includes a first conductive layer (e.g., 901 in FIG. 10), which includes a strip line (e.g., 411 in FIG. 10) electrically connected to the second antenna array AR2 and an intermediate insulating material (e.g., 9011 in FIG. 10) formed at both sides of the strip line 411, a second conductive layer (e.g., 902 in FIG. 10) which is disposed in a first direction of the first conductive layer 901 and includes a first ground pattern (e.g., 9021 in FIG. 10) overlapping a part of the strip line 411 and an upper insulating material (e.g., 9022 in FIG. 10) disposed at both sides of the first ground pattern 9021, a first insulating layer (e.g., 1001 in FIG. 10) disposed between the first conductive layer 901 and the second conductive layer 902, a third conductive layer (e.g., 903 in FIG. 10) which is disposed in a second direction opposite to the first direction of the first conductive layer 901 and includes a second ground pattern (e.g., 9031 in FIG. 10) overlapping the strip line 411 and a lower insulating material 9032 formed at both sides of the second ground pattern 9031, and a second insulating layer (e.g., 1002 in FIG. 10) disposed between the first conductive layer 901 and the third conductive layer 903. The flexible circuit board 410 may further include multiple ground vias formed at both sides of the strip line 411 and penetrating the first insulating layer 1001 and the second insulating layer 1002. The first conductive layer 901 may include an intermediate ground formed outside the intermediate insulating material 9011, the second conductive layer 902 may include an upper ground formed outside the upper insulating material 9022, and the third conductive layer 903 may include a lower ground formed outside the lower insulating material 9032. A first boundary between the intermediate ground and the intermediate insulating material 9011, a second boundary between the upper ground and the upper insulating material 9022, and a third boundary between the lower ground and the lower insulating material 9032 may be arranged in a straight line when viewed in a cross-section of the flexible circuit board 410. The first conductive layer 901 may include an intermediate ground formed outside the intermediate insulating material 9011, the second conductive layer 902 may include an upper ground formed outside the upper insulating material 9022, and the third conductive layer 903 may include a lower ground formed outside the lower insulating material 9032. A first boundary between the intermediate ground and the intermediate insulating material 9011, a second boundary between the upper ground and the upper insulating material 9022, and a third boundary between the lower ground and the lower insulating material 9032 may not be arranged in a straight line when viewed in a cross-section of the flexible circuit board 410, and the second boundary and the third boundary may be formed to extend toward the strip line 411 compared with the first boundary. The width of the strip line 411 may be greater than the width of the first ground pattern 9021 or the width of the second ground pattern 9031. The flexible circuit board 410 may further include multiple upper ground bridges formed on the second conductive layer 902 in the extension direction of the strip line 411 and crossing the strip line 411, and multiple lower ground bridges are formed on the third conductive layer 903 in the extension direction of the strip line 411 and crossing the strip line 411. The electronic device 400 may further include a housing which includes a front cover facing a second direction in the electronic device 400, a rear cover facing a first direction in the electronic device 400, and a side member surrounding the space between the front cover and the rear cover, and the flexible circuit board 410 may extend from a part connected to the first printed circuit board 310 to a region adjacent to a part of the side member. The second antenna array AR2 may be electrically connected to the strip line 411 and may form a beam pattern in the region adjacent to a part of the side member. The first antenna array AR1 may be a patch antenna array, and the second antenna array AR2 may be a dipole antenna array. The strip line 411 may be a line for transmitting a signal in a high-frequency band of 10 GHz to 100 GHz.

A flexible circuit board (e.g., 410 in FIG. 4) for transmitting a signal of a high-frequency band of 10 GHz to 100 GHz, according to various embodiments, may include a first conductive layer (e.g., 901 in FIG. 10) including a strip line (e.g., 411 in FIG. 10), which transmits the signal of the high-frequency band and has a first width, and an intermediate insulating material (e.g., 9011 in FIG. 10) formed at both sides of the strip line 411, a second conductive layer (e.g., 902 in FIG. 10) which is disposed in a first direction of the first conductive layer and includes a first ground pattern (e.g., 9021 in FIG. 10), overlapping a part of the strip line 411 and having a second width smaller than the first width, and an upper insulating material (e.g., 9022 in FIG. 10) formed at both sides of the first ground pattern, a first insulating layer (e.g., 1001 in FIG. 10) formed between the first conductive layer and the second conductive layer, a third conductive layer (e.g., 903 in FIG. 10) which is disposed in a second direction opposite to the first direction of the first conductive layer and includes a second ground pattern (e.g., 9031 in FIG. 10), overlapping a part of the strip line 411 and having a third width smaller than the first width, and a lower insulating material (e.g., 9032 in FIG. 10) formed at both sides of the second ground pattern, and a second insulating layer (e.g., 1002 in FIG. 10) disposed between the first conductive layer and the third conductive layer. The flexible circuit board may further include multiple ground bridges (e.g., 911 and 912 in FIG. 9) formed on the second conductive layer or the third conductive layer in the extension direction of the strip line 411 and crossing the strip line 411.

Figure 9:
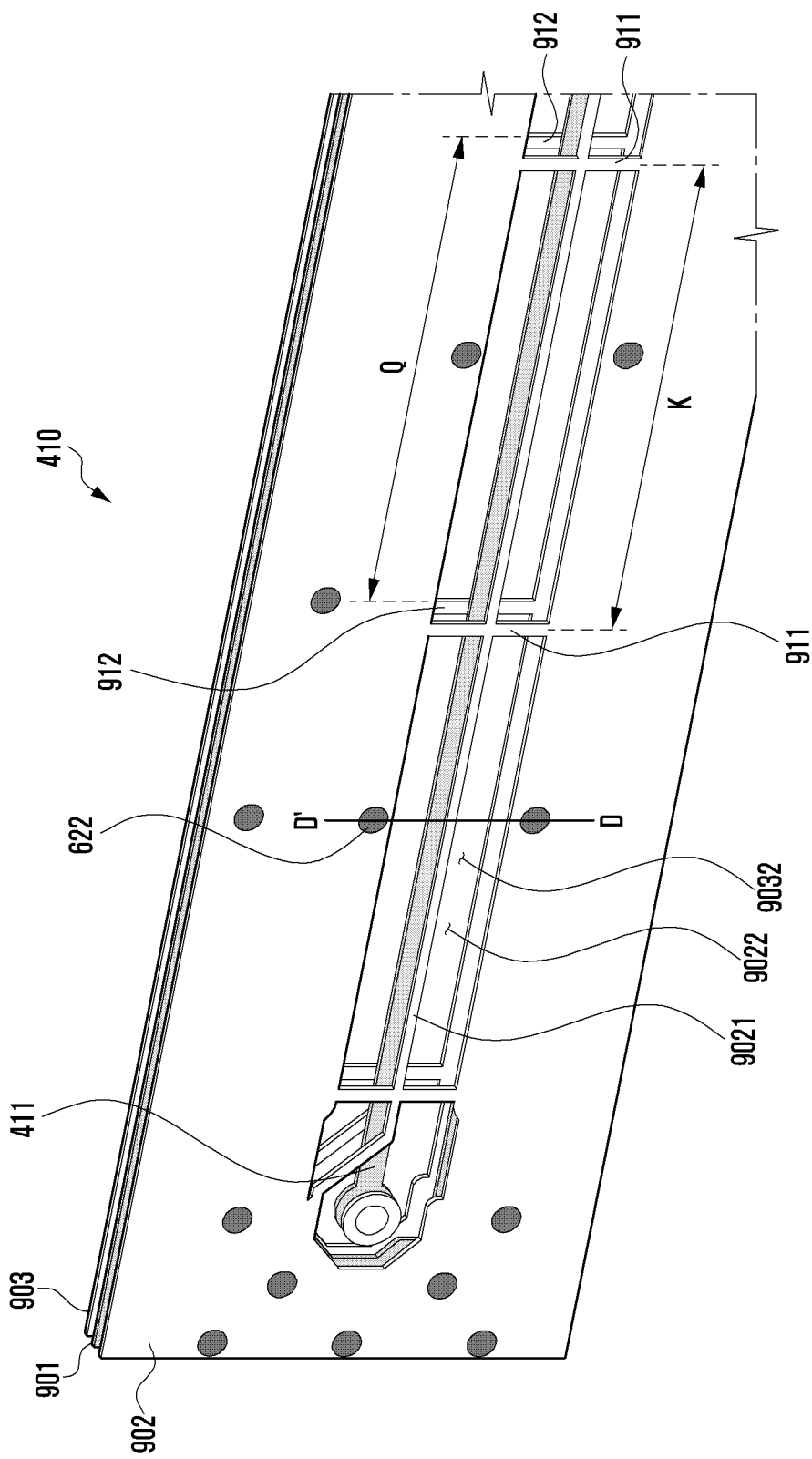
FIG. 9 is a perspective view showing a flexible circuit board according to an embodiment.
Figure 10:
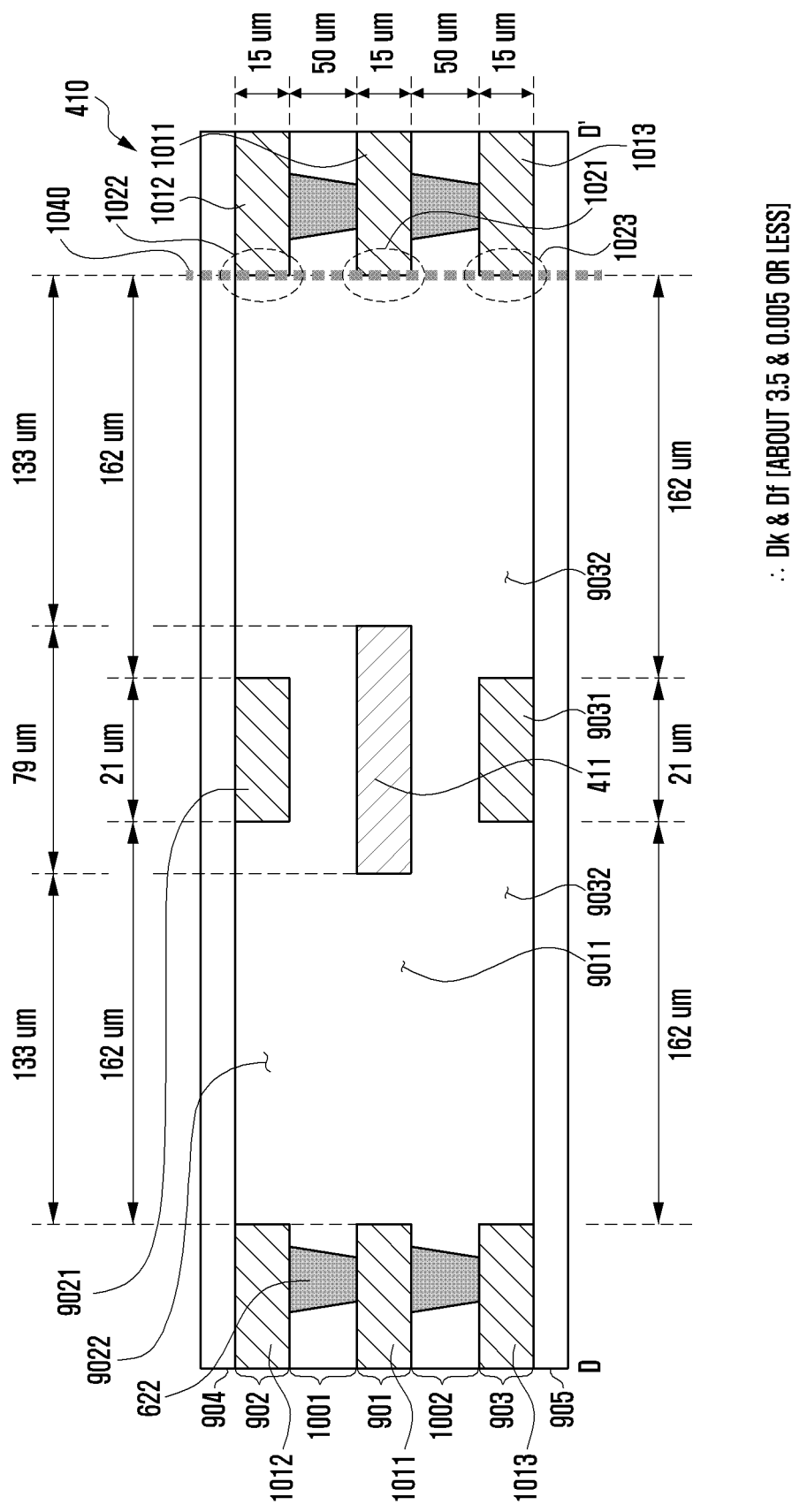
FIG. 10 shows a cross-section of the flexible circuit board according to an embodiment illustrated in FIG. 9.

FIG. 9 is a perspective view showing a flexible circuit board 410 according to an embodiment. FIG. 10 shows a cross-section of the flexible circuit board 410 according to an embodiment illustrated in FIG. 9. FIG. 10 illustrates a cross-section of the flexible circuit board 410, taken along line D-D' illustrated in FIG. 9.

The flexible circuit board 410 illustrated in FIGS. 9 and 10 may be identical or at least partially similar to the flexible circuit board 410 illustrated in FIG. 4, or may include another embodiment.

Referring to FIGS. 9 and 10, the flexible circuit board 410 according to an embodiment may include a first conductive layer 901, a second conductive layer 902 disposed above the first conductive layer 901, and a third conductive layer 903 below the first conductive layer 901. A first coverlay 904 formed of an insulating material may be disposed at the uppermost layer of the flexible circuit board 410, for example, on the second conductive layer 902 (e.g., in a first direction). A second coverlay 905 formed of an insulating material may be disposed at the lowermost layer of the flexible circuit board 410, for example, beneath the third conductive layer 903 (e.g., in the second direction).

According to an embodiment, the first conductive layer 901 may include a strip line 411, an intermediate insulating material 9011, or an intermediate ground 1011. The intermediate insulating material 9011 may be formed outside (or at both sides of) the strip line 411. The intermediate ground 1011 may be formed in common outside the intermediate insulating material 9011. The strip line 411 may be a transmission line for transmitting a signal of a high-frequency band (e.g., 10 GHz to 100 GHz) for communication with a 5G network (e.g., the second network 294 in FIG. 2).

According to an embodiment, the second conductive layer 902 may be disposed above the first conductive layer 901 (e.g., in the first direction). The second conductive layer 902 may include a first ground pattern 9021, an upper insulating material 9022, or an upper ground 1012. The first ground pattern 9021 may be formed to overlap all or at least a part of the strip line 411. The upper ground 1012 may be formed in common outside the upper insulating material 9022. The upper insulating material 9022 may be formed outside (or at both sides of) the first ground pattern 9021. In an embodiment, the upper insulating material 9022 may be formed in a rectangular shape.

According to an embodiment, the second conductive layer 902 may include multiple upper ground bridges 911 formed at regular intervals in a direction in which the strip line 411 extends. The multiple upper ground bridges 911 may be arranged at regular intervals in the direction in which the strip line 411 extends, and may be formed to cross the strip line 411. The multiple upper ground bridges 911 may prevent signal loss due to parasitic resonance that may occur in proportion to the length of the strip line 411. The intervals (e.g., intervals K in FIG. 9) at which the multiple upper ground bridges 911 are formed may be designed in consideration of a frequency band of a signal transmitted through the strip line 411. In an embodiment, when the center frequency of the strip line 411 is about 40 GHz, the multiple upper ground bridges 911 may be arranged at intervals of about 1.0 to 1.5 mm (e.g., intervals K in FIG. 9). For example, when the center frequency of the strip line 411 is about 40 GHz, intervals K may be intervals of 1.2 mm or less. In another embodiment, when the center frequency of the strip line 411 is about 20 GHz, the multiple upper ground bridges 911 may be arranged at intervals of about 2.0 to 3.0 mm (e.g., intervals K in FIG. 9). For example, when the center frequency of the strip line 411 is about 20 GHz, intervals K may be intervals of about 2.4 mm or less. In another embodiment, when the center frequency of the strip line 411 is about 10 GHz, the multiple upper ground bridges 911 may be arranged at intervals of about 4.0 to 6.0 mm (e.g., intervals K in FIG. 9). For example, when the center frequency of the strip line 411 is about 10 GHz, intervals K may be intervals of about 4.8 mm or less.

According to an embodiment, the third conductive layer 903 may be disposed below the first conductive layer 901 (e.g., in the second direction). The third conductive layer 903 may include a second ground pattern 9031, a lower insulating material 9032, or a lower ground 1013. The second ground pattern 9031 may be disposed to overlap all or at least a part of the strip line 411. The lower insulating material 9032 may be formed outside (or at both sides of) the second ground pattern 9031. In an embodiment, the lower insulating material 9032 may be formed in a rectangular shape. The lower ground 1013 may be formed in common outside the lower insulating material 9032.

According to an embodiment, the third conductive layer 903 may include multiple lower ground bridges 912 formed at regular intervals in a direction in which the strip line 411 extends. The multiple lower ground bridges 912 may be arranged at regular intervals in the direction in which the strip line 411 extends, and may be formed to cross the strip line 411. The multiple lower ground bridges 912 may prevent signal loss due to parasitic resonance that may occur in proportion to the length of the strip line 411. The intervals (e.g., intervals Q in FIG. 9) at which the multiple lower ground bridges 912 are formed may be designed in consideration of the frequency band of a signal transmitted through the strip line 411. In an embodiment, when the center frequency of the strip line 411 is about 40 GHz, the multiple lower ground bridges 912 may be arranged at intervals of about 1.0 to 1.5 mm (e.g., intervals Q in FIG. 9). For example, when the center frequency of the strip line 411 is about 40 GHz, intervals Q may be intervals of about 1.2 mm or less. In another embodiment, when the center frequency of the strip line 411 is about 20 GHz, the multiple lower ground bridges 912 may be arranged at intervals of about 2.0 to 3.0 mm (e.g., intervals Q in FIG. 9). For example, when the center frequency of the strip line 411 is about 20 GHz, intervals Q may be intervals of about 2.4 mm or less. In another embodiment, when the center frequency of the strip line 411 is about 10 GHz, the multiple lower ground bridges 912 may be arranged at intervals of about 4.0 to 6.0 mm (e.g., intervals Q in FIG. 9). For example, when the center frequency of the strip line 411 is about 10 GHz, intervals Q may be intervals f about 4.8 mm or less.

According to an embodiment, the intervals (e.g., intervals Q in FIG. 9) at which the multiple lower ground bridges 912 are formed may be equal to the intervals (e.g., intervals K in FIG. 9) at which the multiple upper ground bridges 911 are formed. In this case, the lower ground bridges 912 and the upper ground bridges 911 may be arranged to overlap or not to overlap.

According to another embodiment, the intervals (e.g., intervals Q in FIG. 9) at which the multiple lower ground bridges 912 are formed may be different from the intervals (e.g., intervals K in FIG. 9) at which the multiple upper ground bridges 911 are formed.

According to an embodiment, a first insulating layer 1001 may be disposed between the first conductive layer 901 and the second conductive layer 902. A second insulating layer 1002 may be disposed between the first conductive layer 901 and the third conductive layer 903. According to an embodiment, the first insulating layer 1001 and the second insulating layer 1002 may be dielectrics made of the same material. For example, the first insulating layer 1001 and the second insulating layer 1002 may be any one of FR1, FR2, FR3, FR4, FR5, CEM1, and CEM2 that are made of phenolic resin or epoxy resin. Alternatively, the first insulating layer 1001 and the second insulating layer 1002 may be made of a Teflon material. According to various embodiments, the material of the first insulating layer 1001 and the second insulating layer 1002 may be variously changed in addition to the above-mentioned materials.

According to an embodiment, the intermediate insulating material 9011 of the first conductive layer 901, the upper insulating material 9022 of the second conductive layer 902, or the lower insulating material 9032 of the third conductive layer 903 may have at least part formed of a dielectric that is made of a material identical to those of the first insulating layer 1001 and the second insulating layer 1002. According to another embodiment, the intermediate insulating material 9011 of the first conductive layer 901, the upper insulating material 9022 of the second conductive layer 902, or the lower insulating material 9032 of the third conductive layer 903 may have at least a part which is an air layer.

According to an embodiment, the boundary between the intermediate ground 1011 and the intermediate insulating material 9011 may be defined as a first boundary 1021. In addition, the boundary between the upper ground 1012 and the upper insulating material 9022 may be defined as a second boundary 1022. Furthermore, the boundary between the lower ground 1013 and the lower insulating material 9032 may be defined as a third boundary 1023. According to an embodiment, the first boundary 1021, the second boundary 1022, and the third boundary 1023 may be arranged in a straight line 1040 when viewed in a cross-section of the flexible circuit board 410.

According to an embodiment, multiple ground vias 622 may be disposed at intervals at both sides of the strip line 411. The multiple ground vias 622 may penetrate the first insulating layer 1001 and the second insulating layer 1002. For example, one ground via 622 may be formed through the first insulating layer 1001 and the second insulating layer 1002 so as to electrically connect the intermediate ground 1011 of the first conductive layer 901, the upper ground 1012 of the second conductive layer 902, and the lower ground 1013 of the third conductive layer 903.

According to another embodiment, the multiple ground vias 622 may penetrate the second conductive layer 902, the first insulating layer 1001, the first conductive layer 901, the second insulating layer 1002, and the third conductive layer 903.

According to an embodiment, the multiple ground vias 622 may be disposed in a direction in which the strip line 411 extends, and may electrically connect the intermediate ground 1011 of the first conductive layer 901, the upper ground 1012 of the second conductive layer 902, and the lower ground 1013 of the third conductive layer 903, thereby reducing the effect of electromagnetic noise outside the flexible circuit board 410 on multiple strip lines 411 and/or the interference generated between the multiple strip lines 411.

According to various embodiments, the intervals and/or positions of the multiple ground vias 622 are not limited to the example illustrated in FIG. 10, and may be formed in various ways. According to an embodiment, the intervals, sizes, and/or, shapes the multiple ground vias 622 may be identical or partially different. For example, the intervals, sizes, and/or shapes of the multiple ground vias 622 may be different depending on the frequency band (e.g., high or low frequency) of a signal transmitted through the multiple strip lines 411 and/or the type of the signal (e.g., a communication signal, power, a clock, or data). In an embodiment, the multiple ground vias 622 may be formed as conductive wirings for blocking noise generated between the multiple strip lines 411.

In the flexible circuit board 410 according to an embodiment, a ground pattern (e.g., the first ground pattern 9021 or the second ground pattern 9031) overlapping a part of the strip line 411 is formed in the second conductive layer 902 and the third conductive layer 903, and an insulating material (e.g., the upper insulating material 9022 or the lower insulating material 9032) may be formed outside (or around) the ground pattern. According to an embodiment, the width of the ground pattern (e.g., the first ground pattern 9021 or the second ground pattern 9031) may be smaller than the width of the strip line 411. In the flexible circuit board 410 according to an embodiment, the capacitance between the strip line 411 and the ground may be reduced by making the width of the ground pattern (e.g., the first ground pattern 9021 or the second ground pattern 9031) smaller than the width of the strip line 411, and in response to the reduced capacitance, the width of the strip line 411 may be designed to be wide. In the flexible circuit board 410 according to an embodiment, the width of the strip line 411 may be designed to be wide, and thus signal transmission loss may be reduced.

The width of the strip line 411 may be designed to be wider on the assumption that the material of the flexible circuit board 410 according to an embodiment is identical to the material of the flexible circuit board 410 in the comparative example shown in FIGS. 7 and 8. For example, referring to FIG. 10, when the flexible circuit board 410 according to an embodiment has the specification of Table 1, the width of the strip line 411 for 50 Ohm impedance matching may be designed to be about 79 um, and the width of the ground pattern (e.g., the first ground pattern 9021 or the second ground pattern 9031) may be designed to be 21 um. It may be known that the width of the strip line 411 according to the embodiment has a value greater than about 45 μm, which is the width of the strip line (e.g., the strip line 7011 in FIG. 8) in the comparative example (e.g., FIG. 8). In the flexible circuit board 410 according to an embodiment, signal transmission loss may be reduced by the increase in the width of the strip line 411.

Figure 11:
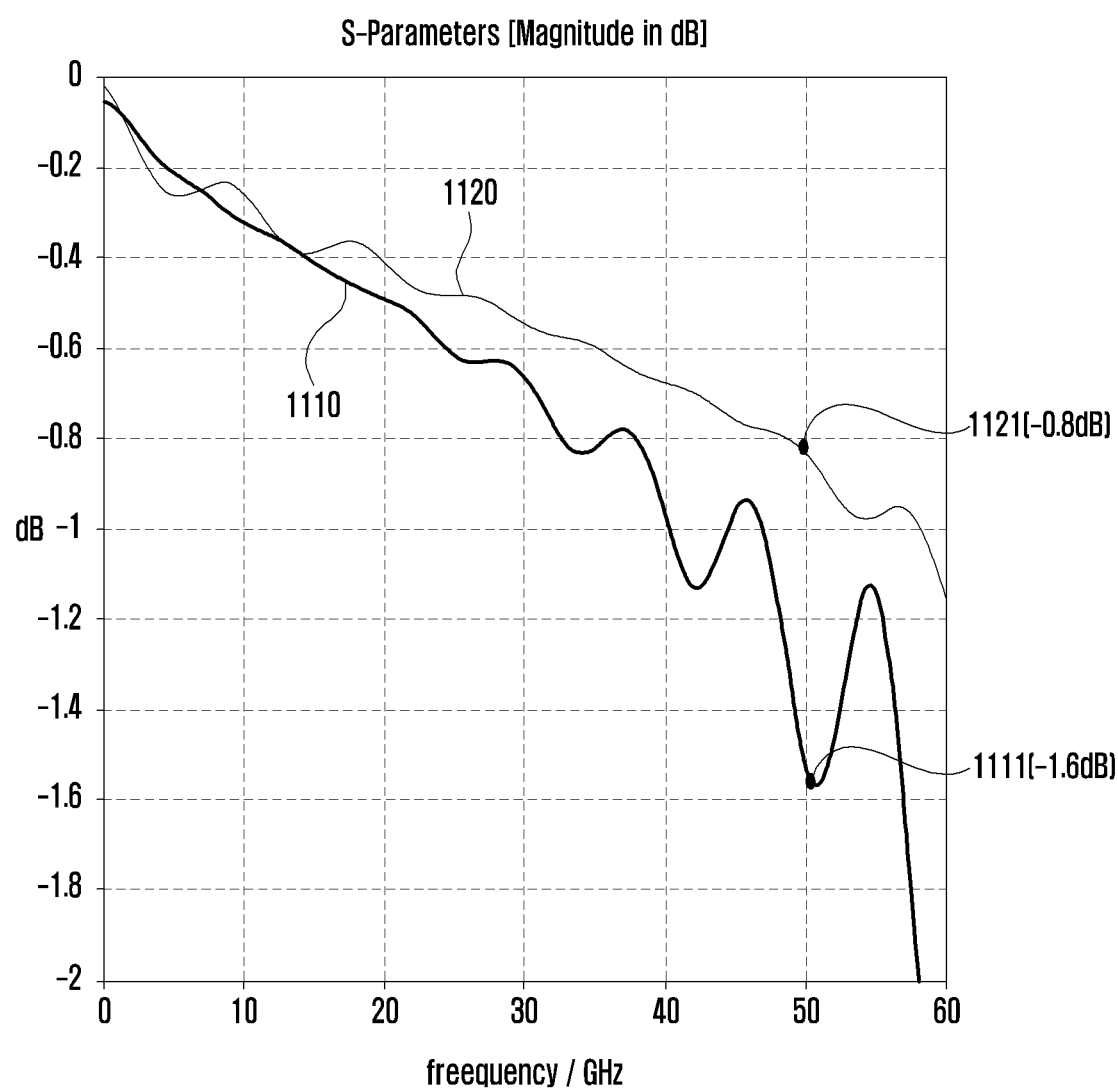
FIG. 11 is a graph comparing a loss value in a strip line of a flexible circuit board according to a comparative example with a loss value in a strip line of a flexible circuit board according to an embodiment.

FIG. 11 is a graph comparing a loss value in the strip line 7011 of the flexible circuit board 700 according to the comparative example illustrated in FIGS. 7 and 8 with a loss value in the strip line 411 of the flexible circuit board 410 according to an embodiment illustrated in FIGS. 9 and 10. A first loss measurement graph 1110 in FIG. 11 may be a loss measurement graph for the strip line 7011 in the comparative example. A second loss measurement graph 1120 in FIG. 11 may be a loss measurement graph for the strip line 411 according to an embodiment.

The experimental result in FIG. 11 may be based on the premise that the material of the insulating layers (e.g., 801 and 802 in FIG. 8) of the flexible circuit board 700 according to the comparative example is identical to the material of the insulating layers (e.g., 1001 and 1002 in FIG. 10) of the flexible circuit board 410 according to an embodiment. For example, the experimental graphs in FIG. 11 may be graphs obtained by performing measurement on the premise that the insulating layers in the comparative example and the insulating layers according to an embodiment (e.g., 801 and 802 in FIG. 8, and 1001 and 1002 in FIG. 10) have the same specification of Dk & Df (about 3.5 & 0.005 or less).

Referring to the first loss measurement graph 1110 in FIG. 11, it may be found that in the comparative example corresponding to FIG. 8, a first loss value 1111 of the strip line 7011 at about 50 GHz is about −1.6 dB.

Referring to the second loss measurement graph 1120 in FIG. 11, it may be found that in an embodiment corresponding to FIG. 10, a second loss value 1121 of the strip line 411 at about 50 GHz is about −0.8 dB and that the loss value is reduced compared to the comparative example.

Figure 12:
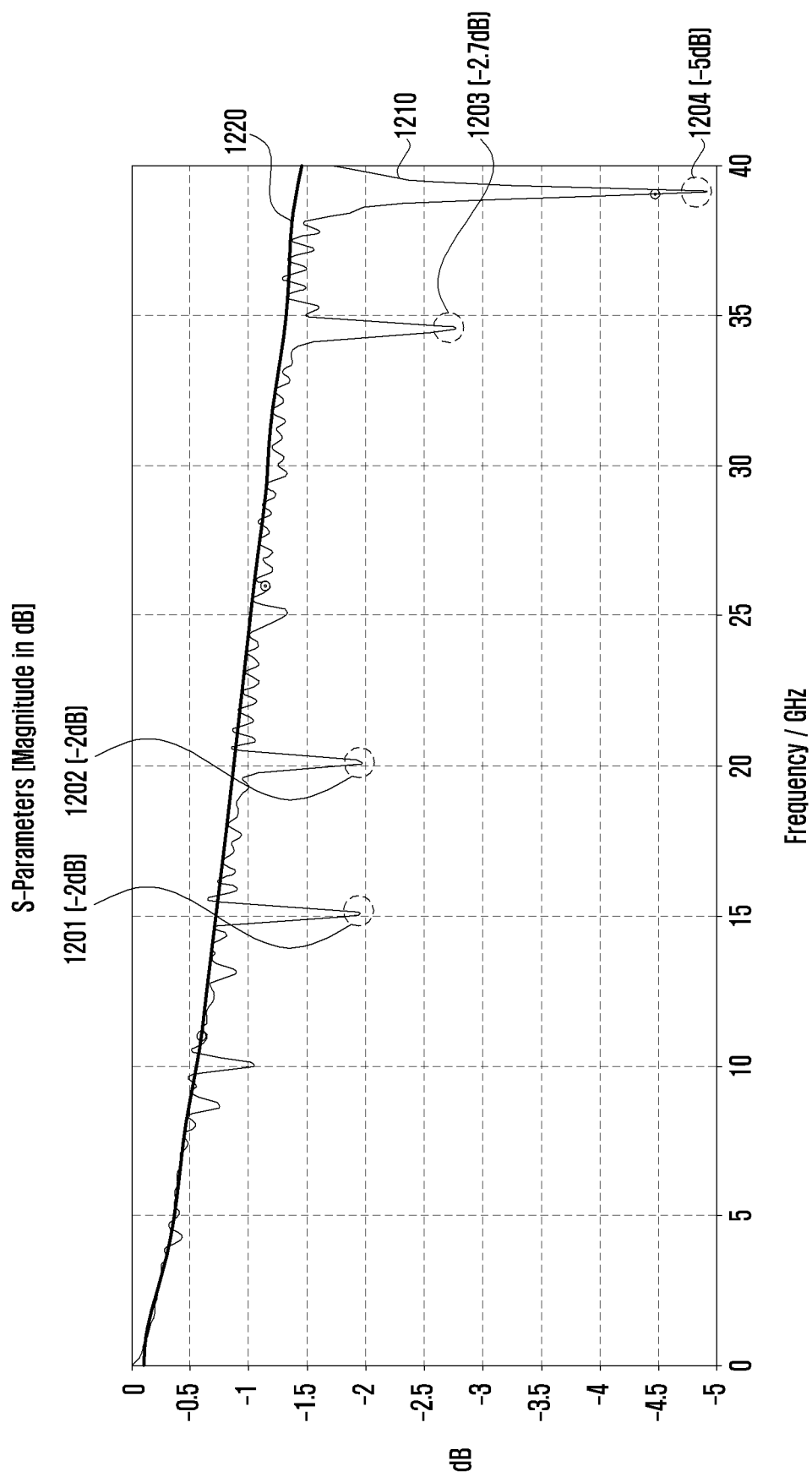
FIG. 12 illustrates the comparison of loss values in a signal line of a flexible circuit board according to the presence or absence of a ground bridge.

FIG. 12 illustrates the comparison of loss values in a signal line of the flexible circuit board 410 according to the presence or absence of a ground bridge. A first loss measurement graph 1220 in FIG. 12 may be a graph obtained by measuring a loss value in a signal line of the flexible circuit board 410 according to an embodiment illustrated in FIGS. 9 and 10. In FIG. 12, second loss measurement data 1210 may be a graph obtained by measuring a loss value in a signal line of the flexible circuit board from which the ground bridge has been removed.

Referring to the first loss measurement data 1220 in FIG. 12, it may be found that in an embodiment corresponding to FIG. 9, the loss value in the strip line 411 linearly decreases as the frequency increases. For example, it may be found that the loss value in the signal line of the flexible circuit board 410 according to an embodiment illustrated in FIGS. 9 and 10 is −1.4141 dB at about 39 GHz.

When the ground bridges (e.g., 911 and 912 in FIG. 9) are removed from the flexible circuit board 410 according to an embodiment illustrated in FIGS. 9 and 10, parasitic resonance may occur in proportion to the length of the strip line 411. Accordingly, as shown in the second loss measurement data 1210 in FIG. 12, it may be found that when the ground bridges (e.g., 911 and 912 of FIG. 9) are deleted, the loss value in the strip line 411 non-linearly decreases. For example, referring to a first loss value 1201 in FIG. 12, it may be found that parasitic resonance occurs at about 15 GHz, resulting in a loss of about −2 dB. Alternatively, referring to a second loss value 1202 in FIG. 12, it may be found that parasitic resonance occurs at about 20 GHz, resulting in a loss of about −2 dB. Alternatively, referring to a third loss value 1203 in FIG. 12, it may be found that parasitic resonance occurs at about 34 GHz, resulting in a loss of about −2.7 dB. Alternatively, referring to a fourth loss value 1204 in FIG. 12, it may be found that parasitic resonance occurs at about 39 GHz, resulting in a loss of about −5 dB.

In the flexible circuit board 410 according to various embodiments, loss due to parasitic resonance may be prevented by forming multiple ground bridges (e.g., 911 and 912 in FIG. 9) that are arranged at regular intervals in the extension direction of the strip line 411 and are formed to cross the strip line 411.

According to various embodiments, the shape of the multiple ground bridges (e.g., 911 and 912 in FIG. 9) is not limited to the shape illustrated in FIG. 9, and may be variously modified or changed. For example, the shape of the multiple ground bridges may be modified like multiple ground bridges (e.g., 911 and 912 in FIG. 21) illustrated in FIG. 21. In another example, the shape of the multiple ground bridges may be modified like a ground bridge (e.g., 1531 in FIG. 22) illustrated in FIG. 22

Figure 13:
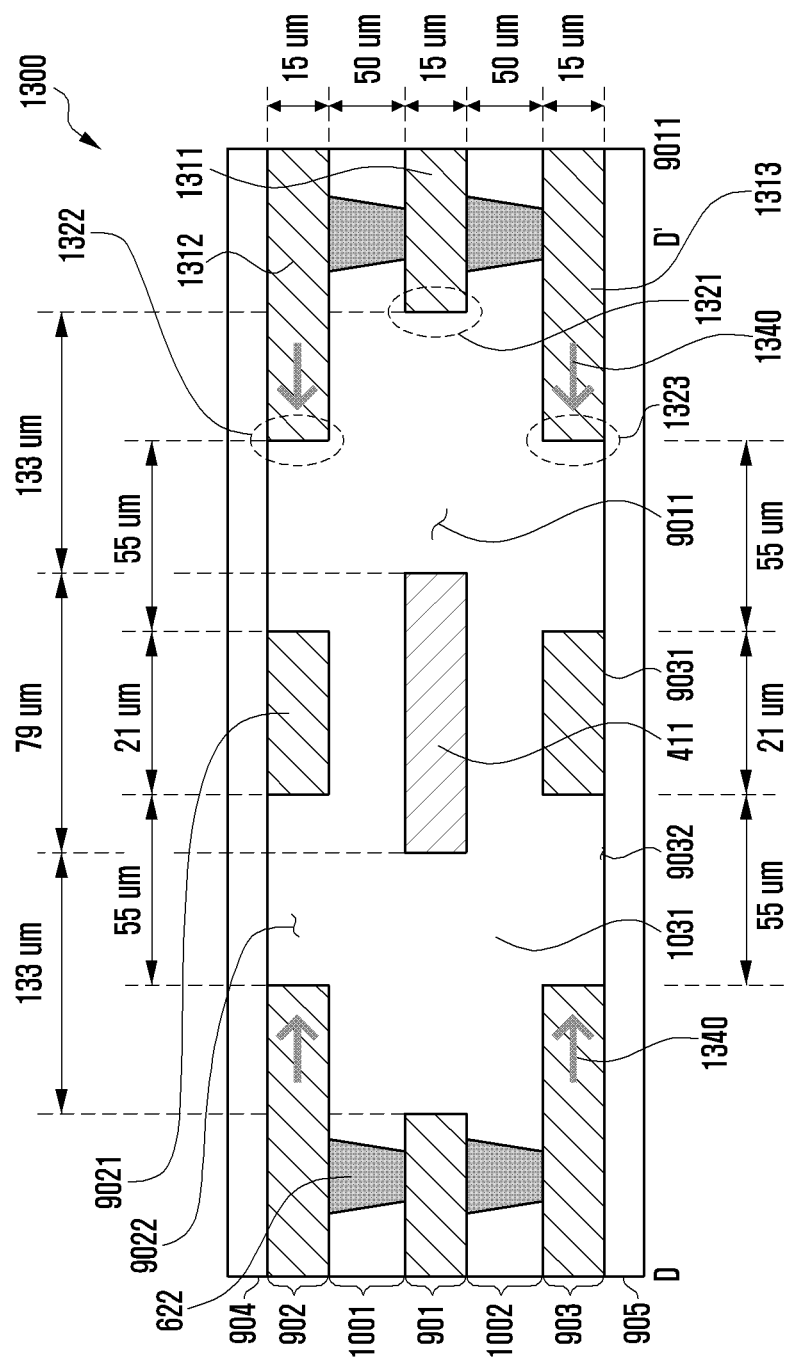
FIG. 13 shows a cross-section of a flexible circuit board according to another embodiment.

FIG. 13 shows a cross-section of a flexible circuit board 1300 according to another embodiment. The flexible circuit board 1300 illustrated in FIG. 13 may be identical or at least similar to the flexible circuit board 410 illustrated in FIG. 10, or may further include another embodiment. Hereinafter, in the description related to FIG. 13, only elements different from those in FIG. 10 will be described.

Referring to FIG. 13, in the flexible circuit board 1300 according to another embodiment, the boundary between an intermediate ground 1311 and the intermediate insulating material 9011 may be defined as a first boundary 1321. In addition, the boundary between an upper ground 1312 and the upper insulating material 9022 may be defined as a second boundary 1322. Furthermore, the boundary between a lower ground 1313 and the lower insulating material 9032 may be defined as a third boundary 1323. In the flexible circuit board 1300 according to another embodiment, the first boundary 1321, the second boundary 1322, and the third boundary 1323 may not be arranged in a straight line when viewed in a cross-section of the flexible circuit board 1300, and the second and third boundaries 1322 and 1323 may be formed to extend toward the strip line 411 when compared with the first boundary 1321.

The width of the strip line 411 may be designed to be wider on the premise that the material of the flexible circuit board 1300 according to another embodiment is identical to the material of the flexible circuit board 410 of the comparative example illustrated in FIGS. 7 and 8. For example, referring to FIG. 13, when the flexible circuit board 410 according to an embodiment has the specification of Table 1, the width of the strip line 411 for 50 Ohm impedance matching may be designed to be about 79 um, and the width of a ground pattern (e.g., the first ground pattern 9021 or the second ground pattern 9031) may be designed to be about 21 urn. It may be found that the width of the strip line 411 has a value greater than about 45 um, which is the numerical value of the comparative example (e.g., FIG. 8). In the flexible circuit board 1300 according to another embodiment, signal transmission loss may be reduced by the increase in the width of the strip line 411. In the flexible circuit board 410 according to an embodiment, the capacitance between the strip line 411 and the ground may be reduced by making the width of the ground pattern (e.g., the first ground pattern 9021 or the second ground pattern 9031) smaller than the width of the strip line 411, and in response to the reduced capacitance, the width of the strip line 411 may be designed to be wide. In the flexible circuit board 410 according to an embodiment, the width of the strip line 411 may be designed to be wide, and thus signal transmission loss may be reduced.

In the flexible circuit board 1300 according to another embodiment, the second and third boundaries 1322 and 1323 may extend toward the strip line 411, and thus, compared with an embodiment illustrated in FIG. 10, the area of the ground adjacent to the strip line 411 may be increased, and a return pass through which a return signal returns may be smoothly formed, thereby further reducing signal loss.

Figure 14:
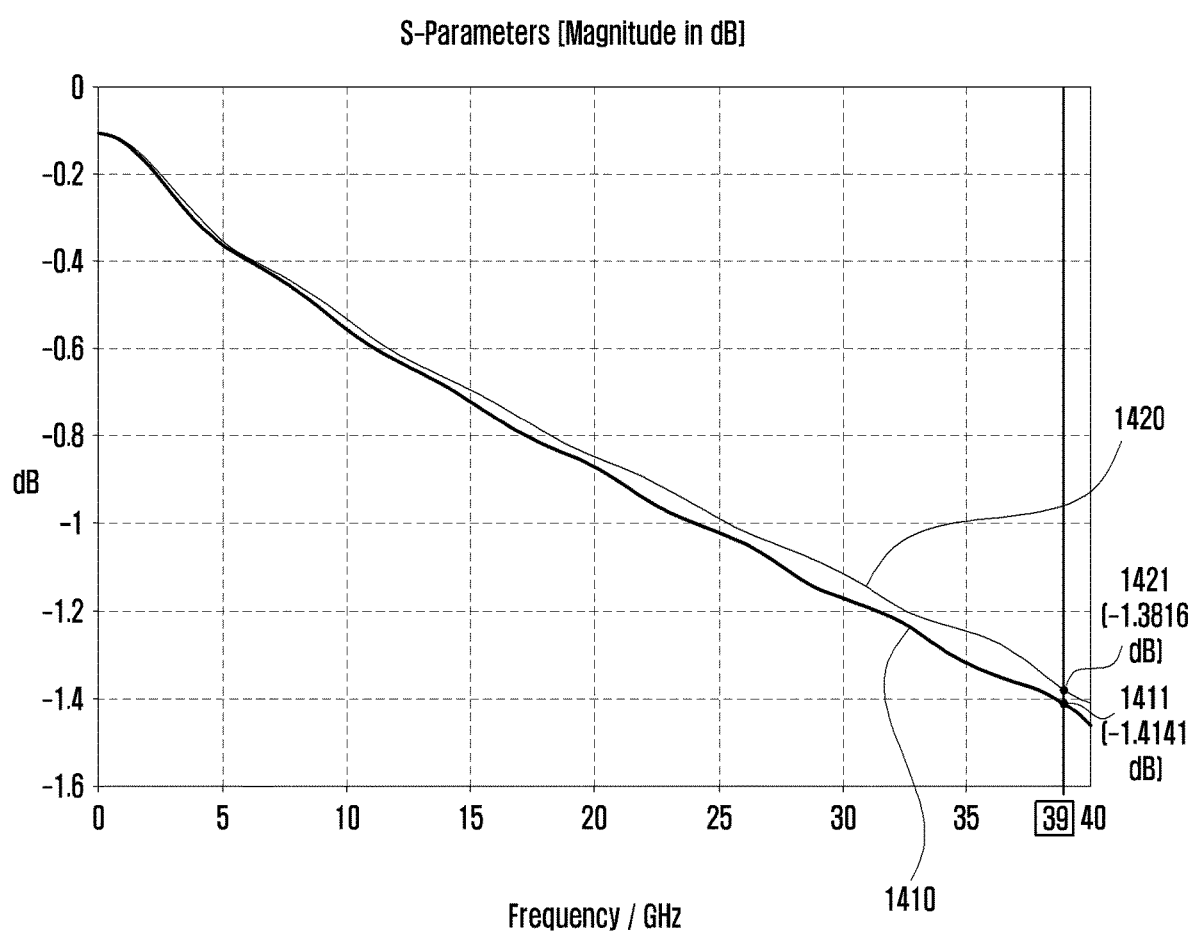
FIG. 14 is a graph comparing a loss value in a signal line of a flexible circuit board according to an embodiment with a loss value in a signal line of a flexible circuit board according to another embodiment.

FIG. 14 is a graph comparing a loss value in a signal line of the flexible circuit board 410 according to an embodiment illustrated in FIGS. 9 and 10 with a loss value in a signal line of the flexible circuit board 1300 according to another embodiment illustrated in FIG. 13.

The experimental graphs in FIG. 14 may be graphs obtained by performing measurement on the premise that the insulating layers 1001 and 1002 of the flexible circuit boards 410 and 1300 illustrated in FIGS. 10 and 13, which are comparative targets, have the same specification of Dk & Df (about 3.5 & 0.005 or less).

Referring to a first loss graph 1410 in FIG. 14, it may be found that in an embodiment corresponding to FIG. 10, a first loss value 1411 of the strip line 411 at about 39 GHz is −1.4141 dB.

Referring to a second loss graph 1420 of FIG. 14, it may be found that in another embodiment corresponding to FIG. 13, a second loss value 1421 of the strip line 411 at about 39 GHz is −1.3816 dB and that the loss value has been reduced compared with the embodiment corresponding to FIG. 10.

An electronic device (e.g., 400 in FIG. 4) according to various embodiments may include a wireless communication module (e.g., 192 in FIG. 1), a first printed circuit board 310 which includes a first antenna array (e.g., AR1 in FIG. 4) electrically connected to the wireless communication module 192 and a first conductive pattern electrically connected to the wireless communication module 192, and a flexible circuit board (e.g., 1500 in FIG. 16) which includes a second antenna array AR2 electrically connected to the first conductive pattern and extends to a part spaced apart from the first printed circuit board 310. The flexible circuit board 1500 may include a first conductive layer (e.g., 1501 in FIG. 16), which includes a microstrip line (e.g., 1611 in FIG. 16) electrically connected to the second antenna array AR2 and an intermediate insulating material (e.g., 15011 in FIG. 16) formed at both sides of the microstrip line 1611, a first insulating layer (e.g., 1601 in FIG. 16) disposed in a first direction of the first conductive layer 1501, a second conductive layer (e.g., 1502 in FIG. 16) which is disposed in a second direction opposite to the first direction of the first conductive layer 1501 and includes a second ground pattern (e.g., 15021 in FIG. 16) overlapping the microstrip line 1611 and a lower insulating material (e.g., 15022 in FIG. 16) formed at both sides of the second ground pattern 15021, and a second insulating layer (e.g., 1602 in FIG. 16) disposed between the first conductive layer 1501 and the second conductive layer 1502. The flexible circuit board 1500 may further include multiple ground vias formed at both sides of the microstrip line 1611 and penetrating the second insulating layer 1602. The first conductive layer 1501 may include an intermediate ground formed outside the intermediate insulating material 15011, the second conductive layer 1502 may include a lower ground formed outside the lower insulating material 15022, and a first boundary between the intermediate ground and the intermediate insulating material 15011 and a second boundary between the lower ground and the lower insulating material 15022 may be arranged in a straight line when viewed in a cross-section of the flexible circuit board 1500. The first conductive layer 1501 may include an intermediate ground formed outside the intermediate insulating material 15011, the second conductive layer 1502 may include a lower ground formed outside the lower insulating material 15022, a first boundary between the intermediate ground and the intermediate insulating material 15011 and a second boundary between the lower ground and the lower insulating material 15022 may not be arranged in a straight line when viewed in a cross-section of the flexible circuit board 1500, and the second boundary may be formed to extend toward the microstrip line 1611. The width of the microstrip line 1611 may be greater than the width of the second ground pattern 15021. The flexible circuit board 1500 may further include multiple lower ground bridges which are formed on the second conductive layer 1502 in the extension direction of the microstrip line 1611 and cross the microstrip line 1611. The electronic device 400 may further include a housing which includes a front cover facing the front surface of the electronic device 400, a rear cover facing the rear surface of the electronic device 400, and a side member surrounding the space between the front cover and the rear cover. The flexible circuit board 1500 may extend from a part connected to the first printed circuit board 310 to a region adjacent to a part of the side member. The second antenna array AR2 may be electrically connected to the microstrip line 1611 and form a beam pattern in the region adjacent to a part of the side member.

Figure 15:
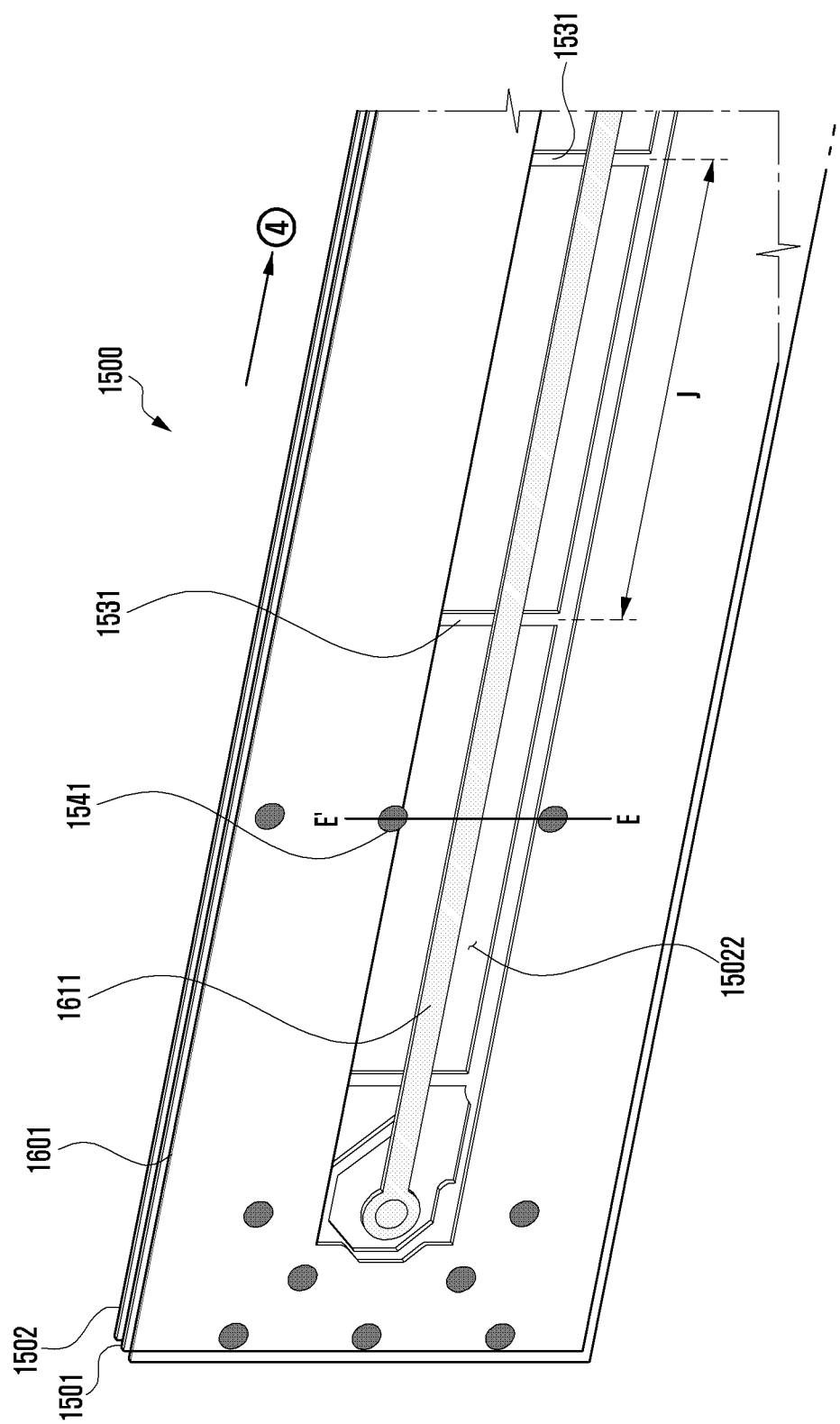
FIG. 15 is a perspective view showing a flexible circuit board according to another embodiment.

FIG. 15 is a perspective view showing a flexible circuit board 1500 according to another embodiment. FIG. 16 shows a cross-section of the flexible circuit board 1500 according to another embodiment illustrated in FIG. 15. FIG. 16 illustrates a cross-section of the flexible circuit board 1500, taken along line E-E' illustrated in FIG. 15.

The flexible circuit board 1500 illustrated in FIGS. 15 and 16 may be identical or at least partially similar to the flexible circuit board 410 illustrated in FIG. 4, or may further include another embodiment.

Referring to FIGS. 15 and 16, the flexible circuit board 1500 according to another embodiment may include a microstrip line-type conductive line (e.g., a microstrip line 1611), unlike the flexible circuit board 410, illustrated in FIG. 10, which includes a strip line-type conductive line (e.g., the strip line 411). According to an embodiment, the microstrip line 1611 illustrated in FIGS. 15 and 16 may be the signal line 411 as illustrated in FIG. 4 or the signal line 411 illustrated in FIG. 6.

The flexible circuit board 1500 according to another embodiment may include a first conductive layer 1501 and a second conductive layer 1502 disposed below the first conductive layer 1501 (e.g., in the second direction).

The first conductive layer 1501 may include the microstrip line 1611, an intermediate insulating material 15011, or an intermediate ground 1511. The intermediate insulating material 15011 outside (or at both sides of) the microstrip line 1611. The intermediate ground 1511 may be formed in common outside the intermediate insulating material 15011. The microstrip line 1611 may be a transmission line for transmitting a signal in a high-frequency band (e.g., 10 GHz to 100 GHz) for communication with a 5G network (e.g., the second network 294 in FIG. 2).

The second conductive layer 1502 may be disposed below the first conductive layer 1501. The second conductive layer 1502 may include a second ground pattern 15021, a lower insulating material 15022, or a lower ground 1512. The second ground pattern 15021 may be formed to overlap all or at least a part of the microstrip line 1611. The lower insulating material 15022 may be formed outside (or at both sides of) the second ground pattern 15021. The lower ground 1512 may be formed in common outside the lower insulating material 15022.

The second conductive layer 1502 may multiple lower ground bridges 1531 formed at regular intervals (e.g., intervals J in FIG. 15) in the extension direction (or longitudinal direction) of the microstrip line 1611 (e.g., direction in FIG. 15). The multiple lower ground bridges 1531 may be arranged at regular intervals in the extension direction of the microstrip line 1611, and may be formed to cross the microstrip line 1611 (e.g., in a perpendicular direction). The multiple lower ground bridges 1531 may prevent signal loss due to parasitic resonance that may occur in proportion to the length of the microstrip line 1611. The intervals (e.g., intervals J in FIG. 15) at which the multiple lower ground bridges 1531 are formed may be designed in consideration of the frequency band of a signal transmitted through the microstrip line 1611. In an embodiment, when the center frequency of the microstrip line 1611 is about 40 GHz, the intervals (e.g., intervals J in FIG. 15) at which the multiple lower ground bridges 1531 are arranged may be intervals of about 1.0 to 1.5 mm. For example, when the center frequency of the microstrip line 1611 is about 40 GHz, intervals J may be intervals of about 1.2 mm or less. In another embodiment, when the center frequency of the microstrip line 1611 is about 20 GHz, the intervals (e.g., intervals J in FIG. 15) at which the multiple lower ground bridges 1531 are arranged may be intervals of about 2.0 to 3.0 mm. For example, when the center frequency of the microstrip line 1611 is about 20 GHz, intervals J may be intervals of about 2.4 mm or less. In another embodiment, when the center frequency of the microstrip line 1611 is about 10 GHz, the intervals (e.g., intervals J in FIG. 15) at which the multiple lower ground bridges 1531 are arranged may be intervals of about 4.0 to 6.0 mm. For example, when the center frequency of the microstrip line 1611 is about 10 GHz, intervals J may be intervals of about 4.8 mm or less.

A first insulating layer 1601 may be disposed on the first conductive layer 1501. A second insulating layer 1602 may be disposed between the first conductive layer 1501 and the second conductive layer 1502. The first insulating layer 1601 and the second insulating layer 1602 may be dielectrics of the same material. For example, the first insulating layer 1601 and the second insulating layer 1602 may be any one of FR1, FR2, FR3, FR4, FR5, CEM1, or CEM2 made of a phenolic resin or epoxy resin material. Alternatively, the first insulating layer 1601 and the second insulating layer 1602 may be made of a Teflon material.

According to an embodiment, the intermediate insulating material 15011 of the first conductive layer 1501 or the lower insulating material 15022 of the second conductive layer 1502 may have at least part formed of a dielectric that is made of a material identical to the material of the first insulating layer 1601 and the second insulating layer 1602. According to another embodiment, the intermediate insulating material 15011 of the first conductive layer 1501 or the lower insulating material 15022 of the second conductive layer 1502 may have at least part which is an air layer.

The boundary between the intermediate ground 1511 and the intermediate insulating material 15011 may be defined as a first boundary 1521. In addition, the boundary between the lower ground 1512 and the lower insulating material 15022 may be defined as a second boundary 1522. The first boundary 1521 and the second boundary 1522 may be arranged in a straight line when viewed in a cross-section of the flexible circuit board 1500. According to another embodiment, like 1540 in FIG. 16, when viewed in a cross-section of the flexible circuit board 1500, the first boundary 1521 and the second boundary 1522 may not be arranged in a straight line, and the second boundary 1522 may extend toward the microstrip line 1611.

Multiple ground vias 1541 may be formed at intervals at both sides of the microstrip line 1611. The multiple ground vias 1541 may penetrate the second insulating layer 1602. For example, one ground via 1541 may penetrate the second insulating layer 1602 to electrically connect the intermediate ground 1511 of the first conductive layer 1501 to the lower ground 1512 of the second conductive layer 1502. In another example, one ground via 1541 may penetrate and electrically connect the intermediate ground 1511 of the first conductive layer 1501, the second insulating layer 1602, and the lower ground 1512 of the second conductive layer 1502.

In the flexible circuit board 1500 according to another embodiment, a ground pattern (e.g., the second ground pattern 15021) overlapping the microstrip line 1611 may be formed in the second conductive layer 1502, and an insulating material (e.g., the lower insulating material 15022) may be formed outside (or around) the ground pattern 15021. In the flexible circuit board 1500 according to another embodiment, the capacitance between the microstrip line 1611 and the ground may be reduced, and in response to the reduced capacitance, the width of the microstrip line 1611 may be designed to be wide. In the flexible circuit board 1500 according to another embodiment, the width of the microstrip line 1611 may be designed to be wide, thereby reducing signal transmission loss. For example, when the flexible circuit board 1500 has the specification of Table 1 above, the width of the microstrip line 1611 for 50 Ohm impedance matching may be designed to be 100 um to 120 um. For example, the width of the microstrip line 1611 may be designed to be about 110 um. In general, in the flexible circuit board having a microstrip line-type transmission line, when the first insulating layer 1601 and the second insulating layer 1602 is formed of a dielectric having, as the LowDk/LowDf, a dielectric constant (Dk) of about 3.5 and a dissipation factor (Df) of 0.005 or less, the width of the transmission line (i.e., the microstrip line) may be designed to be about 87 um in consideration of 50 Ohm impedance matching. As illustrated in FIG. 16, in the flexible circuit board 1500 according to an embodiment, the width of the microstrip line 1611 may be designed to be about a value of 110 um greater than the numerical value in the normal case. In this way, in the flexible circuit board 1500 according to another embodiment, signal transmission loss may be reduced by the increase in the width of the microstrip line 1611.

Figure 17:
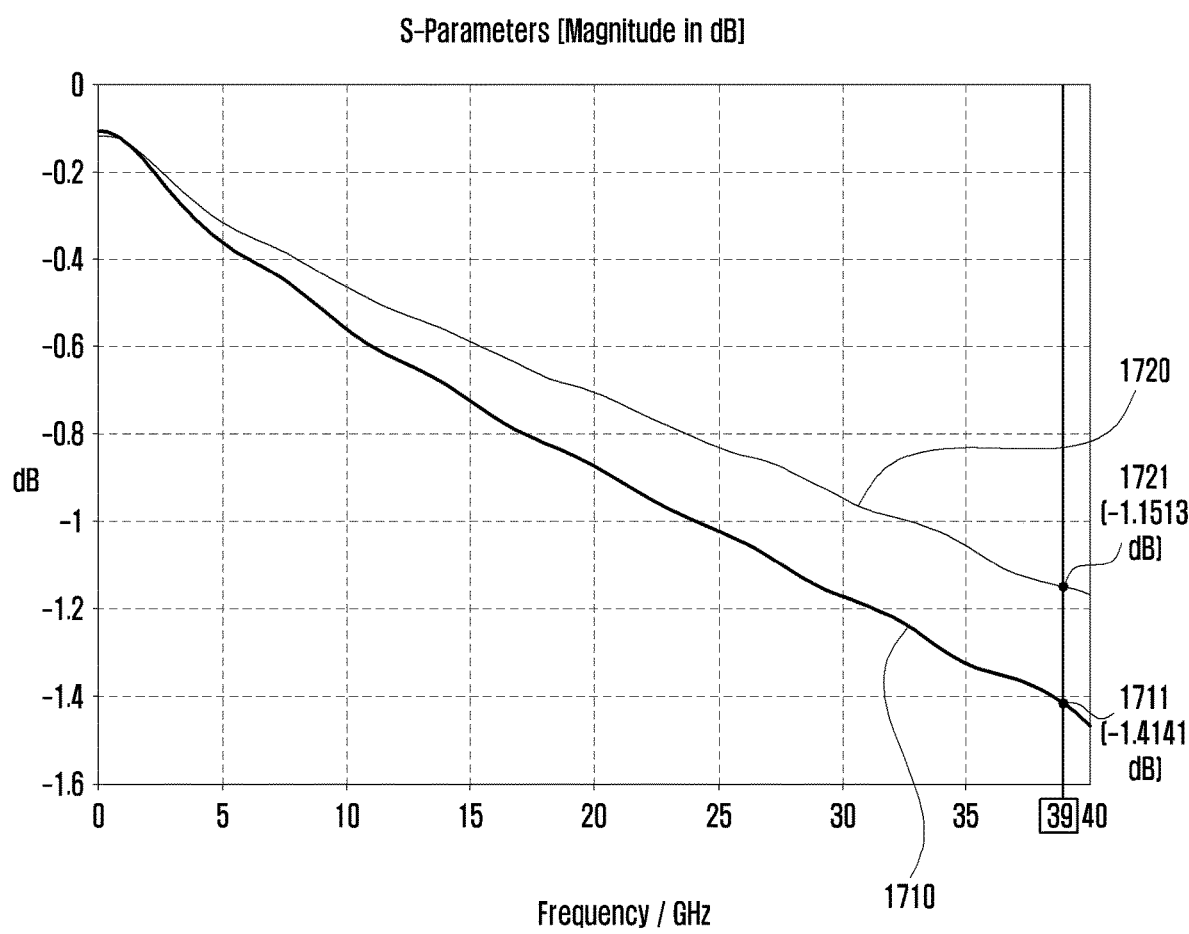
FIG. 17 is a graph comparing a loss value in a signal line of a flexible circuit board according to an embodiment with a loss value in a signal line of the flexible circuit board according to another embodiment.

FIG. 17 is a graph comparing a loss value in a signal line of the flexible circuit board 410 according to an embodiment illustrated in FIGS. 9 and 10 with a loss value in a signal line of the flexible circuit board 1500 according to another embodiment illustrated in FIGS. 15 and 16.

The experimental graph of FIG. 17 may be a graph obtained by performing measurement on the premise that the insulating layers (1001 and 1002 in FIG. 10, and 1601 and 1602 in FIG. 16) of the flexible circuit boards 410 and 1500 illustrated in FIGS. 10 and 16 have the same specification of Dk & Df (about 3.5 & 0.005 or less). For example, in the case of the experimental graph of FIG. 17, there is a difference only in that the transmission line (or signal line) 411 of the flexible circuit board 410 according to an embodiment illustrated in FIGS. 9 and 10 and the transmission line (or signal line) 1611 of the flexible circuit board 1500 according to another embodiment illustrated in FIGS. 15 and 16 are a strip line type or a micro strip line type, and the remaining elements may be measured by controlling variables.

Referring to a first loss graph 1710 in FIG. 17, it may be found that in an embodiment corresponding to FIG. 10, a first loss value 1711 of the strip line 411 at about 39 GHz is −1.4141 dB.

Referring to a second loss graph 1720 in FIG. 17, it may be found that in another embodiment corresponding to FIG. 17, a second loss value 1711 of the microstrip line 1611 at about 39 GHz is −1.1513 dB and that the loss value has been reduced compared to the embodiment herein corresponding to FIG. 10.

Figure 18:
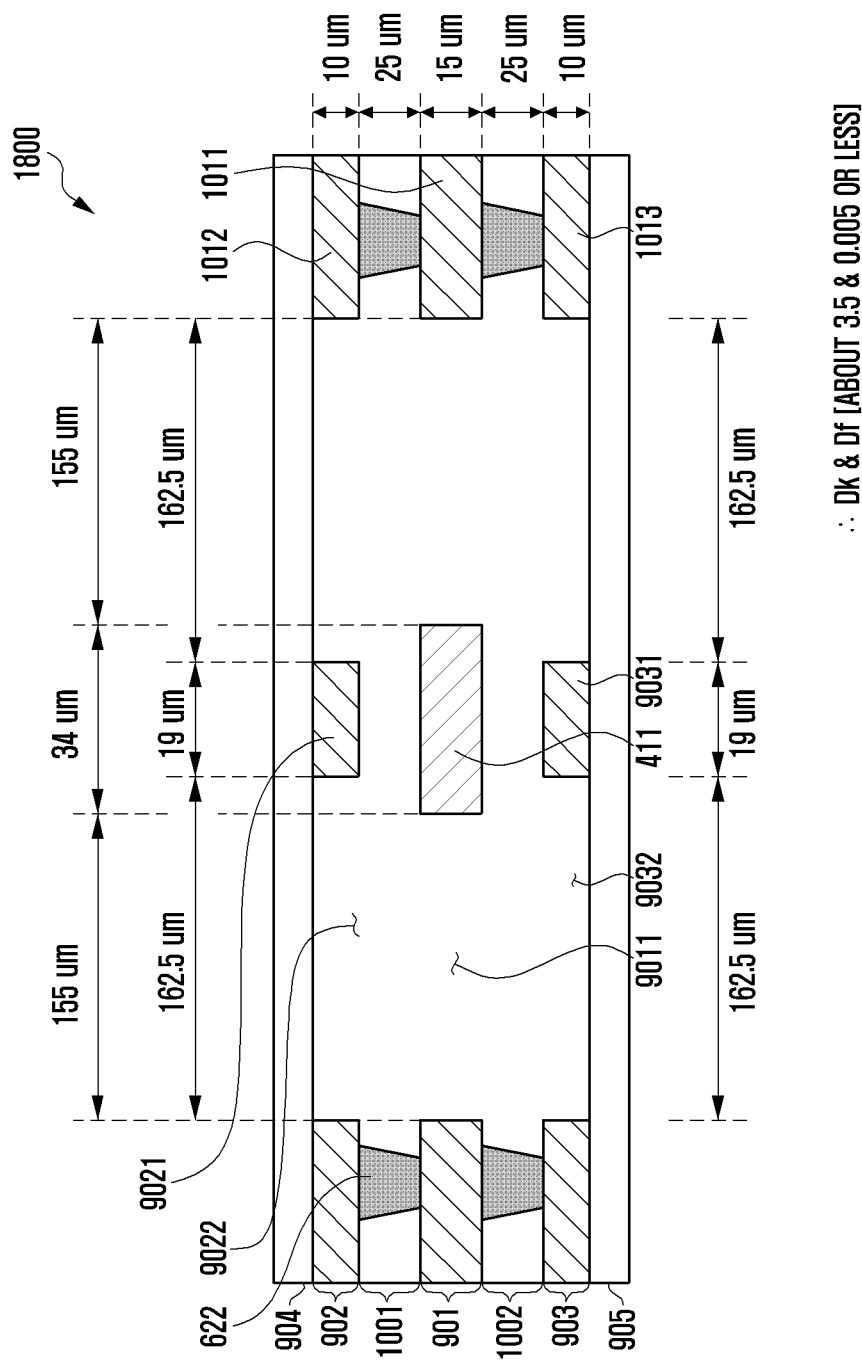
FIG. 18 shows a cross-section of a flexible circuit board according to another embodiment.

FIG. 18 shows a cross-section of a flexible circuit board 1800 according to another embodiment.

The flexible circuit board 1800 illustrated in FIG. 18 may be identical or at least partially similar to the flexible circuit board 410 illustrated in FIGS. 9 and 10, or may further include another embodiment.

Referring to FIG. 18, unlike the flexible circuit board 410 illustrated in FIG. 10, in the flexible circuit board 1800 according to another embodiment, insulating layers 1001 and 1002 may be designed to have low heights. Hereinafter, in the description related to FIG. 18, only elements different from those of FIG. 10 will be described.

For 50 Ohm impedance matching, the flexible circuit board 1800 shown in FIG. 18 may be designed under the conditions shown in Table 2. Referring to Table 2, the first insulating layer 1001 and the second insulating layer 1002 may be formed of a dielectric which has, as LowDk/LowDf, a dielectric constant (Dk) of about 3.5 and a dissipation factor (Df) of 0.005 or less. The first insulating layer 1001 and the second insulating layer 1002 may be designed to have a designated thickness, for example, a thickness of about 25 um, for 50 Ohm impedance matching.

TABLE 2

| Dk&Df | 3.5 & 0.005 or less |
|---|---|
| Thickness (or height) of each of first and second insulating layers | about 25 um |
| Thickness (or height) of strip line 411 | about 15 um |

Figure 19:
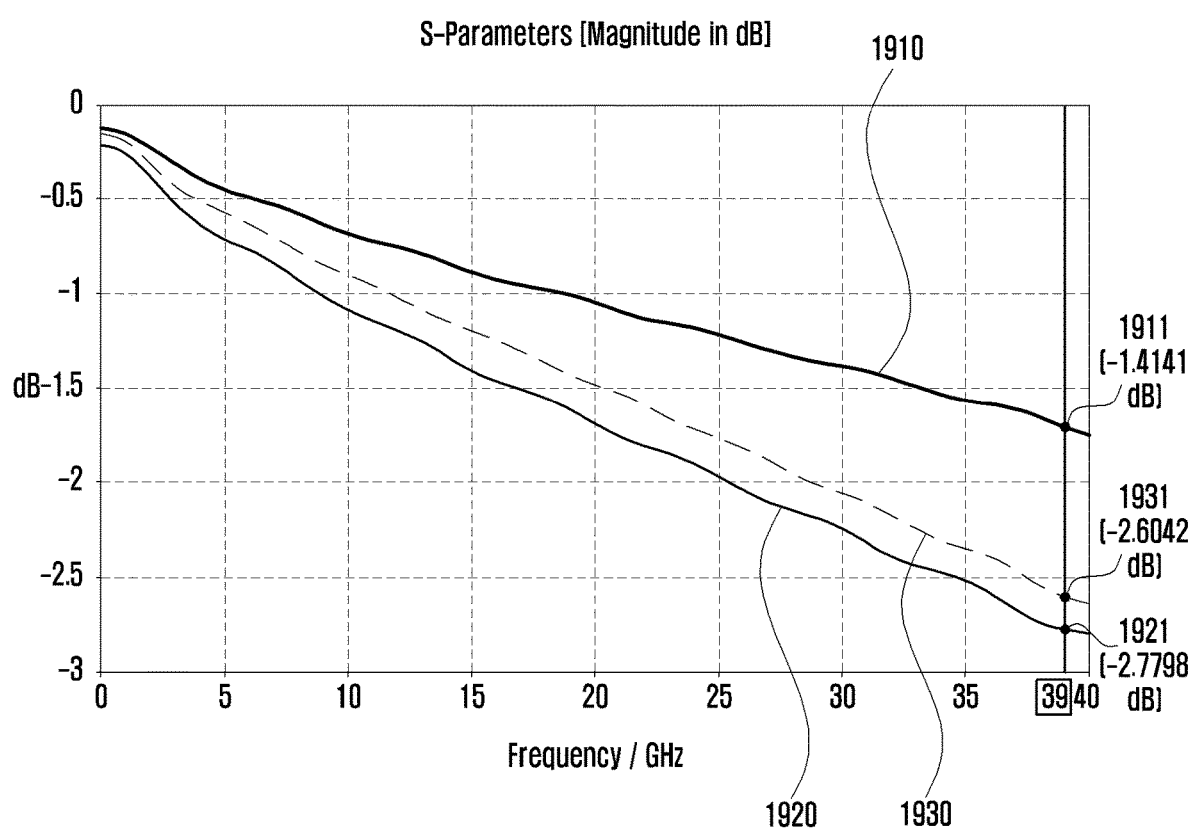
FIG. 19 is a graph obtained by measuring a loss value in a signal line of the flexible circuit board according to another embodiment illustrated in FIG. 18.

When the conditions of Table 2 are applied to Equation 1, the width of the strip line 411 for 50 Ohm impedance matching may be designed to be about 34 um. This may be a value greater than about 20 um which is the width of the strip line 411 designed with the thickness (or height) of the insulating layers (e.g., 801 and 802 in FIG. 8) of about 25 um in a typical strip line structure (e.g., a structure similar to FIGS. 7 and 8). In the flexible circuit board 1800 according to another embodiment, signal transmission loss may be reduced by the increase in the width of the strip line 411. FIG. 19 may be a graph obtained by measuring a loss value in a signal line of the flexible circuit board 1800 according to another embodiment illustrated in FIG. 18.

The experimental graph in FIG. 19 may be a graph obtained by performing measurement on the premise that the insulating layers 1001 and 1002 of the flexible circuit board 1800 in FIG. 18, the insulating layers 1001 and 1002 of the flexible circuit board 410 in FIG. 10, and the insulating layers 801 and 802 of the flexible circuit board 700 in FIG. 8, compared with each other, have the same specification of Dk & Df (about 3.5 & 0.005 or less).

A first loss graph 1910 in FIG. 19 may indicate a loss value in a signal line of the flexible circuit board 410 according to an embodiment illustrated in FIGS. 9 and 10. Referring to the first loss graph 1910 in FIG. 19, it may be found that in an embodiment corresponding to FIG. 10, a loss value 1911 of the strip line 411 at about 39 GHz is −1.4141 dB.

A second loss graph 1920 in FIG. 19, which indicates a loss value of a strip line according to a comparative example, may be a graph obtained by measuring a loss value of a typical strip line (e.g., 7011 in FIG. 8) having about 20 um in a flexible circuit board (e.g., 700 in FIG. 8) in which the thickness (or height) of each of the first insulating layer (e.g., 801 in FIG. 8) and the second insulating layer (e.g., 802 in FIG. 8) is about 25 um. Referring to the second loss graph 1920 in FIG. 19, it may be found that a second loss value 1921 of the strip line 7011 according to the comparative example is −2.7798 dB at about 39 GHz.

A third loss graph 1930 in FIG. 19 may indicate a loss value in the strip line 411 of the flexible circuit board 1800 according to another embodiment illustrated in FIG. 18. Referring to the third loss graph 1930 in FIG. 19, it may be found that a third loss value 1931 of the strip line 411 according to another embodiment is −2.6042 dB at about 39 GHz and that the loss value is reduced compared to the comparative example corresponding to the second loss graph 1920.

Figure 20:
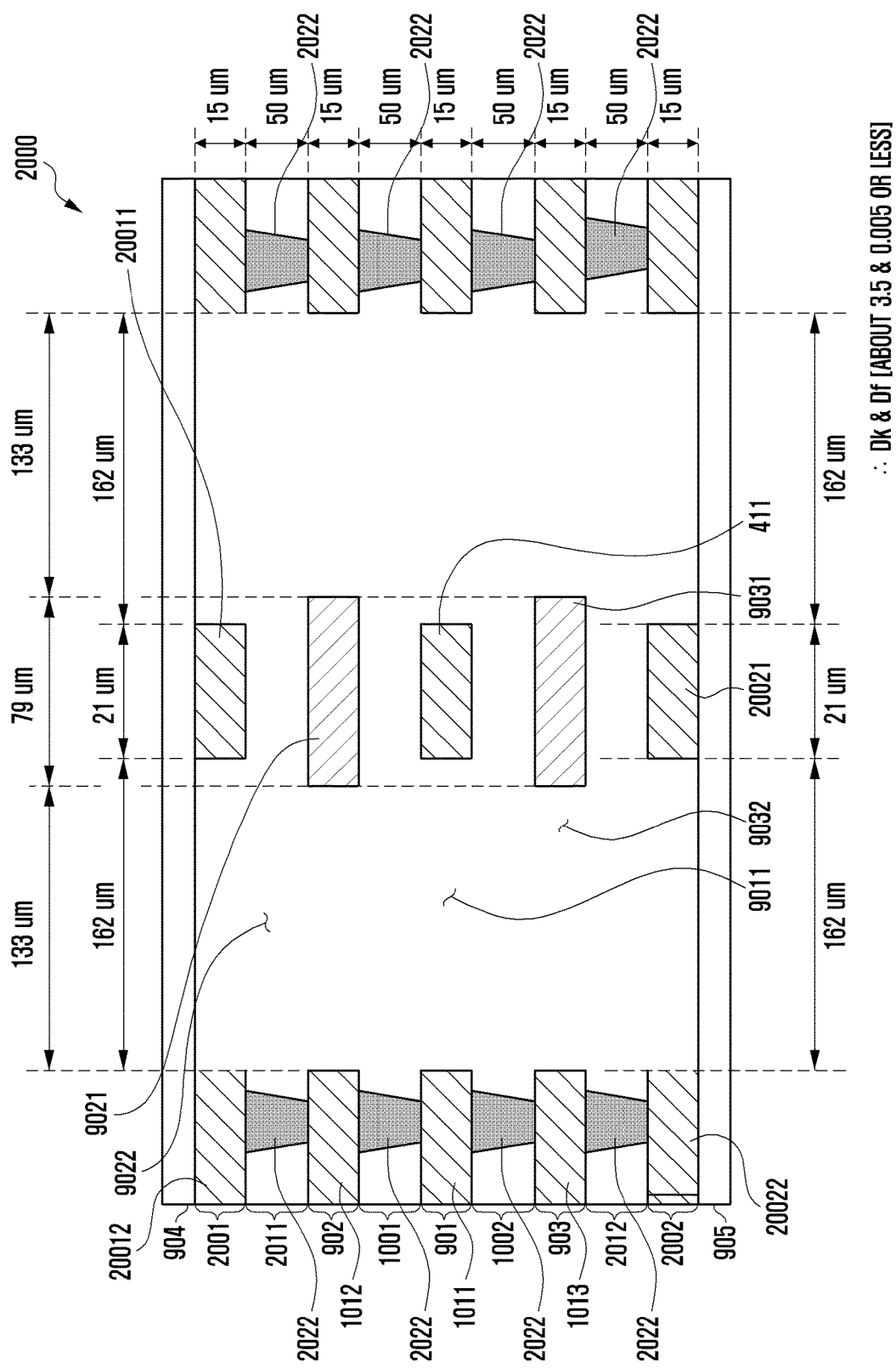
FIG. 20 shows a cross-section of a flexible circuit board according to another embodiment.

FIG. 20 shows a cross-section of a flexible circuit board 2000 according to another embodiment.

The flexible circuit board 2000 illustrated in FIG. 20 may be identical or at least partially similar to the flexible circuit board 410 illustrated in FIG. 4, or may further include another embodiment.

Referring to FIG. 20, the flexible circuit board 2000 according to another embodiment may further include additional conductive layers 2001 and 2002, unlike the flexible circuit board 410 shown in FIG. 10. For example, the flexible circuit board 2000 according to another embodiment may further include at least one of a fourth conductive layer 2001 formed on the second conductive layer 902 (e.g., in a first direction) or a fifth conductive layer 2002 formed beneath the third conductive layer 903 (e.g., in a second direction).

In the illustrated example, a first coverlay 904 formed of an insulating material may be disposed at the uppermost layer of the flexible circuit board 2000, for example, on the fourth conductive layer 2001 (e.g., in the first direction). A second coverlay 905 formed of an insulating material may be disposed at the lowermost layer of the flexible circuit board 2000, for example, beneath the fifth conductive layer 2002 (e.g., in the second direction).

The fourth conductive layer 2001 may include a third ground pattern 20011 overlapping the first ground pattern 9021, or an uppermost ground 20012 disposed above the second conductive layer 902 (e.g., in the first direction) and outside the third ground pattern 20011 and formed in common over the entire area of the flexible circuit board 2000.

The fifth conductive layer 2002 may include a fourth ground pattern 20021 overlapping the second ground pattern 9031, or a lowermost ground 20022 disposed below the third conductive layer 903 (e.g., the second direction opposite to the first direction) and outside the fourth ground pattern 20021 and formed in common over the entire area of the flexible circuit board 2000.

A third insulating layer 2011 may be disposed between the second conductive layer 902 and the fourth conductive layer 2001. A fourth insulating layer 2012 may be disposed between the third conductive layer 903 and the fifth conductive layer 2002.

Multiple ground vias 2022 may be formed at both sides of the strip line 411. In an embodiment, one ground via 2022 may penetrate the first insulating layer 1001, the second insulating layer 1002, the third insulating layer 2011, and/or the fourth insulating layer 2012. One ground via 2022 may penetrate the first insulating layer 1001, the second insulating layer 1002, the third insulating layer 2011, and/or the fourth insulating layer 2012 to electrically connect the uppermost ground 20012 of the fourth conductive layer 2001, the intermediate ground 1011, the upper ground 1012, the lower ground 1013, and the lowermost ground 20022 of the fifth conductive layer 2002 to each other. According to various embodiments, the ground vias 2022 may include a structure in which one ground via penetrates all insulating layers 2011, 1001, 1002, and 2012, or may include a structure in which sub ground vias penetrating at least some of the insulating layers 2011, 1001, 1002, 2012 are connected to each other.

Figure 21:
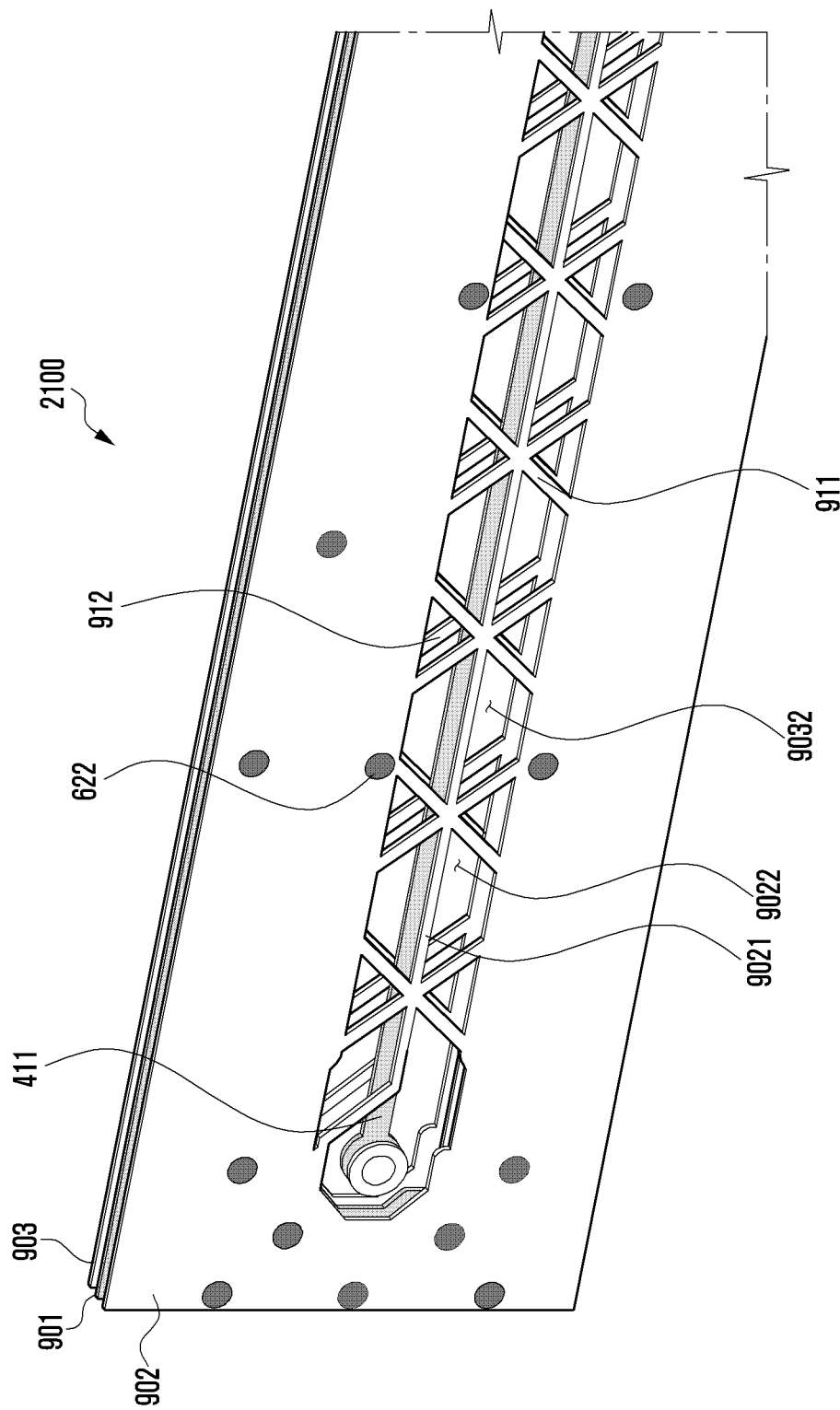
FIG. 21 shows a flexible circuit board according to another embodiment.

FIG. 21 shows a flexible circuit board 2100 according to another embodiment. The flexible circuit board 2100 illustrated in FIG. 21 may be identical or at least partially similar to the flexible circuit board 410 illustrated in FIG. 9, or may further include another embodiment. Hereinafter, in the description related to FIG. 21, only elements different from those in FIG. 9 will be described.

Referring to FIG. 21, in the flexible circuit board 2100 according to another embodiment, the shape of ground bridges 911 and 912 may be modified. According to another embodiment, the ground bridges 911 and 912 may include multiple upper ground bridges 911 formed in a second conductive layer 902 and multiple lower ground bridges 912 formed in a third conductive layer 903. The multiple upper ground bridges 911 may be arranged at regular intervals in the extension direction of the strip line 411, and may be shaped to intersect each other above the strip line 411. The multiple lower ground bridges 912 may be arranged at regular intervals in the extension direction of the strip line 411, and may be shaped to intersect each other below the strip line 411. According to an embodiment, an upper insulating material 9022 and/or a lower insulating material 9032 may be formed in a trapezoidal shape, a rhombus shape, or a triangular shape.

Figure 22:
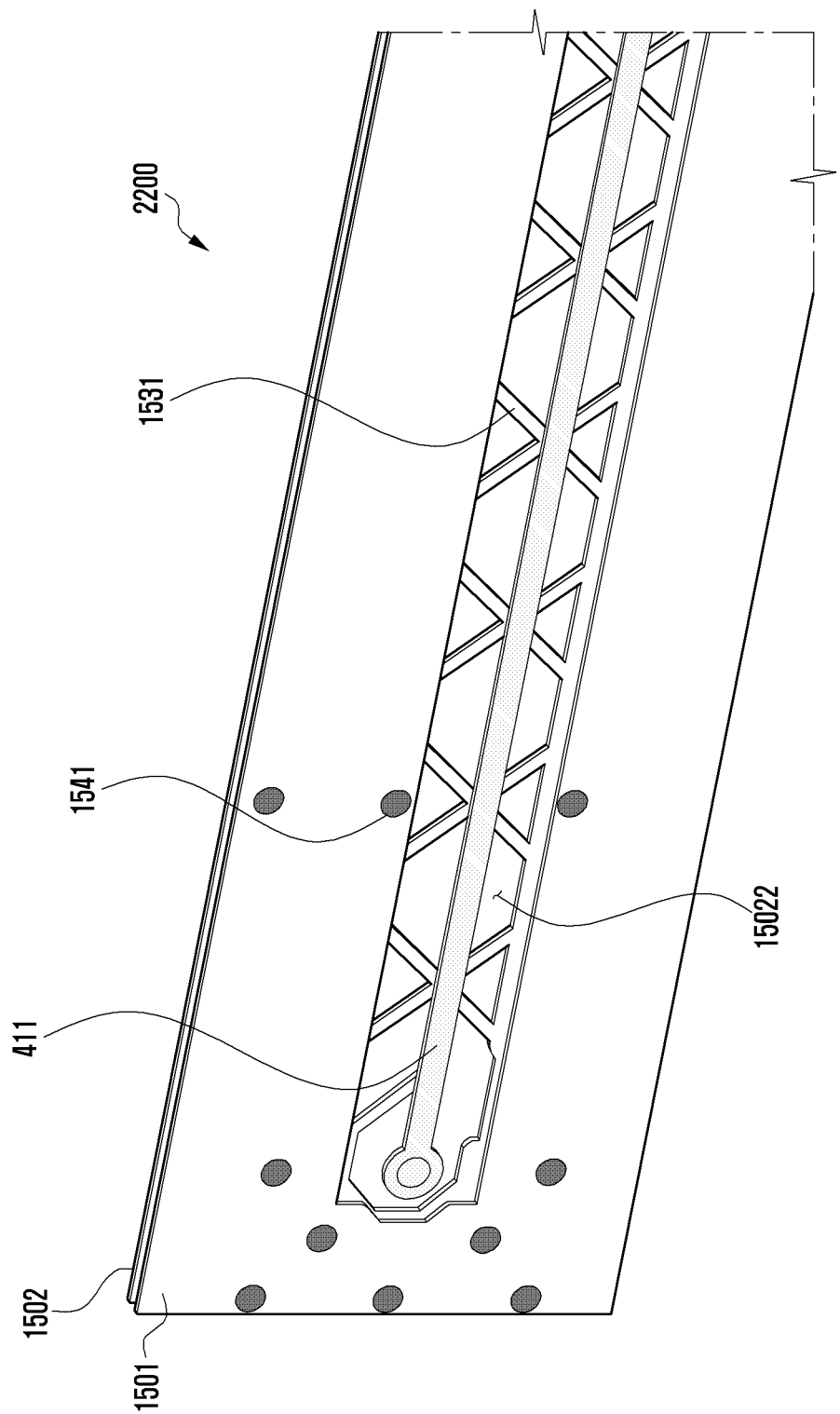
FIG. 22 shows a flexible circuit board according to another embodiment.

FIG. 22 shows a flexible circuit board 2200 according to another embodiment. The flexible circuit board 2200 illustrated in FIG. 22 may be identical or at least partially similar to the flexible circuit board 1500 illustrated in FIG. 15, or may further include another embodiment. Hereinafter, in the description related to FIG. 22, only elements different from those in FIG. 15 will be described.

Referring to FIG. 22, the flexible circuit board 2200 according to another embodiment may include a micro the strip line 411, and the shape of the ground bridge 1531 may be modified. According to another embodiment, the ground bridge 1531 may include multiple lower ground bridges 1531 formed in the second conductive layer 1502. The multiple lower ground bridges 1531 may be arranged at regular intervals in the extension direction of the strip line 411, and may be shaped to intersect each other below the strip line 411.

Figure 23:
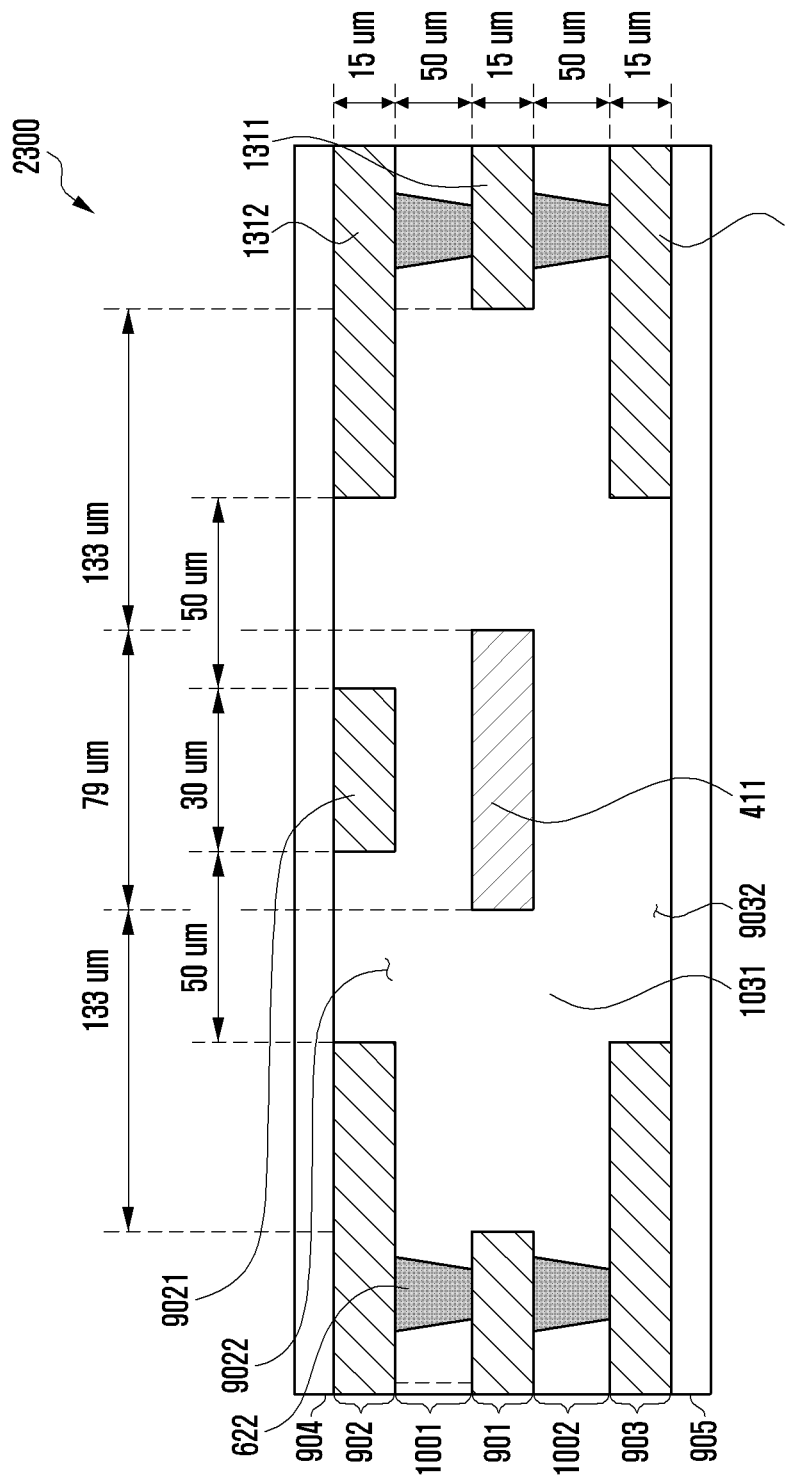
FIG. 23 shows a flexible circuit board according to another embodiment.

FIG. 23 shows a flexible circuit board 2300 according to another embodiment. The flexible circuit board 2300 illustrated in FIG. 23 may be identical or at least partially similar to the flexible circuit board 1300 illustrated in FIG. 13, or may further include another embodiment. Hereinafter, in the description related to FIG. 23, only elements different from those in FIG. 13 will be described.

Referring to FIG. 23, in the flexible circuit board 2300 according to another embodiment, unlike the example in FIG. 13, a second ground pattern (e.g., 9031 in FIG. 13) may be deleted, and a lower insulating material 9032 may be formed at a part overlapping a strip line 411.

Figure 24:
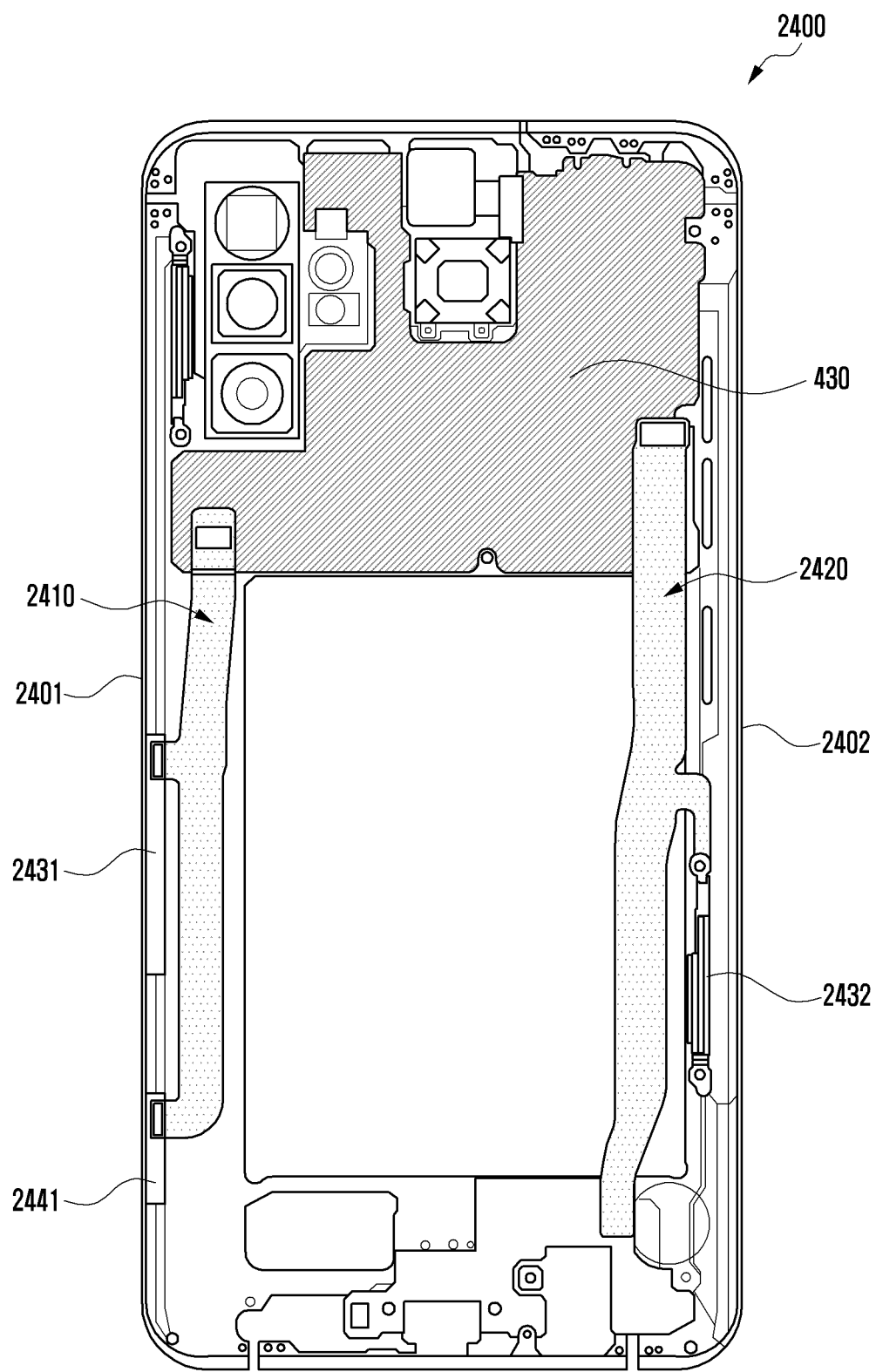
FIG. 24 illustrates a configuration of an electronic device according to another embodiment including a structure of a third antenna module.

FIG. 24 illustrates a configuration of an electronic device 2400 according to another embodiment including the structure of the third antenna module 246 described with reference to FIG. 2. The electronic device 2400 illustrated in FIG. 24 may be at least partially similar to the electronic device 101 illustrated in FIG. 1 or the electronic device 400 illustrated in FIG. 4, or may further include another embodiment.

FIG. 24 illustrates a part of the electronic device 2400 viewed from the rear surface (e.g., the surface on which a rear cover is disposed, or direction ① in FIG. 5), and illustrates an internal structure shown while the rear cover (or, a rear plate) (e.g., 550 in FIG. 5) is removed.

Referring to FIG. 24, 5G antenna modules may be disposed adjacent to a first side surface 2401 of the electronic device 2400. For example, the 5G antenna modules may include a first 5G module 2431 for communicating with a 5G network (e.g., the second network 294 in FIG. 2), or a Wi-Fi antenna module 2441 for accessing a Wi-Fi network based on 802.11ay. The first 5G module 2431 may be identical or at least partially similar to the third antenna module 246 illustrated in FIG. 3. For example, the first 5G module 2431 may include at least some among a first printed circuit board (e.g., the first printed circuit board 310 in FIG. 4), a first antenna array (e.g., a patch antenna array), a second antenna array (e.g., a dipole antenna array), or an RFIC electrically connected to antenna arrays (e.g., the first antenna array and/or the second antenna array).

The first 5G antenna module 2431 and/or the Wi-Fi antenna module 2441 disposed on the first side surface 2401 of the electronic device 2400 may be electrically connected to a second printed circuit board 430 (e.g., the second printed circuit board 430 in FIG. 4) through a first flexible circuit board 2410. The first flexible circuit board 2410 may include multiple signal lines (e.g., 2521, 2522, and 2531 in FIG. 25) for transmitting signals in a high-frequency band (e.g., 10 GHz to 100 GHz). Some of the multiple signal lines (e.g., 2521, 2522, and 2531 in FIG. 25) may be transmission lines (e.g., 2521 and 2522 in FIG. 25) for transmitting a signal in a high-frequency band of "IF frequency of about 9 GHz to 10 GHz/RF radiation frequency of about 24 GHz to 28 GHz and 39 GHz". Others of the multiple signal lines (e.g., 2521, 2522, and 2531 in FIG. 25) may be a single transmission line (e.g., 2531 in FIG. 25) for transmitting a signal in a high-frequency band of "IF of about 18 GHz/RF radiation frequency of about 60 GHz" based on 802.11ay. In an embodiment, the first flexible circuit board 2410 may further include at least one low-speed control signal wiring (e.g., 2523, 2524, 2533, or 2532 in FIG. 25) for transmitting a low-speed control signal such as power (e.g., VBAT), a clock (e.g., CLK), or data (e.g., DATA).

Another 5G antenna module may be adjacently disposed on a second side surface 2402 opposite to the first side surface 2401 of the electronic device 2400. For example, a second 5G module 2432 for communicating with a 5G network (e.g., the second network 294 in FIG. 2) may be disposed on the second side surface 2402 of the electronic device 2400.

The second 5G module 2432 may be electrically connected to the second printed circuit board 430 through a second flexible circuit board 2420. The second flexible circuit board 2420 may include multiple signal lines (e.g., 411 in FIG. 6) for transmitting signals in a high-frequency band (e.g., 10 GHz to 100 GHz). The second 5G module 2432 may be identical or at least partially similar to the third antenna module 246 illustrated in FIG. 3. For example, the second 5G module 2432 may include at least some among a first printed circuit board (e.g., the first printed circuit board 310 in FIG. 4), a first antenna array (e.g., a patch antenna array), a second antenna array (e.g., a dipole antenna array), or an RFIC electrically connected to antenna arrays (e.g., the first antenna array and/or the second antenna array). In an embodiment, the second flexible circuit board 2420 may further include at least one low-speed control signal wiring (not shown) for transmitting a low-speed control signal such as power (e.g., VBAT), a clock (e.g., CLK), or data (e.g., DATA).

Figure 25:
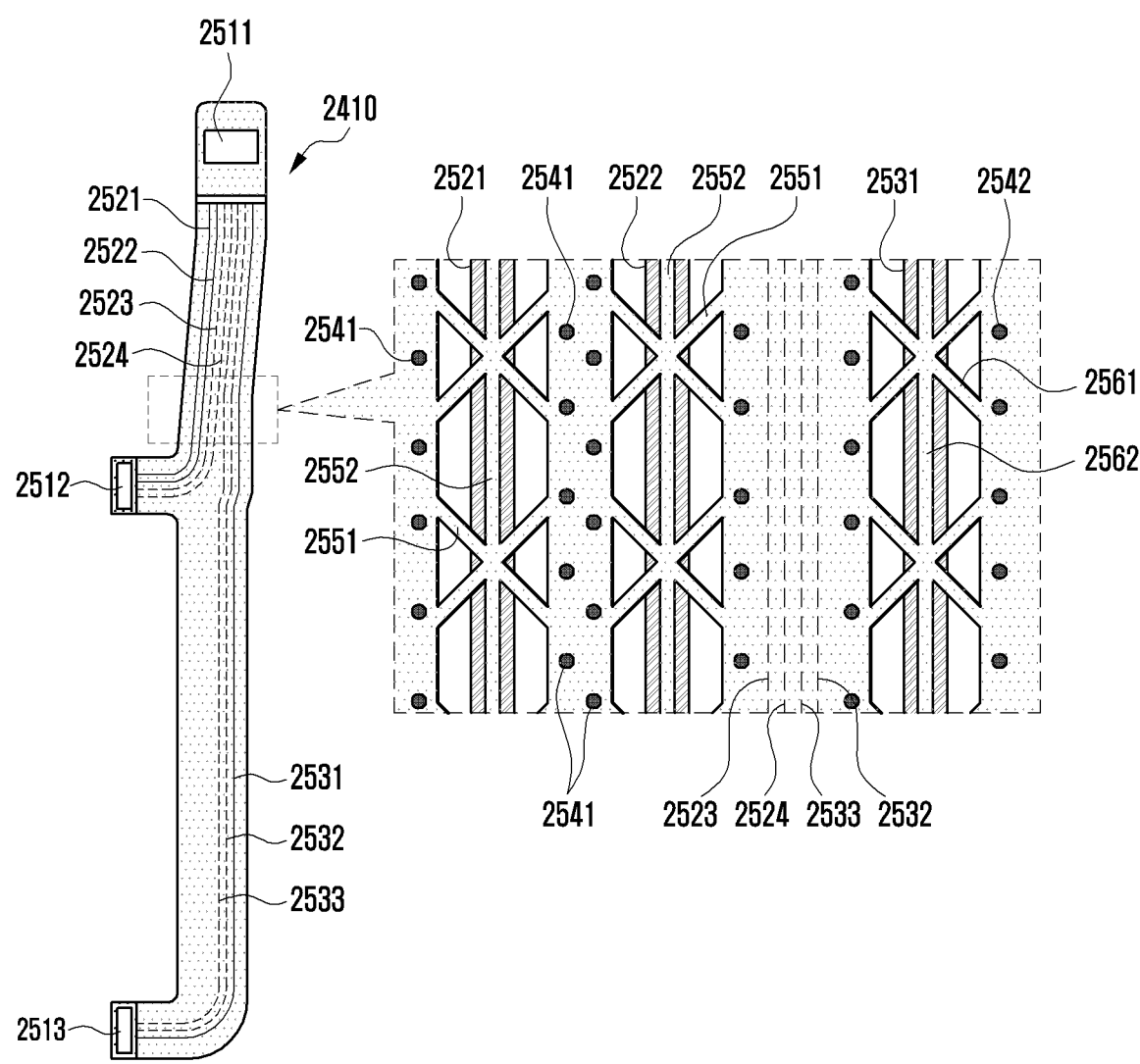
FIG. 25 schematically illustrates the structure of a first flexible circuit board illustrated in FIG. 24.

FIG. 25 schematically illustrates the structure of the first flexible circuit board 2410 illustrated in FIG. 24. The first flexible circuit board 2410 illustrated in FIG. 25 may be at least partially identical to or similar to the structures of the flexible circuit boards described with reference to FIGS. 9 to 23, or may further include another embodiment.

Referring to FIG. 25, the first flexible circuit board 2410 according to an embodiment may electrically connect a 5G antenna module 2431 and a Wi-Fi antenna module 2441, disposed on a first side (e.g., 2401 in FIG. 24) of an electronic device (e.g., 2400 in FIG. 24) to a printed circuit board (e.g., the second printed circuit board 430 in FIG. 24) (e.g., a main printed circuit board). The first flexible circuit board 2410 may include a first connector 2511 electrically connected to the second printed circuit board 430, a second connector 2512 electrically connected to the first 5G module (e.g., 2431 in FIG. 24) disposed on the first side (e.g., 2401 in FIG. 24) of the electronic device (e.g., 2400 in FIG. 24), and a third connector 2513 electrically connected to the Wi-Fi antenna module (e.g., 2441 in FIG. 24) disposed on the first side (e.g., 2401 in FIG. 24) of the electronic device (e.g., 2400 in FIG. 24).

In an embodiment, the first flexible circuit board 2410 may include multiple signal lines 2521, 2522, and 2531.

In an embodiment, some of the multiple signal lines 2521, 2522, and 2531, for example, a first signal line 2521 and a second signal line 2522, may be transmission lines which are connected to the first 5G module (e.g., 2431 in FIG. 24) through the second connector 2512 so as to transmit a signal in a high-frequency band of "IF frequency of about 9 GHz to 10 GHz/RF radiation frequency of about 24 GHz to 28 GHz and 39 GHz".

In an embodiment, others among the multiple signal lines 2521, 2522, and 2531, for example, a third signal line 2531, may be a line for transmitting, through the third connector 2513, a signal in a high-frequency band of "IF about 18 GHz/RF radiation frequency of about 60 GHz" based on 802.11 ay.

In an embodiment, the first flexible circuit board 2410 may further include multiple low-speed control signal wirings 2523, 2524, 2533, and 2532 for transmitting a low-speed control signal such as power (e.g., VBAT), a clock (e.g., CLK), or data (e.g., DATA). For example, some of the multiple low-speed control signal wirings 2523, 2524, 2533, and 2532, for example, a first low-speed control signal wiring 2523 and a second low-speed control signal wiring 2524, may be low-speed control signal wirings electrically connected to the first connector 2511 and the second connector 2512. For example, others of the multiple low-speed control signal wirings 2523, 2524, 2533, and 2532, for example, a third low-speed control signal wiring 2532 and a fourth low-speed control signal wiring 2533, may be low-speed control signal wirings electrically connected to the first connector 2511 and the third connector 2513.

In an embodiment, the first flexible circuit board 2410 may include multiple conductive vias 2541 and 2542 (e.g., the multiple ground vias 622 in FIG. 9) formed around the multiple signal lines 2521, 2522, and 2531. For example, the multiple conductive vias 2541 and 2542 may be formed at intervals in the extension direction of the multiple signal lines 2521, 2522, and 2531. For example, the multiple conductive vias 2541 may be positioned between the signal line 2521 and the signal line 2522. According to an embodiment, the multiple conductive vias 2541 and 2542 may be formed as conductive wirings capable of blocking noise generated among the multiple signal lines 2521, 2522, and 2531. Although not illustrated, a conductive line or multiple ground vias (e.g., the multiple ground vias 622 in FIG. 9) for blocking noise may be positioned among the low-speed control signal wirings 2523, 2524, 2533, and 2532 or between the low-speed control signal wirings 2523, 2524, 2533, and 2532 and the multiple signal lines 2521, 2522, and 2531.

In an embodiment, the first flexible circuit board 2410 may include multiple ground bridges 2551 and 2561 (e.g., the multiple ground bridges 911 and 912 in FIG. 9) overlapping the multiple signal lines 2521, 2522, and 2531 and crossing the respective signal lines 2521, 2522, and 2531. For example, the multiple ground bridges 2551 and 2561 may be formed at intervals in the extension direction of the multiple signal lines 2521, 2522, and 2531.

In an embodiment, the first flexible circuit board 2410 may include first ground patterns 2552 and 2562 (e.g., the first ground pattern 9021 in FIG. 9) overlapping the multiple signal lines 2521, 2522, and 2531 and formed in the extension direction of the multiple signal lines 2521, 2522, and 2531.

According to various embodiments, as illustrated in FIGS. 24 and 25, one flexible circuit board (e.g., the first flexible circuit board 2410) may be used, without an increase in thickness, as a component that connects an antenna for legacy network communication (e.g., a legacy antenna (e.g., 2.4 GHz Wi-Fi)), a 5G antenna for supporting 5G network communication, and/or a low-speed control signal wiring for transmitting power (e.g., VBAT), a clock (e.g., CLK), or data (e.g., DATA).

An electronic device (e.g., the electronic device 101 in FIG. 1) according to various embodiments may include a flexible circuit board (e.g., a flexible circuit board 2600 in FIG. 26) including at least one signal line (e.g., the signal line 411 in FIG. 4) as a transmission line for transmitting a signal in a high-frequency band. The flexible circuit board 2600 may include an intermediate region (e.g., an intermediate region 2610 in FIG. 26) in which the at least one signal line 411 is disposed, and a pad region (e.g., a pad region 2620 in FIG. 26) extending from the intermediate region 2610 so as to be disposed at one end or both ends of the flexible circuit board 2600. In the pad region 2620, at least one pad (e.g., a pad 2621 in FIG. 27) electrically connected to the signal line 411 and formed to face a first direction (e.g., the z direction) of the flexible circuit board 2600 (e.g., pad 2621 in FIG. 27), and a ground pattern (e.g., a ground pattern 2623 in FIG. 28) overlapping at least a part of the pad 2621 and formed to face a second direction (e.g., the −z direction) of the flexible circuit board 2600 may be disposed. The second direction (e.g., the −z direction) may be opposite to the first direction (e.g., the z direction).

According to an embodiment, the maximum width (e.g., width W1 in FIG. 27) of the pad 2621 may be greater than the width of the signal line 411, and the width (e.g., width W3 in FIG. 28) of the ground pattern 2623 may be smaller than the maximum width W1 of the pad 2621.

According to an embodiment, an insulating material (e.g., an insulating material 2625 in FIG. 28) overlapping a part of the pad 2621 may be disposed at both sides of the ground pattern 2623.

According to an embodiment, the pad 2621 may be disposed to extend in the x direction when the flexible circuit board 2600 is viewed from the first direction (e.g., the z direction), and the ground pattern 2623 may include a first ground pattern (e.g., a first ground pattern 2623*a* in FIG. 28) disposed in the x direction in parallel with the pad 2621, and a second ground pattern (e.g., a second ground pattern 2623*b* in FIG. 28) disposed in the y direction perpendicular to the x direction to cross a part of the pad 2621.

According to an embodiment, the second ground pattern 2623*b* may be connected to one end of the first ground pattern 2623*a*.

According to an embodiment, the ground pattern 2623 may be disposed to overlap the central part of the pad 2621, and the sum of the area of the insulating material 2625 and the area of the ground pattern 2623 may be larger than the area of the pad 2621.

According to an embodiment, a stacked structure of the flexible circuit board 2600 may include a first conductive layer, which includes the signal line 411 and an intermediate insulating material (e.g., the intermediate insulating material 9011 in FIG. 10) formed at both sides of the signal line 411, and a second conductive layer, which includes a lower ground pattern (e.g., the second ground pattern 9031 in FIG. 10), disposed in the second direction (e.g., the −z direction) from the signal line 411 to overlap at least a part of the signal line 411, and a lower insulating material (e.g., the lower insulating material 9032 in FIG. 10) formed at both sides of the lower ground pattern 9031.

According to an embodiment, the second conductive layer may further include multiple lower ground bridges (e.g., the lower ground bridges 912 in FIG. 9) formed to cross the signal line 411.

According to an embodiment, a stacked structure of the flexible circuit board 2600 may further include a third conductive layer, which includes an upper ground pattern (e.g., the first ground pattern 9021 in FIG. 10), disposed in the first direction (e.g., the z direction) from the signal line 411 to overlap at least a part of the signal line 411, and an upper insulating material formed at both sides of the upper ground pattern 9021 (e.g., the upper insulating material 9022 in FIG. 10).

According to an embodiment, the second conductive layer may further include multiple upper ground bridges (e.g., the upper ground bridges 911 in FIG. 9) formed to cross the signal line 411.

According to an embodiment, the signal in the high-frequency band may include a signal in a band of 10 GHz to 100 GHz.

According to an embodiment, the signal line 411 may be a strip line-type transmission line.

According to an embodiment, the signal line 411 may be a microstrip line-type transmission line.

A flexible circuit board (e.g., the flexible circuit board 2600 in FIG. 26) for transmitting a signal in a high-frequency of 10 GHz to 100 GHz, according to various embodiments, may include an intermediate region 2610 in which at least one signal line 411 is disposed as a transmission line for transmitting the signal in the high-frequency band, and a pad region 2620 extending from the intermediate region 2610 so as to be disposed at one end or both ends of the flexible circuit board 2600. In the pad region 2620, at least one pad 2621 electrically connected to the signal line 411 and formed to face a first direction (e.g., the z direction) of the flexible circuit board 2600, and a ground pattern 2623 overlapping at least a part of the pad 2621 and formed to face a second direction (e.g., the −z direction) of the flexible circuit board 2600 may be disposed. The second direction (e.g., the −z direction) may be opposite to the first direction (e.g., the z direction).

According to an embodiment, the maximum width W1 of the pad 2621 may be greater than the width of the signal line 411, and the width of the ground pattern 2623 may be smaller than the maximum width W1 of the pad 2621.

According to an embodiment an insulating material 2625 overlapping a part of the pad 2621 may be disposed at both sides of the ground pattern 2623.

According to an embodiment, the pad 2621 may be disposed to extend in the x direction when the flexible circuit board 2600 is viewed from the first direction (e.g., the z direction), and the ground pattern 2623 may include a first ground pattern 2623 disposed in the x direction in parallel with the pad 2621, and a second ground pattern 2623 disposed in a y direction perpendicular to the x direction to cross a part of the pad 2621.

According to an embodiment, the second ground pattern 2623 may be connected to one end of the first ground pattern 2623.

According to an embodiment, the ground pattern 2623 may be disposed to overlap the central part of the pad 2621, and the sum of the area of the insulating material 2625 and the area of the ground pattern 2623 may be larger than the area of the pad 2621.

According to an embodiment, a stacked structure of the flexible circuit board 2600 may include a first conductive layer including the signal line 411 and an intermediate insulating material 9011 formed at both sides of the signal line 411, and a second conductive layer, which includes a lower ground pattern 9031, disposed in the second direction (e.g., the −z direction) from the signal line 411 to overlap at least a part of the signal line 411, and a lower insulating material 9032, formed at both sides of the lower ground pattern 9031.

Figure 26:
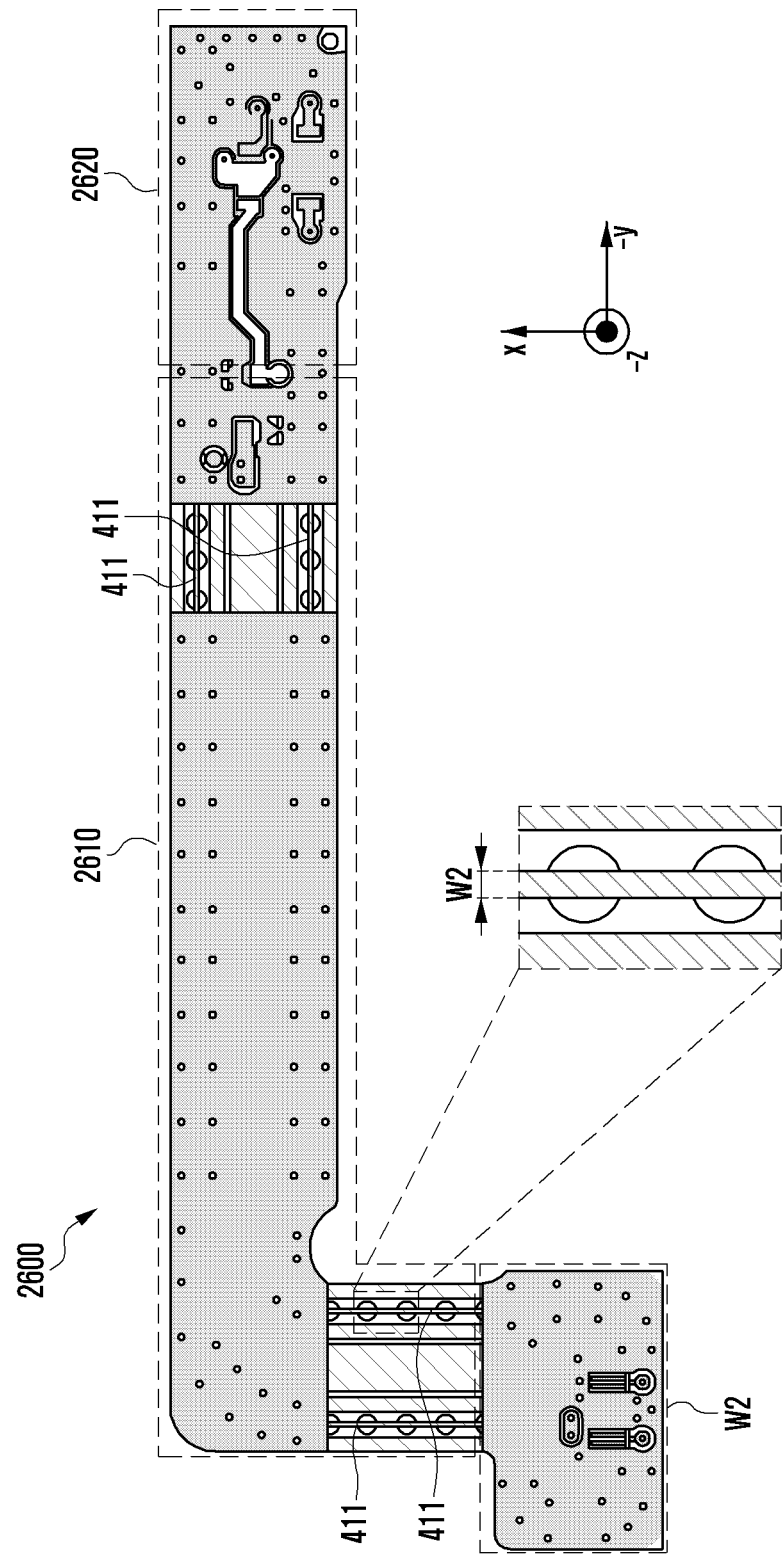
FIG. 26 is a plan view illustrating a rear surface of a flexible circuit board according to another embodiment.

FIG. 26 is a plan view illustrating the rear surface of a flexible circuit board according to another embodiment. For example, the rear surface of the flexible circuit board may refer to a surface disposed in a direction in which a pad (e.g., the pad 2621 in FIG. 27) of the flexible circuit board is visually viewed.

The flexible circuit board 2600 illustrated in FIG. 26 may be at least partially similar to the flexible circuit board according to the above-described various embodiments, or may include another embodiment. For example, the flexible circuit board 2600 illustrated in FIG. 26 may be at least partially similar to the flexible circuit board 410 illustrated in FIGS. 4 and 5, the flexible circuit board 410 illustrated in FIGS. 9 and 10, and the flexible circuit board 1300 illustrated in FIG. 13, the flexible circuit board 1500 illustrated in FIGS. 15 and 16, the flexible circuit board 1800 illustrated in FIG. 18, and the flexible circuit boards 2000, 2100, 2200, and 2300 illustrated in FIGS. 20 to 24.

Hereinafter, features changed in the flexible circuit board 2600 in FIG. 26 will be mainly described.

Referring to FIG. 26, the flexible circuit board 2600 according to another embodiment may include an intermediate region 2610, in which at least one signal line 411 is disposed as a transmission line for transmitting a signal in a high-frequency band (e.g., a band of 10 GHz to 100 GHz), and a pad region 2620 disposed at one end or both ends of the flexible circuit board 2600.

In another embodiment, the pad region 2620 may include at least one pad (e.g., the pad 2621 of FIG. 27) electrically connected to a signal line 411 disposed in the intermediate region 2610. In another embodiment, the pad region 2620 may be disposed to extend from the intermediate region 2610 of the flexible circuit board 2600. For example, the pad region 2620 may be disposed to extend from the intermediate region 2610 of the flexible circuit board 2600 to one end, or to extend from the intermediate region 2610 to the other end.

Figure 27:
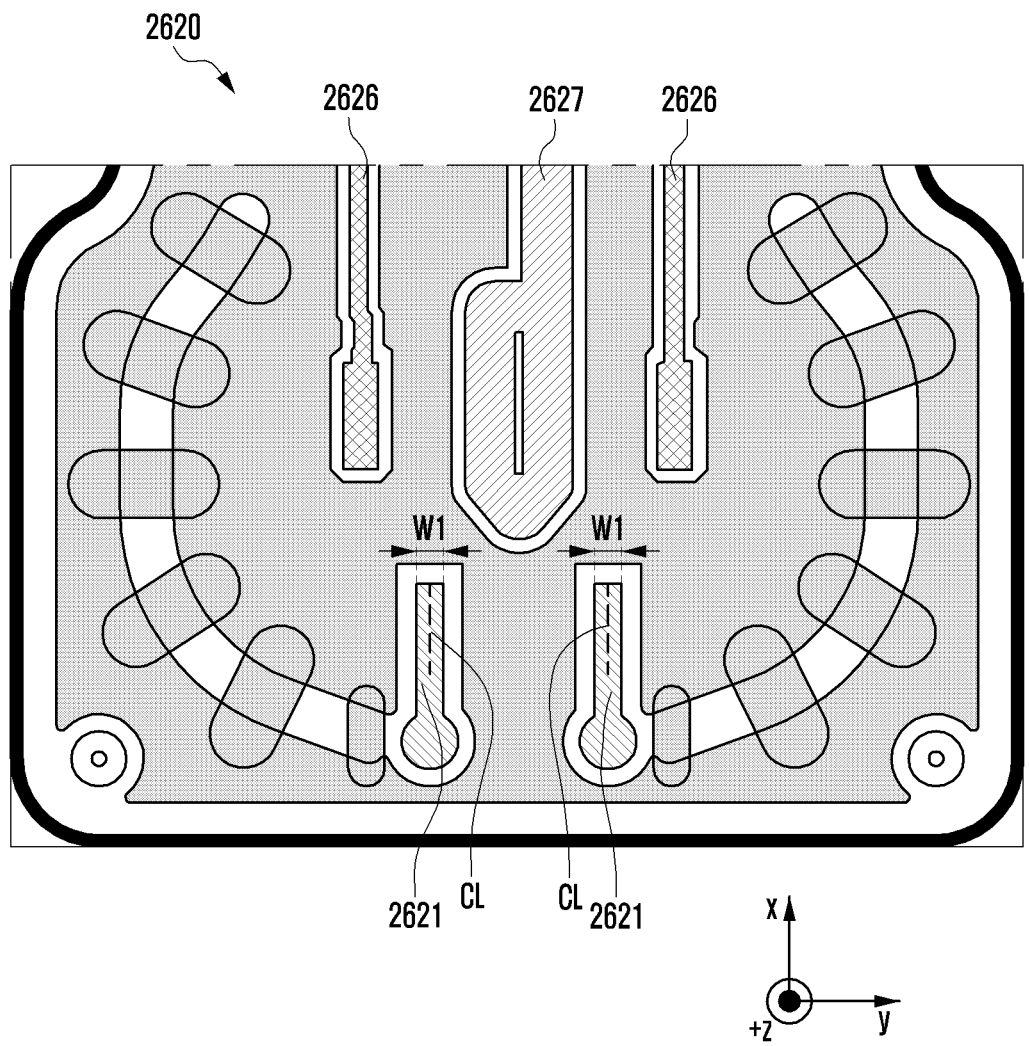
FIG. 27 illustrates a pad region of the flexible circuit board according to another embodiment illustrated in FIG. 26 when the pad region is viewed from a first direction of the flexible circuit board.

The flexible circuit board 2600 according to another embodiment may be electrically connected to a printed circuit board (e.g., the first printed circuit board 310 or the second printed circuit board 430 in FIG. 4) through the pad (e.g., the pad 2621 in FIG. 27). The flexible circuit board 2600 according to another embodiment may be electrically connected to an antenna module (e.g., the first 5G module 2431, the second 5G module 2432, and/or the Wi-Fi antenna module 2441 in FIG. 24) through the pad (e.g., the pad 2621 in FIG. 27). The flexible circuit board 2600 according to another embodiment may be electrically connected to the printed circuit board (e.g., the first printed circuit board 310 or the second printed circuit board 430 in FIG. 4) or the antenna module (e.g., the first 5G module 2431, the second 5G module 2432, and/or the Wi-Fi antenna module 2441 in FIG. 24) by conductive bonding or in a connector-to-connector type.

According to another embodiment, the at least one pad (e.g., pad 2621 of FIG. 27) disposed in the pad region 2620 may be formed to face a first direction (e.g., the z direction) of the flexible circuit board 2600. For example, when the flexible circuit board 2600 is viewed from a first direction (e.g., the z direction), the at least one pad (e.g., pad 2621 in FIG. 27) in the pad region 2620 may be visually viewed, the pad (e.g., pad 2621 in FIG. 27) may be a pad 2621 electrically connected to the signal line 411, which is a transmission line of the flexible circuit board 2600 for transmitting a signal in a high-frequency band (e.g., 10 GHz to 100 GHz band).

According to another embodiment, a ground pattern (e.g., the ground pattern 2623 in FIG. 28), overlapping at least a part of the pad (e.g., the pad 2621 in FIG. 27) and formed to face a second direction (e.g., the −z direction) of the flexible circuit board 2600, may be disposed in the pad region 2620 of the flexible circuit board 2600. The second direction (e.g., the −z direction) may be opposite to the first direction (e.g., the z direction). Hereinafter, the pad 2621 and the ground pattern 2623 formed in the pad region 2620 will be described in more detail in conjunction with FIGS. 27 and 28.

FIG. 27 illustrates the pad region 2620 of the flexible circuit board 2600 according to another embodiment illustrated in FIG. 26 when the pad region is viewed from a first direction (e.g., the z direction) of the flexible circuit board 2600.

Figure 28:
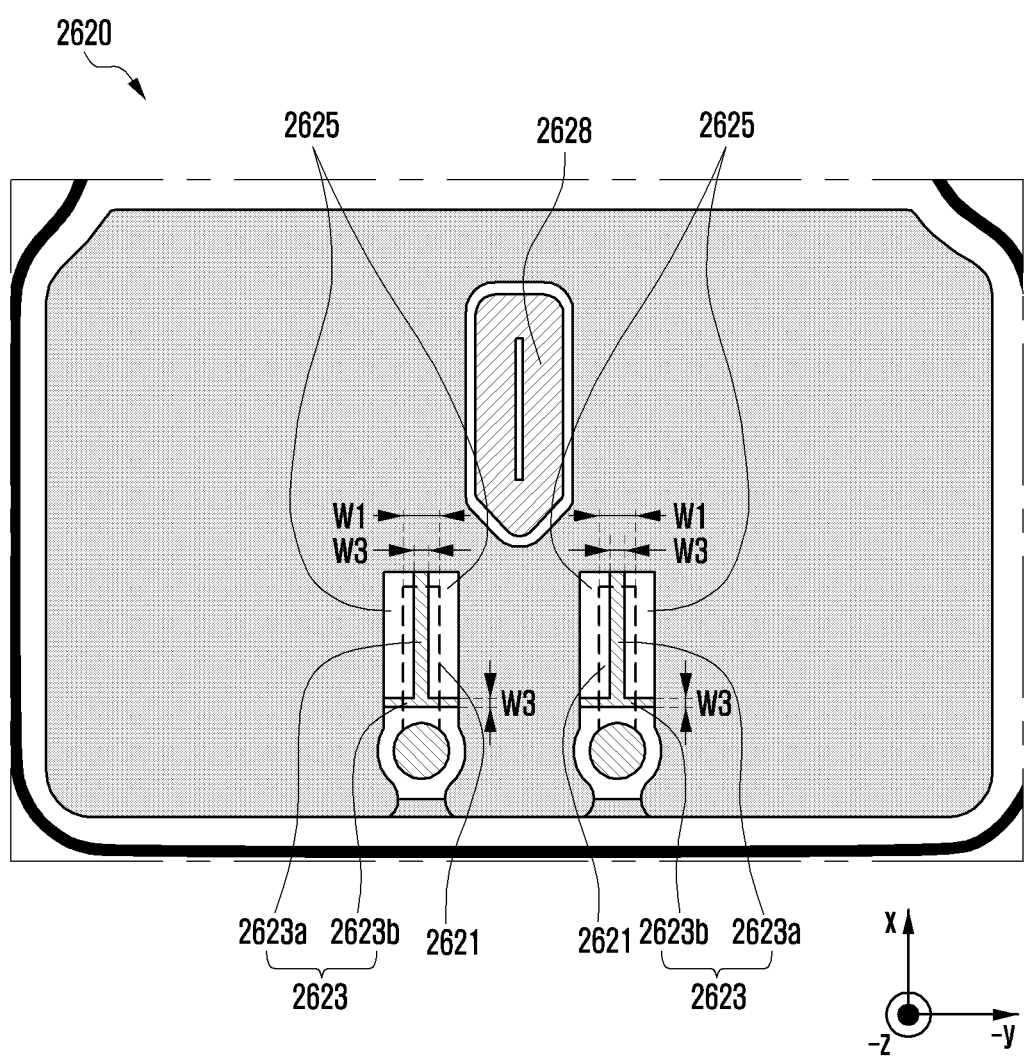
FIG. 28 illustrates the pad region of the flexible circuit board according to another embodiment illustrated in FIG. 26 when the pad region is viewed from a second direction of the flexible circuit board.

FIG. 28 illustrates the pad region 2620 of the flexible circuit board 2600 according to another embodiment illustrated in FIG. 26 when the pad region is viewed from a second direction (e.g., the −z direction) of the flexible circuit board 2600.

Referring to FIGS. 27 and 28, a pad 2621 of the flexible circuit board 2600 according to another embodiment may have a larger size than a signal line (e.g., the signal line 411 in FIG. 4 or 26). For example, within the same unit area, the size of the pad 2621 may be larger than the size of the signal line 411. According to another embodiment, the maximum width W1 of the pad 2621 may be greater than the width (e.g., width W2 in FIG. 26) of the signal line 411.

According to another embodiment, in the pad region 2620, the width W3 of a ground pattern 2623 disposed to overlap a part of the pad 2621 may be smaller than a maximum width W1 of the pad 2621.

According to another embodiment, an insulating material 2625 overlapping at least a part of the pad 2621 may be disposed at both sides of the ground pattern 2623.

According to another embodiment, the pad 2621 may be disposed to extend in a specific direction, for example, the x direction, when the flexible circuit board 2600 is viewed from the first direction (e.g., the z direction).

According to another embodiment, the ground pattern 2623 overlapping the pad 2621 may be disposed in the same shape as letter "T" of the English alphabet when the flexible circuit board 2600 is viewed from the second direction (e.g., the −z direction). For example, the ground pattern 2623 may include a first ground pattern 2623a disposed in the x direction in parallel with the pad 2621, and a second ground pattern 2623b disposed in the y direction perpendicular to the x direction to cross at least a part of the pad 2621. The first ground pattern 2623a and the second ground pattern 2623b may be connected to each other. For example, the second ground pattern 2623b may be connected to one end of the first ground pattern 2623a. The width W3 of each of the first ground pattern 2623a and the second ground pattern 2623b may be smaller than the maximum width W1 of the pad 2621.

According to another embodiment, the ground pattern 2623 may be disposed to overlap the central part of the pad 2621. For example, the ground pattern 2623 may have the width W3 smaller than the width W1 of the pad 2621, and may be disposed to overlap at least a part of the pad 2621, which includes the central part (e.g., a region including an imaginary center line CL illustrated in FIG. 27) of the pad 2621.

According to another embodiment, the sum of the area of the insulating material 2625 of the pad region 2620 visually exposed in the second direction (e.g., the -z direction) of the flexible circuit board 2600 and the area of the ground pattern 2623 may be larger the area of the pad 2621.

In the flexible circuit board 2600 according to various embodiments, signal loss in designing the signal line 411 to match 50 Ohm (Ω) impedance may be reduced by disposing, in the pad region 2620 in which the pad 2621 having a larger size than a signal line (e.g., the signal line 411 in FIG. 4 or 26) is formed, the ground pattern 2623 in the shape of a mesh (e.g., the shape of letter "T" of the alphabet) to overlap at least a part of the pad 2621 in the second direction (e.g., the -z direction) of the flexible circuit board 2600 positioned opposite to the pad 2621 and disposing the insulating material 2625 at both sides of the ground pattern 2623.

In FIG. 27, reference numeral 2626 may indicate a control signal line of the flexible circuit board 2600. For example, the flexible circuit board 2600 may transmit not only a high-frequency signal but also at least one control signal through the control signal line 2626.

In FIG. 27, reference numeral 2627 may indicate a power signal line of the flexible circuit board 2600. For example, the flexible circuit board 2600 may transmit not only a high-frequency signal but also at least one power signal through the power signal line 2627.

In FIG. 28, reference numeral 2628 may indicate a power signal electrode (e.g., a trace pattern) electrically connected to the power signal line 2627 through a conductive via (not shown).

Hereinafter, a stacked structure of the flexible circuit board 2600 according to another embodiment described in connection with FIGS. 26 to 28 will be described.

According to another embodiment, the stacked structure of the flexible circuit board 2600 may include two conductive layers or three conductive layers, but is not limited thereto and may be variously changed.

TABLE 3

| | At least one pad region | Intermediate region |
|---|---|---|
| First conductive layer | Pad | Signal line, intermediate insulating material |
| Second conductive layer | Ground pattern (first ground pattern and second ground pattern), insulating material | Lower ground pattern, lower insulating material, lower ground bridge |

Referring to Table 3, a stacked structure of the flexible circuit board 2600 according to an embodiment may include a first conductive layer and a second conductive layer as two conductive layers. For example, a signal line of the first conductive layer may be a microstrip line-type transmission line. Referring to Table 3, in the intermediate region of the flexible circuit board, the first conductive layer may include at least one signal line (e.g., the signal line 411 in FIG. 4 or 26) functioning as a transmission line for transmitting a signal in a high-frequency band (e.g., a band of 10 GHz to 100 GHz), and an intermediate insulating material disposed at both sides of the signal line 411. The above-mentioned structure of the first conductive layer may be identical or at least partially similar to the structure of the first conductive layer 901 described with reference to FIG. 10 or the structure of the first conductive layer 1501 described with reference to FIG. 16.

Referring to Table 3, in the intermediate region 2610 of the flexible circuit board, the second conductive layer may include a lower ground pattern disposed in the second direction (e.g., the -z direction) from the signal line (e.g., the signal line 411 in FIG. 4 or 26) so as to overlap a part of the signal line 411, a lower insulating material formed at both sides of the lower ground pattern, and multiple lower ground bridges formed to cross the signal line (e.g., the signal line 411 in FIG. 4). The above-mentioned structure of the second conductive layer may be identical or at least partially similar to the structure of the third conductive layer 903 described with reference to FIG. 10 or the structure of the second conductive layer 1502 described with reference to FIG. 16.

TABLE 4

| | At least one pad region | Intermediate region |
|---|---|---|
| Third conductive layer | Pad | Upper ground pattern, upper insulating material, upper ground bridges |
| First conductive layer | | Signal line, intermediate insulating material |
| Second conductive layer | Ground pattern (First ground pattern and second ground pattern), insulating material | Lower ground pattern, lower insulating material, lower ground bridges |

Referring to Table 4, a stacked structure of the flexible circuit board 2600 according to an embodiment may further include a third conductive layer as well as a first conductive layer and a second conductive layer as three conductive layers. For example, a signal line of the first conductive layer may be a strip line-type transmission line. Referring to Table 4, the flexible circuit board 2600 according to an embodiment may further include the third conductive layer disposed in a first direction (e.g., the z direction) from the first conductive layer. The third conductive layer may include an upper ground pattern disposed in the first direction (e.g., the z direction) from the signal line (e.g., the signal line 411 in FIG. 4) to overlap a part of the signal line (e.g., the signal line 411 in FIG. 4) of the first conductive layer, an upper insulating material formed at both sides of the upper ground pattern, and multiple upper ground bridges formed to cross the signal line (e.g., signal line 411 in FIG. 4). The above-mentioned structure of the third conductive layer may be identical or at least partially similar to the structure of the second conductive layer 902 described with reference to FIG. 10.

TABLE 5

|  | At least one pad region | Intermediate region |
| --- | --- | --- |
| Third conductive layer | Ground pattern (First ground pattern and second ground pattern), insulating material | Upper ground pattern, upper insulating material, upper ground bridges |
| First conductive layer | | Signal line, intermediate insulating material |
| Second conductive layer | Pad | Lower ground pattern, lower insulating material, lower ground bridges |

According to various embodiments, as shown in Tables 4 and 5, when the flexible circuit board 2600 includes a first conductive layer, a second conductive layer, and a third conductive layer as three conductive layers, the pad 2621 formed in the pad region 2620 may be formed on the second conductive layer on which the lower ground pattern is formed, or may be formed on the third conductive layer on which the upper ground pattern is formed. For example, as shown in Table 4, when the pad 2621 is formed on the third conductive layer, the ground pattern 2623 overlapping the pad 2621 may be formed on the second conductive layer. For example, as shown in Table 5, when the pad 2621 is formed on the second conductive layer, the ground pattern 2623 overlapping the pad 2621 may be formed on the third conductive layer.

A printed circuit board and an electronic device including the same, according to various embodiments herein, may increase the efficiency of a 5G communication antenna.

A printed circuit board and an electronic device including the same, according to various embodiments herein, may reduce loss of a transmission line for transmitting a signal in a high-frequency band.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device comprising a flexible circuit board comprising a signal line as a transmission line configured to transmit a signal in a frequency band,
wherein the flexible circuit board comprises:
a first conductive layer including at least one signal line to transmit the signal in the frequency band;
a second conductive layer including a pad connected to the at least one signal line in a pad region and disposed below the first conductive layer; and
a third conductive layer including a ground pad overlapping at least a part of the pad in the pad region and disposed above the first conductive layer.

2. The electronic device of claim 1, wherein a maximum width of the pad is greater than a width of each of the at least one signal line, and a width of the ground pad is smaller than the maximum width of the pad.

3. The electronic device of claim 2, wherein the flexible circuit board further comprises an insulating material overlapping a part of the pad and disposed at both sides of the ground pad.

4. The electronic device of claim 1, wherein the pad is disposed to extend in an x direction when the flexible circuit board is viewed from a first direction,
wherein the ground pad comprises:
a first ground pad disposed in the x direction; and
a second ground pad disposed in a y direction perpendicular to the x direction to cross a part of the pad, and
wherein the first direction is a z direction perpendicular to each of the x direction and the y direction.

5. The electronic device of claim 4, wherein the second ground pad is connected to an end of the first ground pad.

6. The electronic device of claim 3, wherein the ground pad is disposed to overlap a central part of the pad, and
wherein a sum of an area of the insulating material and an area of the ground pad is greater than an area of the pad.

7. The electronic device of claim 1,
wherein the first conductive layer further comprises an intermediate insulating material formed at both sides of the at least one signal line; and
wherein the second conductive layer further comprises a lower insulating material formed at both sides of the ground pad.

8. The electronic device of claim 7, wherein the second conductive layer further comprises multiple lower ground bridges formed to cross the at least one signal line.

9. The electronic device of claim 7, wherein the third conductive layer further comprises an upper insulating material formed at both sides of the ground pad.

10. The electronic device of claim 9, wherein the second conductive layer further comprises multiple upper ground bridges formed to cross the at least one signal line.

11. The electronic device of claim 1, wherein the signal in the frequency band comprises a signal in a band of 10 GHz to 100 GHz.

12. The electronic device of claim 1, wherein the at least one signal line is a strip line-type transmission line.

13. The electronic device of claim 1, wherein the at least one signal line is a microstrip line-type transmission line.

14. A flexible circuit board for transmitting a signal in a frequency band, the flexible circuit board comprising:
a first conductive layer including at least one signal line to transmit the signal in the frequency band;
a second conductive layer including a pad connected to the at least one signal line in a pad region and disposed below the first conductive layer; and
a third conductive layer including a ground pad overlapping at least a part of the pad in the pad region and disposed above the first conductive layer.

15. The flexible circuit board of claim 14, wherein a maximum width of the pad is greater than a width of each of the at least one signal line, and a width of the ground pad is smaller than the maximum width of the pad.

16. The flexible circuit board of claim 14, wherein the signal in the frequency band comprises a signal in a band of 10 GHz to 100 GHz.

17. The flexible circuit board of claim 14,
wherein the first conductive layer further comprises an intermediate insulating material formed at both sides of the at least one signal line; and
wherein the second conductive layer further comprises a lower insulating material formed at both sides of the ground pad.

18. The flexible circuit board of claim 17, wherein the second conductive layer further comprises multiple lower ground bridges formed to cross the at least one signal line.

19. The flexible circuit board of claim 17, wherein the third conductive layer further comprises an upper insulating material formed at both sides of the ground pad.

20. The flexible circuit board of claim 19, wherein the second conductive layer further comprises multiple upper ground bridges formed to cross the at least one signal line.

* * * * *